(12) United States Patent
Ooishi

(10) Patent No.: US 6,205,071 B1
(45) Date of Patent: Mar. 20, 2001

(54) SEMICONDUCTOR MEMORY DEVICE INCLUDING SENSE AMPLIFIER CIRCUIT DIFFERING IN DRIVABILITY BETWEEN DATA WRITE MODE AND DATA READ MODE

(75) Inventor: Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/339,389

(22) Filed: Jun. 24, 1999

(30) Foreign Application Priority Data

Dec. 25, 1998 (JP) .................................................. 10-370019

(51) Int. Cl.$^7$ ....................................................... G11C 7/02
(52) U.S. Cl. ...................... 365/207; 365/205; 365/230.06
(58) Field of Search ..................................... 365/207, 206, 365/205, 230.06

(56) References Cited

U.S. PATENT DOCUMENTS

4,954,992 * 9/1990 Kumanoya et al. .................. 365/207
5,590,080 * 12/1996 Hasagawa et al. ................... 365/207

FOREIGN PATENT DOCUMENTS

8-087887   4/1996   (JP) .

* cited by examiner

*Primary Examiner*—Richard Elms
*Assistant Examiner*—VanThu Nguyen
(74) *Attorney, Agent, or Firm*—McDermott, Will & Emery

(57) ABSTRACT

The latching capability of a sense amplifier that senses and amplifies a voltage difference of a bit line pair is set lower when data is written into a selected memory cell. The sense amplifier reduced in latching capability have the latching data easily inverted according to the write data. Therefore, the time required for data writing is reduced to realize high speed writing.

19 Claims, 32 Drawing Sheets

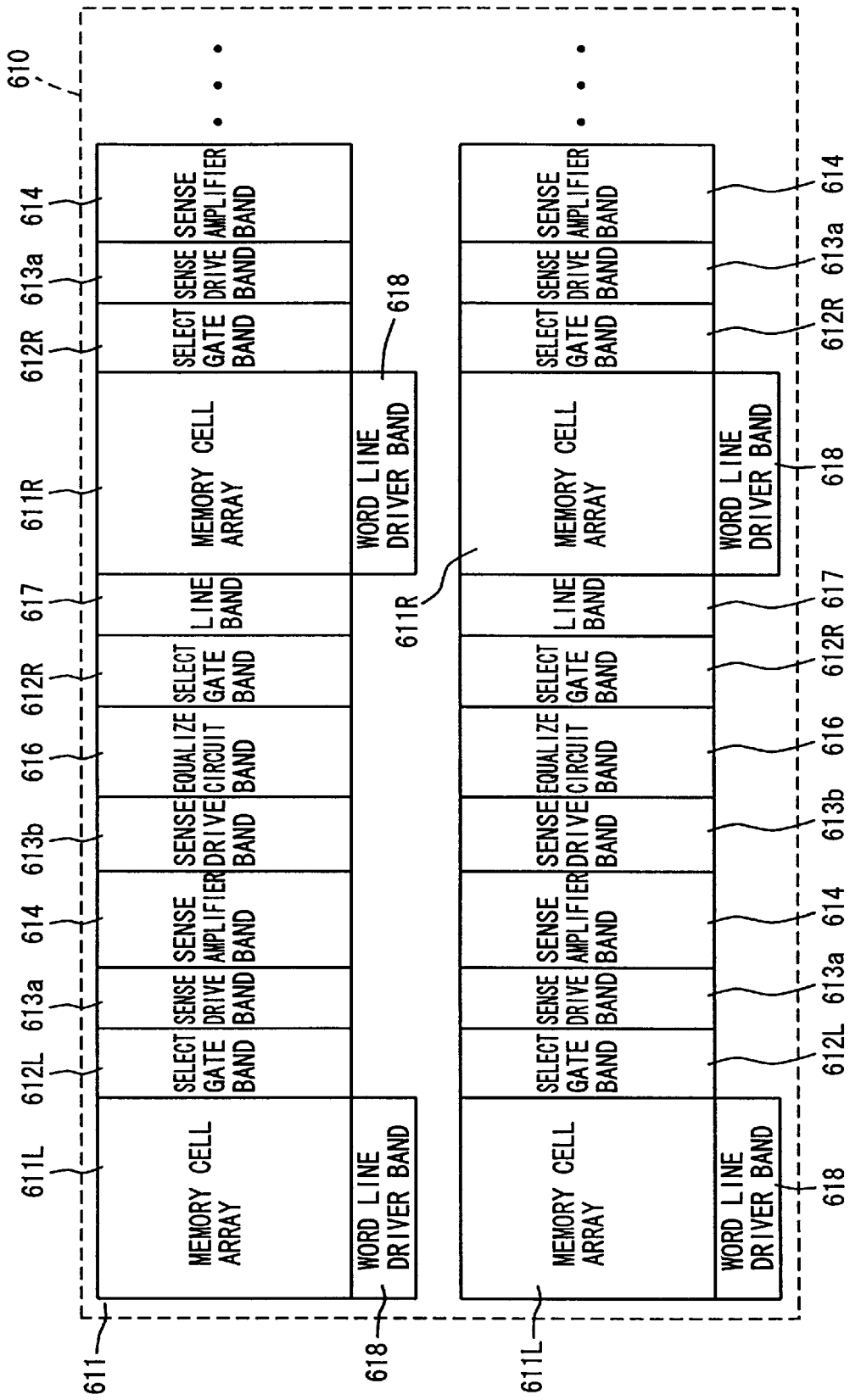
F I G. 4

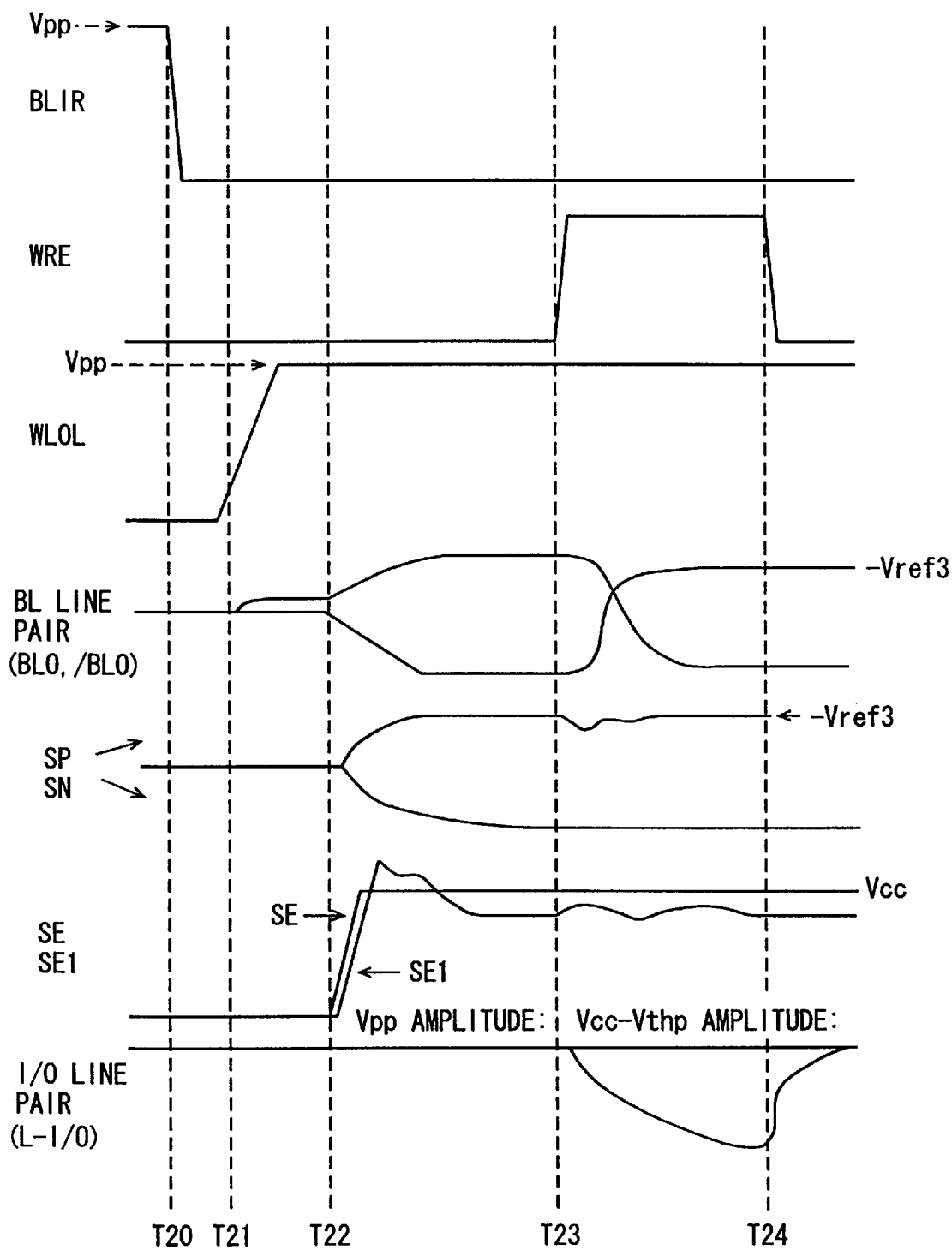

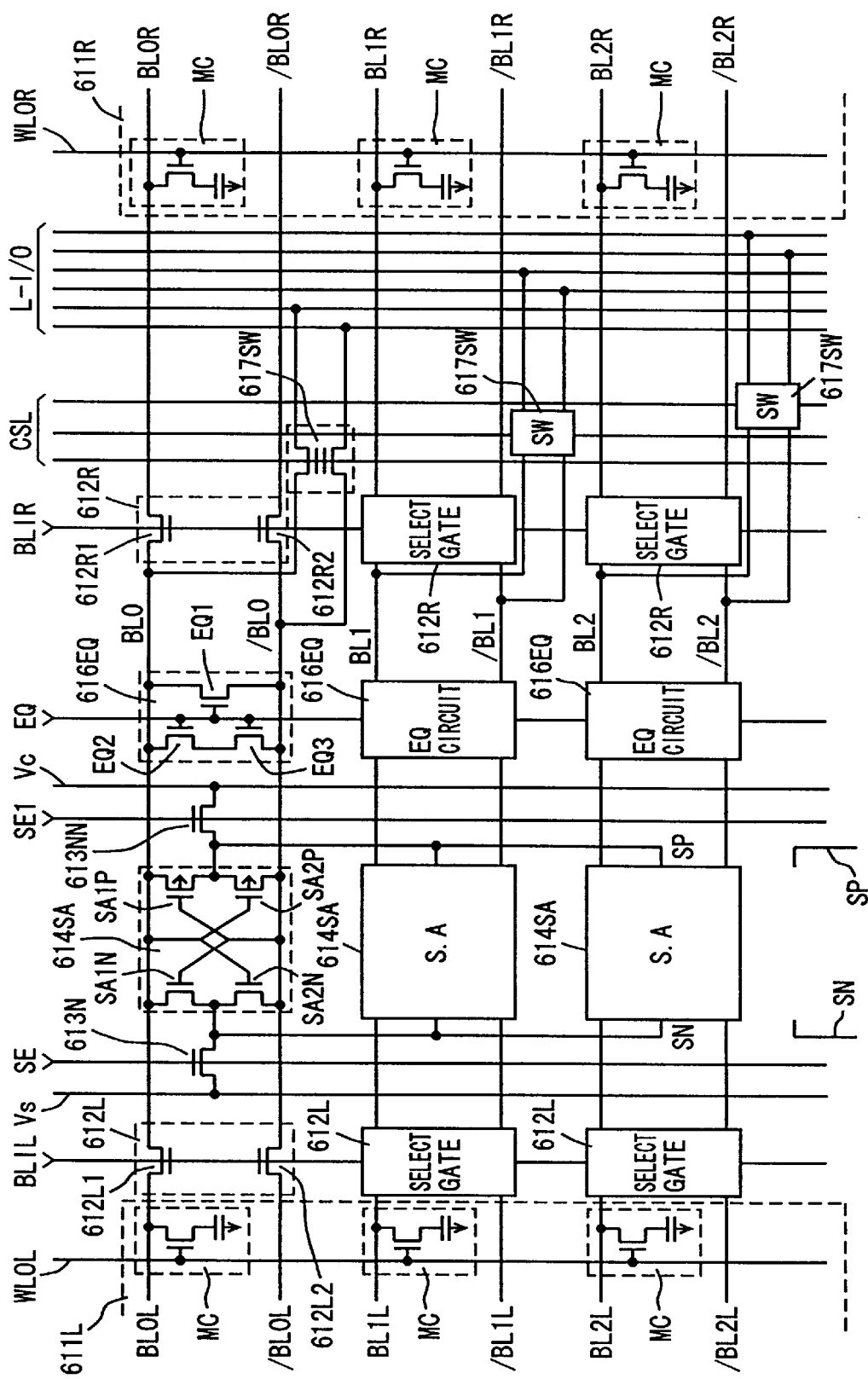
F I G. 18

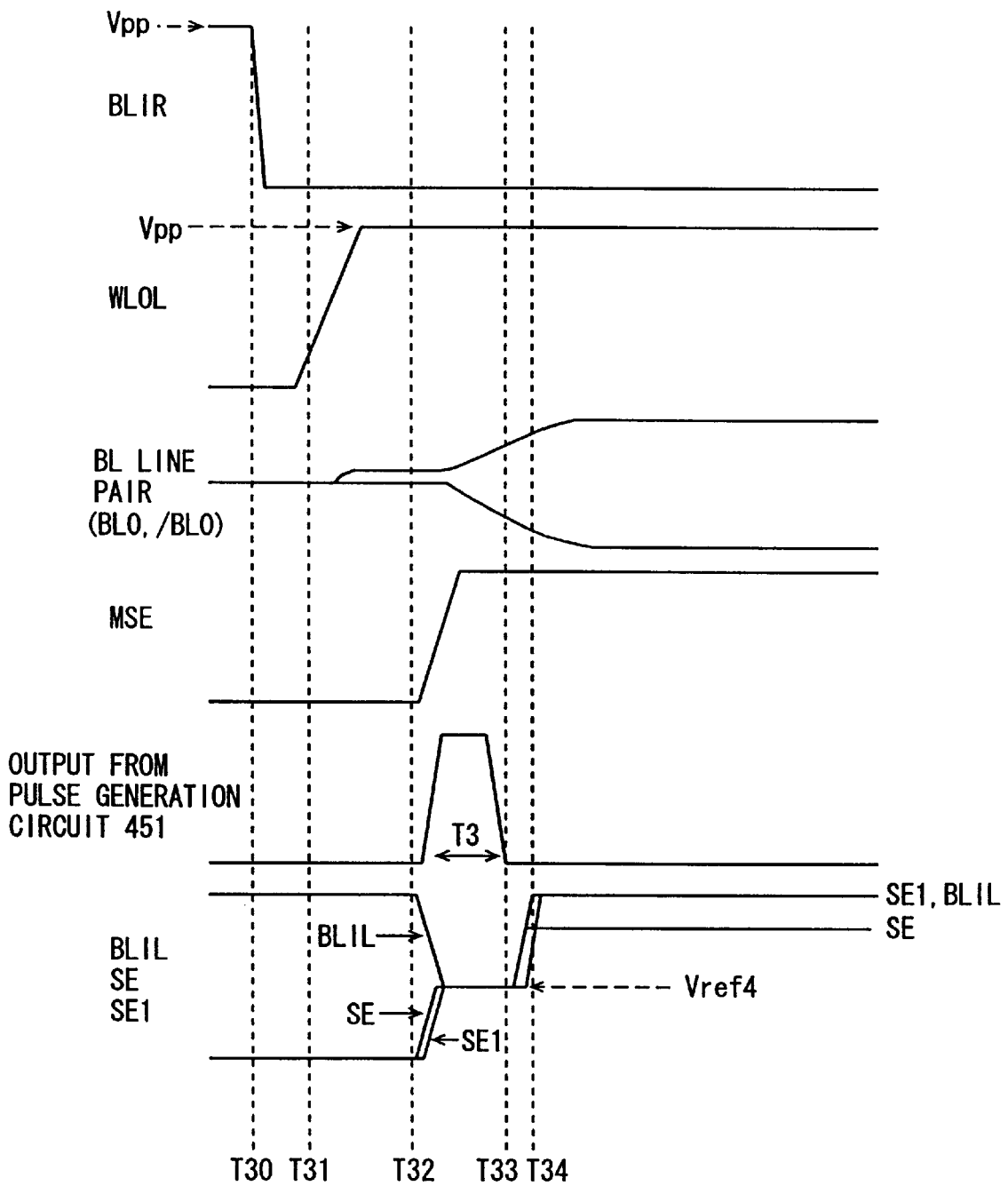

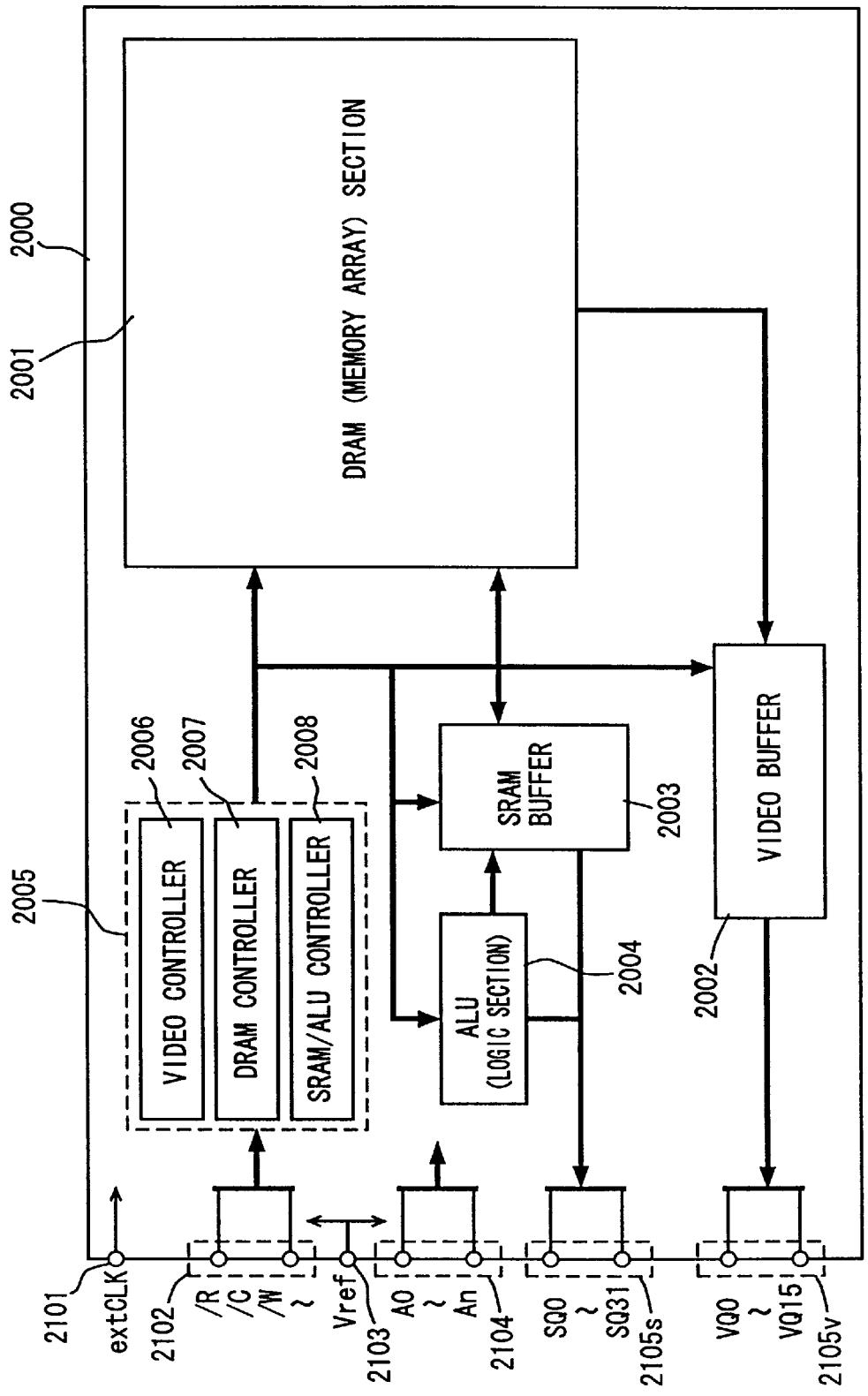
F I G. 27

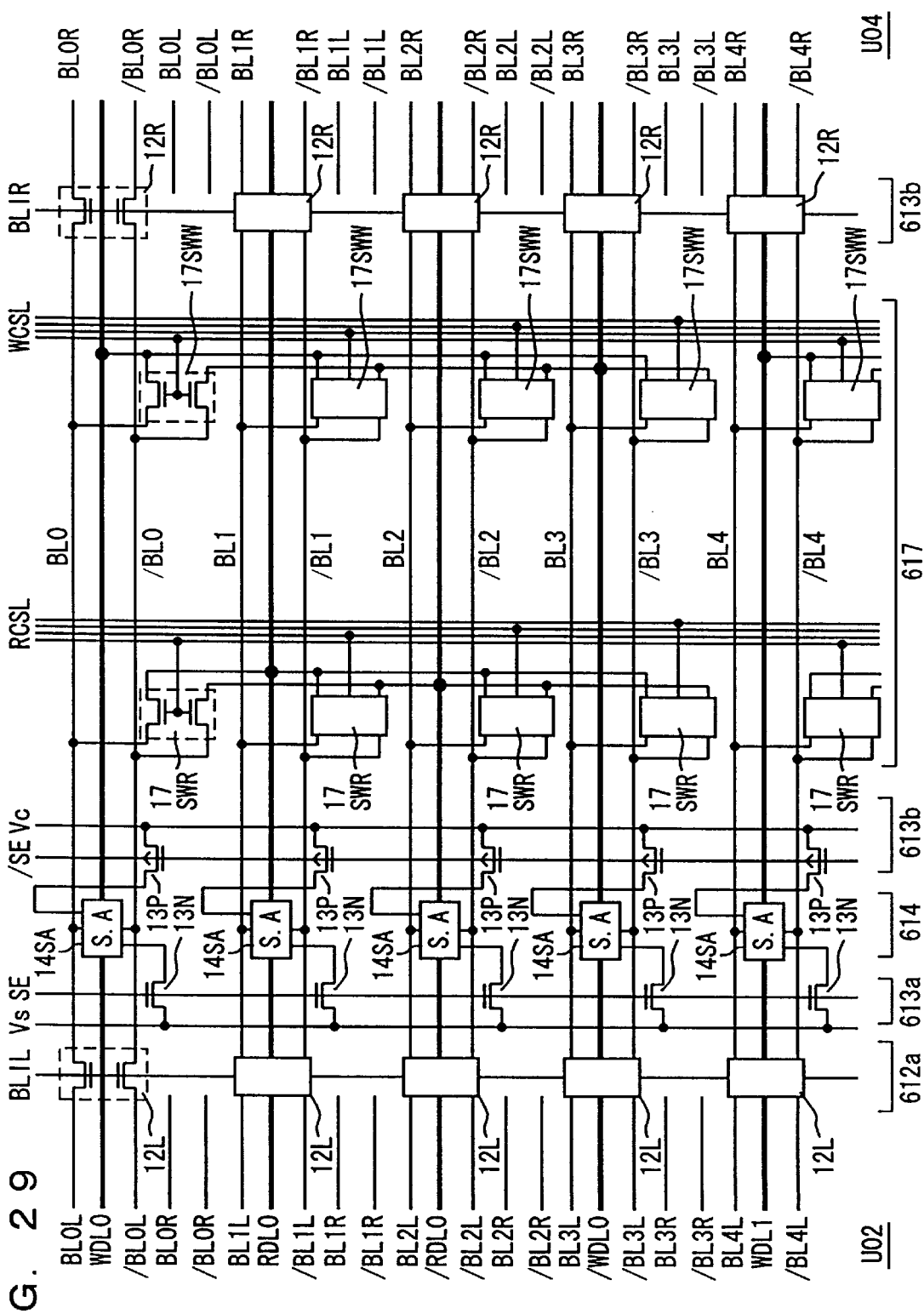
F I G. 29

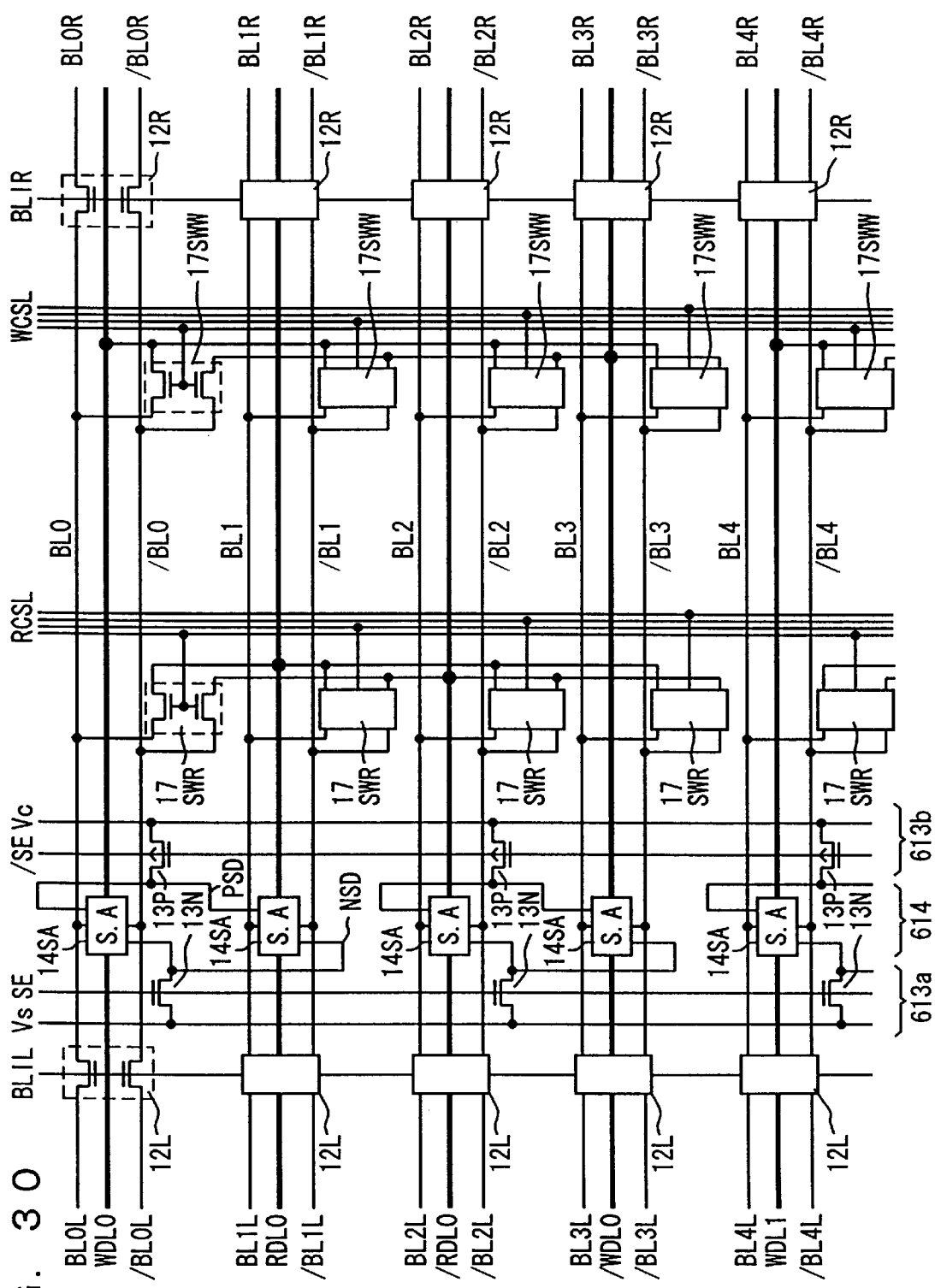
F I G. 30

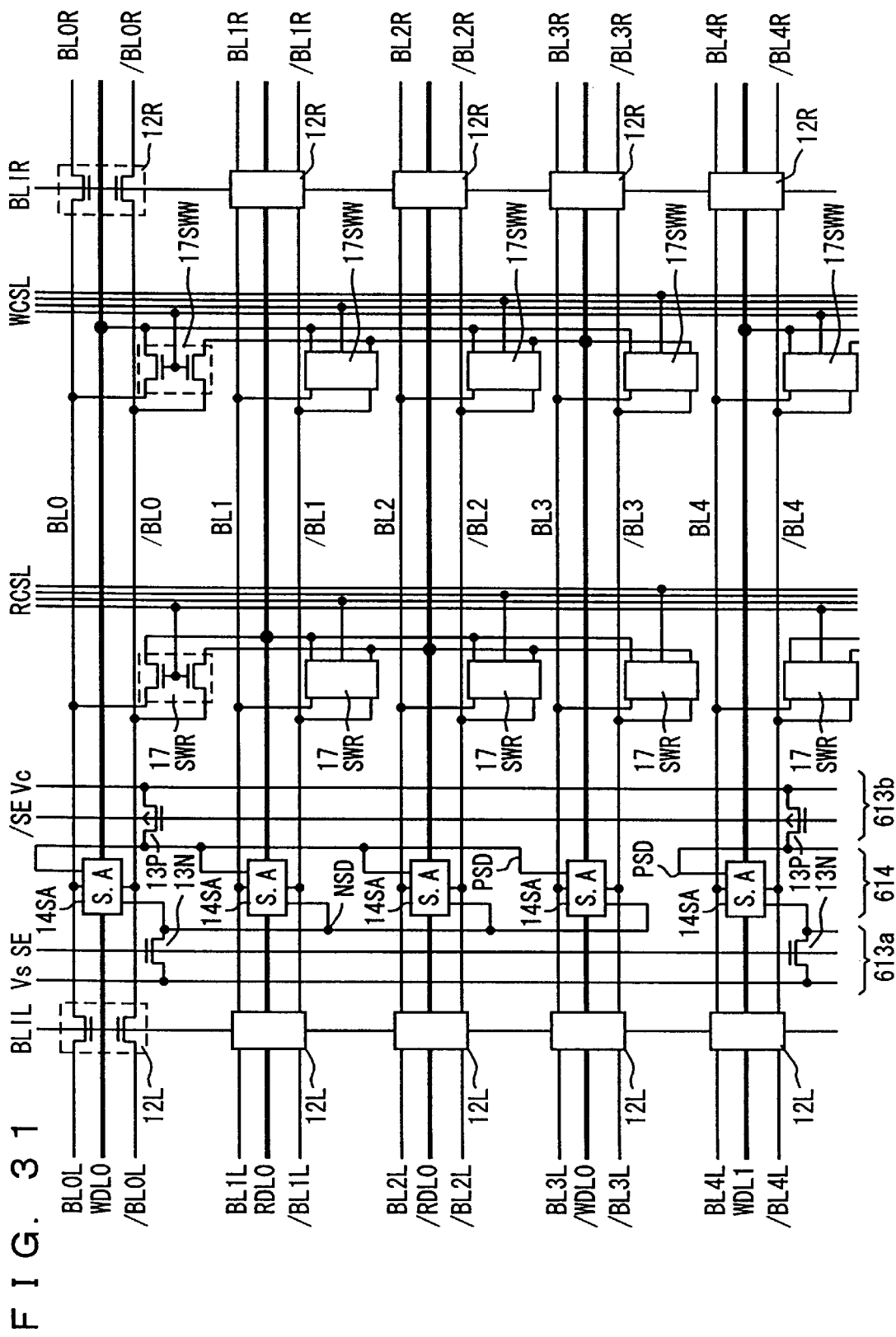
F I G. 31

SEMICONDUCTOR MEMORY DEVICE INCLUDING SENSE AMPLIFIER CIRCUIT DIFFERING IN DRIVABILITY BETWEEN DATA WRITE MODE AND DATA READ MODE

BACKGROUND OF THE INVENTION

1. Field of the Invention

The present invention relates to semiconductor memory devices, and particularly to a semiconductor memory device including a latch type (cross-coupled type) sense amplifier circuit for sensing and amplifying the potential of a bit line pair. More particularly, the present invention relates to the structure of circuitry that drives a latch type sense amplifier.

2. Description of the Background Art

FIG. 1 shows a structure of a main part of a conventional semiconductor memory device disclosed in, for example, Japanese Patent Laying-Open No. 8-87887. Referring to FIG. 1, the semiconductor memory device includes two memory cell arrays mal and mar with a plurality of memory cells mc arranged in a matrix therein. A bit line bl is arranged corresponding to each column of memory cells mc. A word line wl is arranged corresponding to each row of memory cells mc. In FIG. 1, bit lines bl0 and bl1 in memory cell array mal and bit lines /bl0 and /bl1 in memory cell array mar are shown. The semiconductor memory device employs the open bit line configuration. A memory cell is arranged corresponding to the crossing of a bit line and a word line in each of memory cell arrays mal and mar. A plurality of memory cells mc are coupled to a corresponding bit line in a unit of a predetermined number of memory cells. In other words, a memory unit has a NAND type memory cell structure.

The semiconductor memory device further includes a select gate 5a connecting bit line bl0 or bl1 to a common bit line bl according to select signals st0 and st1, a select gate 5b connecting bit line /bl0 or /bl1 to a common bit line /bl according to select signals st0 and st1, an equalize circuit 6c equalizing common bit lines /bl and bl to an intermediate voltage level when active, a temporary storage register 7 to store the data on common bit lines bl and /bl temporarily, and a cross-coupled sense amplifier sa sensing, amplifying, and latching the signal potentials of common bit lines bl and /bl when made active. Cross-coupled sense amplifier sa includes p channel MOS transistors (insulated gate type field effect transistor) having the gates and drains cross-coupled, and n channel MOS transistors having the gates and drains cross-coupled. Common bit lines bl and /bl are coupled to internal data lines db and /db via a column select gate 8 that is rendered conductive according to a column select signal cs1.

One sense amplifier sa is provided per two bit line pairs of each of memory cell arrays mal and mar. Sense amplifier control circuit 1 is provided to drive a plurality of sense amplifiers sa in common.

Sense amplifier control circuit 1 includes a sense amplifier drive transistor 1a receiving a sense amplifier activation signal BSEP at its gate via an inverter 1b to be rendered conductive, for driving a sense amplifier drive signal BSAN on a sense amplifier drive line 4n to the level of a ground voltage, a sense amplifier drive transistor 1c rendered conductive when sense amplifier activation signal BSEP is active to drive a sense amplifier drive signal SAP on sense amplifier drive line 4p to the level of a power supply voltage VCC, an inverter 2a inverting sense amplifier activation signal BSEP, a NAND circuit 2b receiving an output signal of inverter 2a and a restore mode designating signal BRSTR, a sense amplifier drive transistor 3a receiving an output signal of NAND circuit 2b at its gate via an inverter 3b to be rendered conductive for driving sense amplifier drive line 4n to the level of the ground voltage, and a sense amplifier drive transistor 3c rendered conductive when output signal RBSEP of NAND gate 2b is at an L level to drive sense amplifier drive line 4p to the level of power supply voltage Vcc. Restore mode designating signal BRSTR specifies a mode of writing the data sensed and amplified by sense amplifier sa into the original memory cell.

The operation of the semiconductor memory device of FIG. 1 will be described with reference to a waveform diagram of FIG. 2.

One of memory cell arrays mal and mar has a word line driven to a selected state. The word lines are at a nonselected state in the other memory cell array. The memory unit includes four memory cells. Here, the selected memory unit has the data read out from the memory cell located closest to common bit line bl or /bl. More specifically, word lines wl0, wl1, wl2 and wl3 are sequentially selected when memory cell array mal is selected, as shown in FIG. 2. Upon selection of word line wl0, select signals st0 and st1 are driven to an active state alternately, whereby bit lines bl0 and bl1 are connected to common bit line bl alternately. Similarly, bit lines /bl0 and /bl1 are sequentially coupled to common bit line /bl.

When select signals st0 and st1 attain an inactive state, activation of sense amplifier sa is carried out. More specifically, sense amplifier activation signal BSEP attains an active state of an L level (logical low) in a read out mode. At this stage, restore mode designating signal BRSTR maintains an H level (logical high). Since inverter 2a and NAND circuit 2b operate as a buffer circuit, sense amplifier drive transistors 1a, 1c, 3a and 3c conduct, whereby sense amplifier drive signal SAP is driven to the level of power supply voltage Vcc and sense amplifier drive signal BSAN is driven to the level of ground voltage. In response, sense amplifier sa is rendered active. A small signal voltage transferred from bit line bl0 is sensed, amplified, and latched. The data sensed and amplified by sense amplifier sa is stored in temporary storage register 7. The operation of driving the sense amplifier and storing the data into temporary storage register 7 following activation of select signals st0 and st1 is also carried out for other word lines wl0–wl3. By activating sense amplifier sa only common bit lines bl and /bl coupled to sense amplifier sa when select signals st0 and st1 are rendered inactive, the load on sense amplifier sa is reduced to allow a high speed sensing operation.

Upon completion of reading out the data of memory cells on word lines wl0–wl3, a restore mode operation of rewriting the data into the original memory cells is carried out. In the restore mode operation, restore mode designating signal BRSTR attains an L level, and control signal RBSEP is fixed at an H level. Therefore, sense amplifier drive transistors 3a and 3c maintain the inactive state. Data are rewritten into memory cells in the sequence opposite to that of reading out data. The data stored in temporary storage register 7 is amplified by sense amplifier sa. The amplified data is written into the original memory cell through select gate 5a. Sense amplifier drive lines 4p and 4n are only driven by sense amplifier drive transistors 1c and 1a, and drivability therefor is smaller than that in data read out. After sense amplifier sa is rendered active, in response to sense amplifier activation signal BSEP, to change the voltage level of common bit lines bl and /bl, select signal st0 or st1 is driven, and the bit line is driven gently by the sense amplifier via select gate 5a. By reducing the drivability of sense amplifier sa in the rewrite (restore) operation mode, leakage current Icc during rewriting can be reduced. Generation of power supply noise can be suppressed and reduction in current consumption is realized.

The restore operation to memory cell mc is carried out by repeatedly rendering sense amplifier activation signal BSEP active/inactive a predetermined number of times according to a clock signal CKB. Upon completion of rewriting data into memory cell mc connected to word line wl3, rewriting data into memory cell mc connected to word line wl2 is then carried out. The rewriting operation into the memory cells connected to word lines wl1 and wl0 is sequentially carried out thereafter.

Clock signals CKA and CKB are generated to determine respective sense amplifier operation periods for the read out mode and restore mode. A basic clock signal TCK to activate the sense amplifier is generated by clock signals CKA and CKB.

The leakage current is reduced by setting the drivability of sense amplifier sa smaller in the restore operation. However, the time required for rewriting becomes longer than the time required for data reading since sense amplifier sa drives the bit lines in memory cell arrays mal and mar. Thus, there is a problem that the time for restore becomes longer.

The prior art document described above is directed to application of a NAND cell structure in which a memory unit has a plurality of memory cells connected in series. This prior art teaches that the prior art arrangement is applicable even if the memory unit includes only one memory cell as long as sense amplifier sa is isolated from a corresponding bit line during a sensing operation. However, the prior art is silent about how data is written in a single memory cell structure. The prior art only discloses reducing the drivability of the sense amplifier at a restore mode in a read out operation, and rewriting data retained in temporary storage register 7 to a memory cell through sense amplifier sa.

According to the structure of FIG. 1, two sense amplifier drive transistors must be provided for each of sense amplifier drive lines 4p and 4n. In order to speed up the data read out operation, sufficient drive current must be applied to sense amplifier sa to enhance the current driving capability of sense amplifier sa. However, when the sense amplifier drive transistor is arranged at each end of sense amplifier drive lines 4p and 4n in a structure where many sense amplifiers sa are provided as shown in FIG. 1, the interconnection line length of sense amplifier drive lines 4p and 4n will becomes longer. As a result, the drivability of a sense amplifier located at a remote position is degraded by the delay in transition of the drive signal caused by the line capacitance and line resistance, and by change in the power supply voltage for each sense amplifier according to the voltage distribution. Therefore, the speed of the read out operation cannot be improved (because the data read out time is determined depending upon the worst-case sense amplifier operation).

In order to eliminate the problem caused by the line capacitance and the line resistance in sense amplifier drive lines 4p and 4n, a sense amplifier drive transistor should be provided corresponding to each sense amplifier sa. However, two sense amplifier drive transistors must be provided in parallel between the sense amplifier power supply node and the power supply line for each sense amplifier (in order to speed up the restore operation). This means that four sense amplifier drive transistors must be arranged for one sense amplifier. Thus, there is a problem that the area of the sense amplifier arrangement region is increased significantly.

The sense amplifier located remote from the sense amplifier drive transistor in the structure of FIG. 1 has the amount of change of drivability thereof reduced in between a read out operation and a restore operation by the line resistance and line capacitance of the sense amplifier drive line. Thus, there is a problem that the read out operation cannot be carried out speedily, as well as a problem of suppressing speed up of the restore operation.

Where data is sequentially stored in the temporary storage register as in the prior art when external data is to be written into a memory cell, the sense amplifier must be rendered active/inactive for each data writing. Thus, there is a problem that data cannot be written sequentially at high speed.

SUMMARY OF THE INVENTION

An object of the present invention is to provide a semiconductor memory device that can write data at high speed.

Another object of the present invention is to provide a semiconductor memory device that can change latching data of a sense amplifier according to write data without increasing the area.

A further object of the present invention is to provide a semiconductor memory device that can carry out a sensing operation at high speed.

Still another object of the present invention is to provide a semiconductor memory device that can apply a mask properly without adversely affecting latching data of a sense amplifier in a write mask operation.

A semiconductor memory device of the present invention reduces the latching capability of a sense amplifier that senses and amplifies the voltage difference between a pair of bit lines in writing data into a selected memory cell.

The sense amplifier reduced in latching capability can have the latching data inverted easily according to the write data. Therefore, the time required for writing data is reduced. Thus, high speed writing can be realized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 shows the layout of a memory section of the SDRAM of FIG. 1.

FIG. 17 is a timing chart representing an operation of the sense amplifier periphery of FIG. 15.

FIG. 18 shows a modification of the third embodiment of the present invention.

FIG. 22 is a timing chart representing an operation of the sense amplifier peripheral circuitry of FIG. 19.

FIG. 27 schematically shows an entire structure of a logic merged memory according to a sixth embodiment of the present invention.

FIG. 29 schematically shows a structure of the memory unit of FIG. 28.

FIGS. 30, 31 and 32 show a structure of the sense amplifier peripheral circuitry of a logic merged memory according to a seventh embodiment, an eighth embodiment and a ninth embodiment of the present invention, respectively.

DESCRIPTION OF THE PREFERRED EMBODIMENTS

First Embodiment

Figure 3:
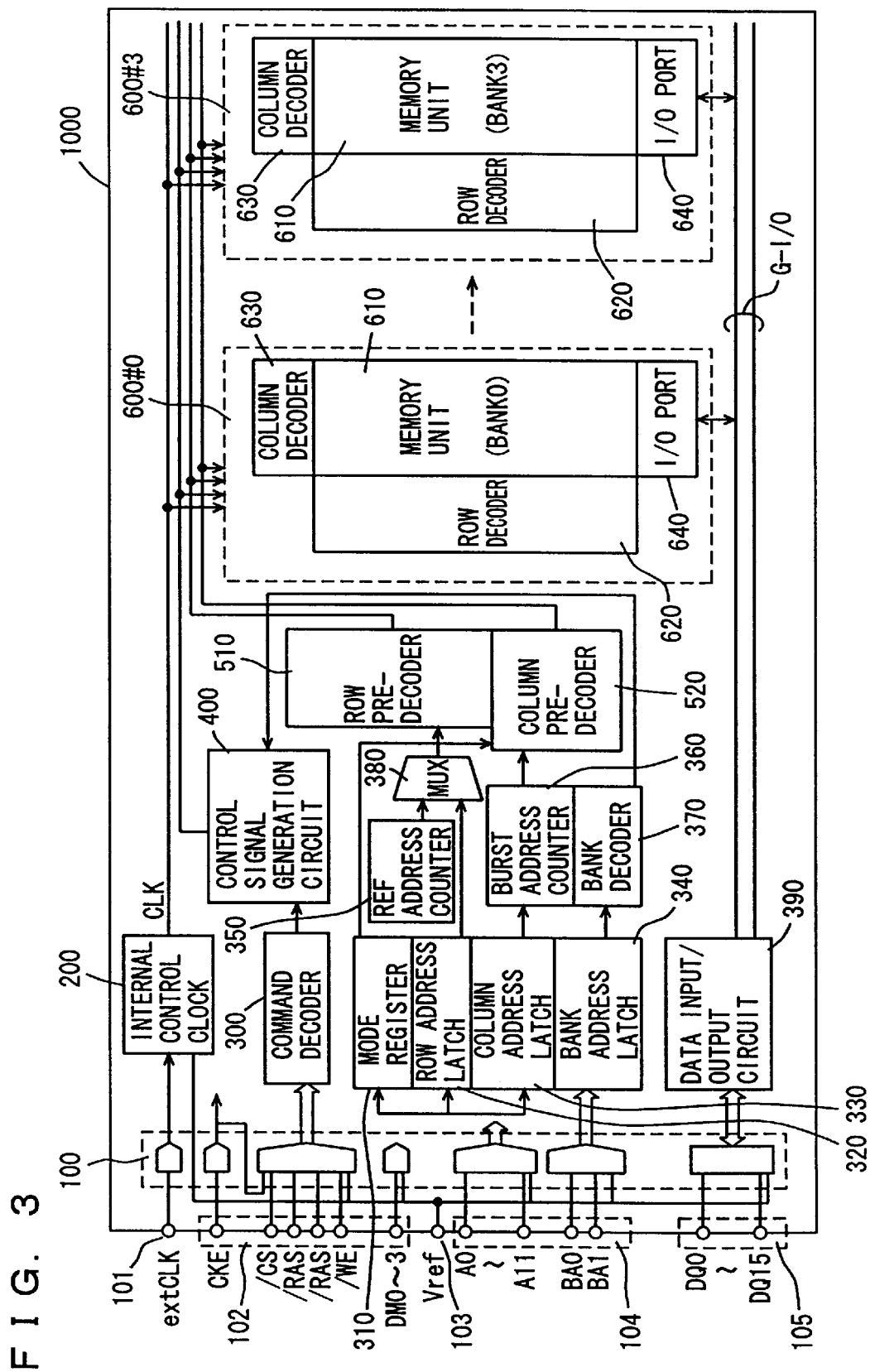
FIG. 3 schematically shows a structure of an SDRAM according to a first embodiment of the present invention.

FIG. 3 schematically shows an entire structure of a semiconductor memory device according to a first embodiment of the present invention. The semiconductor memory device of FIG. 3 is a clock synchronous dynamic random access memory (referred to as SDRAM hereinafter) that operates in synchronization with an external clock signal extCLK.

Referring to FIG. 3, an SDRAM 1000 includes a clock input terminal 101 receiving an external clock signal extCLK, a control signal input terminal 102 receiving an externally applied control signal, a reference voltage input terminal 103 receiving a reference voltage Vref, address input terminals 104 receiving address signal bits A0–A11 and bank address signal bits BA0 and BA1, data input/output terminals 105 to input/output 16 bits of data DQ0–DQ15, and a buffer circuit 100 buffering a signal applied through terminals 101, 102, 104 and 105.

The signals to control signal input terminals 102 include a clock enable signal CKE for enabling input of a control signal for SDRAM 1000, a chip select signal /CS instructing that a command is applied, a row address strobe signal /RAS, a column address strobe signal /CAS, a write enable signal /WE designating writing/reading, and data mask designating signals DM0–DM3 applying a mask on data writing/reading. An operation mode is specified according to a combination of the states of control signals /CS, /RAS, /CAS and /WE at the rise of a clock signal. Data mask designating signals DMO–DM3 specify whether or not to mask the data write/read in a unit of 4 bits for the 16 bits of data.

Reference voltage Vref is used by each buffer in buffer circuit 100 as a criterion of determining the H/L level of an externally applied signal. The buffer provided to data input/output terminal 105 is an input/output buffer to input and output data.

SDRAM 1000 further includes an internal control clock generation circuit 200 generating an internal clock signal CLK according to external clock signal extCLK applied through buffer circuit 100, a command decoder 300 determining an operation mode specified by the combination of the logical states of the control signals applied from control signal input terminals 10, and a control signal generation circuit 400 generating a corresponding control signal according to an operation mode specify signal from command decoder 300. SDRAM 1000 has a multibank structure and includes a plurality of (in the present embodiment, four) banks 600#0–600#3 internally. Control signal generation circuit 400 transmits an operation mode activation signal to an addressed bank according to the bank specify signal from bank decoder 370 and the operation mode specify signal from command decoder 300.

SDRAM 1000 further includes a mode register 310 storing various data such as operation parameters (CAS latency, burst length) for SDRAM 1000, a row address latch 320 latching an address signal applied from buffer circuit 100 under control of control signal generation circuit 400, a column address latch 330 latching an address signal applied through buffer circuit 100 under control of control signal generation circuit 200, a bank address latch 340 latching bank address signal bits BA0 and BA1 from buffer circuit 100 under control of control signal generation circuit 400, a REF address counter 350 generating a refresh address (REF address) required in a refresh cycle, a burst address counter 360 receiving a column address signal from column address latch 330 to generate a column address signal in a predetermined sequence with the column address specified by the received column address signal being the head address, a bank decoder 370 decoding the bank address signal from bank address latch 340 to generate a bank specify signal, a multiplexer (MUX) 380 selecting either the refresh address signal output from REF address counter 350 or the row address signal from row address latch 320 under control of control signal generation circuit 400, a row predecoder 510 predecoding the address signal from multiplexer 380, and a column predecoder 520 predecoding a column address signal from burst address counter 360.

The burst length data is stored in mode register 310. According to this burst length data, burst address counter 360 generates column address signals that are required to read out data of the burst length. Here, the burst length indicates the number of data that are accessed successively in response to application of one column access command.

Each of memory banks 600#0–600#3 includes a memory unit 610 with a memory cell array and the peripheral circuitry (such as sense amplifier), a row decoder 620 generating a signal that drives an addressed row in the memory unit to a selected state according to the row predecode signal from predecoder 510, a column decoder 630 generating a column select signal selecting an addressed column in memory unit 610 according to a column predecode signal from column predecoder 520, and an I/O port 640 to transfer data between a selected memory cell in memory unit 610 and a global data bus G-I/O. I/O port 640 includes a write driver to write data into memory unit 610, and a preamplifier amplifying the data read out from memory unit 610. Global data bus G-I/O is provided common to memory banks 600#0–600#3, and coupled to a data input/output circuit 390. Data input/output circuit 390 inputs/outputs data in synchronization with internal control clock signal CLK.

SDRAM 1000 takes in an external signal (control signal and data) in synchronization with external clock signal extCLK, and outputs data in synchronization with external clock signal extCLK. Since the data input/output is performed in synchronization with external clock signal extCLK, the data transfer rate is determined by this external clock signal extCLK, leading to high speed data transfer.

Reference voltage Vref is applied to internal control clock generation circuit 200 and is compared with externally applied clock signal extCLK from the clock buffer to generate a correctly waveform-shaped internal control clock signal CLK having a sharp rise.

FIG. 4 schematically shows a structure of memory unit 610 of FIG. 3. Memory unit 610 of FIG. 4 has an alternately arranged shared sense amplifier structure. More specifically, a sense amplifier band 614 is provided between adjacent memory cell arrays 611L and 611R. The sense amplifiers in the sense amplifier band 614 are shared by memory cell arrays 611L and 611R. Each of memory cell arrays 611L and 611R includes memory cells arranged in a matrix of rows and columns, a bit line pair arranged corresponding to each column of memory cells, and a word line arranged corresponding to each row of memory cells.

To realize the shared sense amplifier structure, sense drive bands 613a and 613b in which sense amplifier drive transistors are arranged to drive the sense amplifiers in sense amplifier band 614, a select gate band 612L to connect each column in memory cell array 611L to a corresponding sense amplifier of sense amplifier band 614, a select gate band 612R connecting each row in memory cell array 611R to a corresponding sense amplifier in sense amplifier band 614, and a equalize circuit band 616 are provided adjacent to sense amplifier band 614. Equalize circuit band 616 includes an equalize circuit provided corresponding to each sense amplifier of sense amplifier band 614, and equalizes each bit line pair of memory cell arrays 611L and 611R to the intermediate voltage level.

The reason why select gate bands 612R are provided on each outside memory cell array 611R is that the memory cell columns of memory cell array 611R are connected alternately to the left side sense amplifier band 614 and the right side sense amplifier band 614. In sense amplifier band 614, one sense amplifier is provided for two columns (two bit line pairs) of each of memory cell arrays 611L and 611R. Accordingly, the pitch condition of the sense amplifier is alleviated.

An interconnection band 617 provided between memory cell array 611R and select gate band 612R includes a column select gate provided corresponding to each sense amplifier in sense amplifier band 614 and selects a bit line corresponding to a selected column according to a column select signal from a column decoder not shown, and a local data bus L-I/O coupled to the column select gates. Local data bus L-I/O is arranged corresponding to one or two memory cell arrays depending upon the array arrangement structure.

The shared sense amplifier arrangement shown in FIG. 4 is provided repeatedly along the lateral direction in the figure. A word line driver bands 618 are provided for memory cell arrays 611L and 611R to drive a word line corresponding to an addressed row in memory cell arrays 611L and 611R according to a row select signal from row decoder 620 (refer to FIG. 3). A word line driver band 618 is provided corresponding to each of memory cell arrays 611L and 611R. The memory unit has the so-called hierarchical word line structure, and includes a main word line shared by a plurality of memory cell arrays, and a sub word line to which the memory cells are actually connected in a memory cell array. Thus, a row select signal can be transmitted from row decoder 620 to the memory cell array at high speed for row selection. The structure shown in FIG. 4 is provided repeatedly in the row direction and the column direction.

Figure 5:
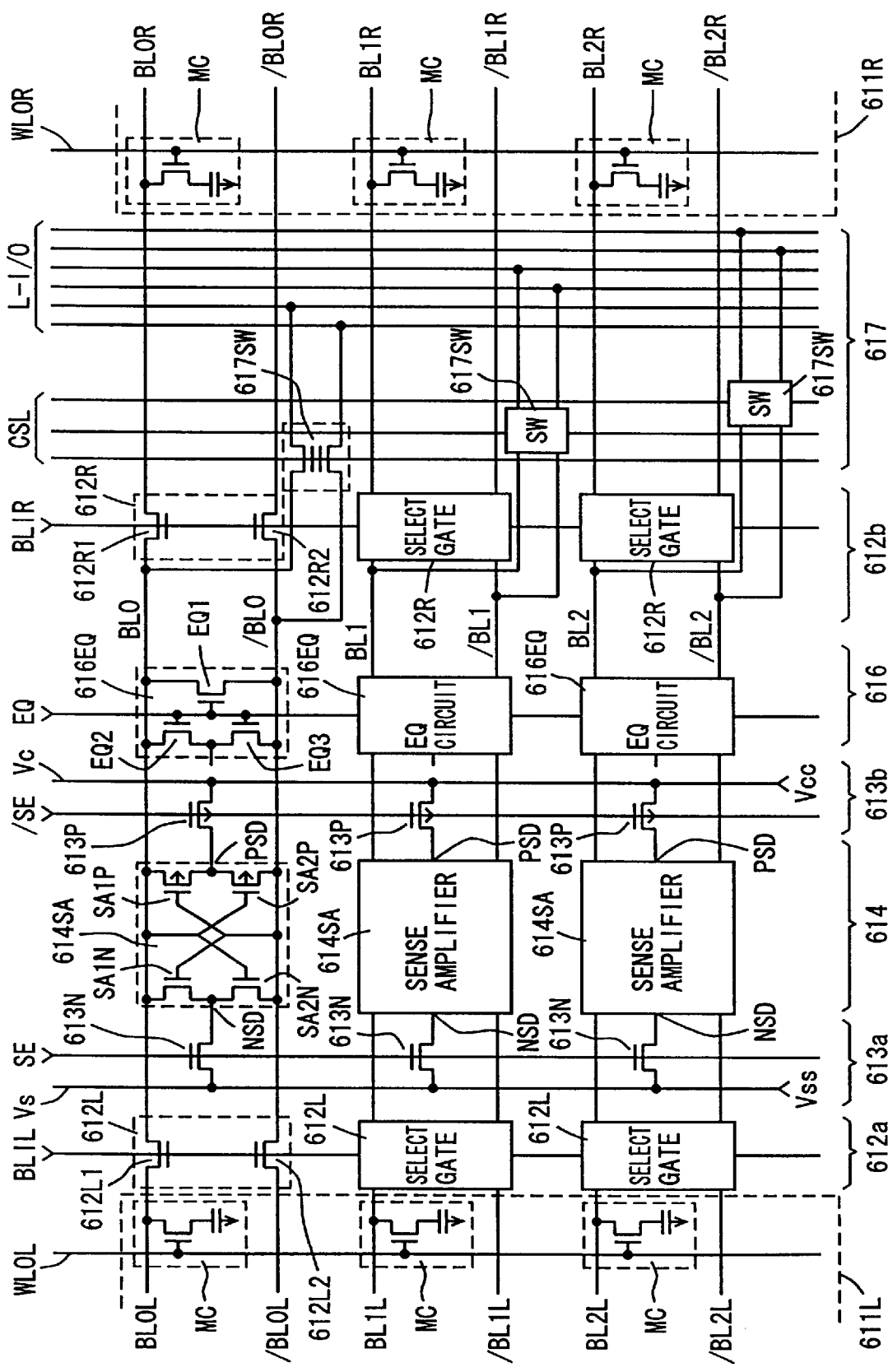
FIG. 5 shows a structure of the proximity of a sense amplifier in the SDRAM of FIG. 1.

FIG. 5 shows in detail the structure of memory cell arrays 611L and 611R and the peripheral circuits arranged therebetween. The structure of the portion related to sense amplifier 614SA in sense amplifier band 614 is shown in FIG. 5. The bit line pair of every other column in memory cell arrays 611L and 611R is shown since memory unit 610 has the alternately arranged shared sense amplifier structure. The other bit line pair of every other column not shown is connected to the sense amplifier arranged opposite to sense amplifier 614SA with respect to memory cell arrays 611L and 611R.

Referring to FIG. 5, memory cell array 611L includes bit line pairs BL0L, /BL0L, BL1L, /BL1L, BL2L, /BL2L corresponding to the memory cell columns. Although word line WL0L is shown representatively, a memory cell MC is arranged at the crossing of word line WL0L and one bit line of the bit line pair. Memory cells MC are arranged at the crossings between word line WL0L and respective bit lines BL0L, BL1L and BL2L in FIG. 5. Memory cell MC includes a capacitor storing information, and an access transistor rendered conductive in response to a signal potential on word line WL (WL0L) to connect the capacitor to a corresponding bit line.

Figure 1:
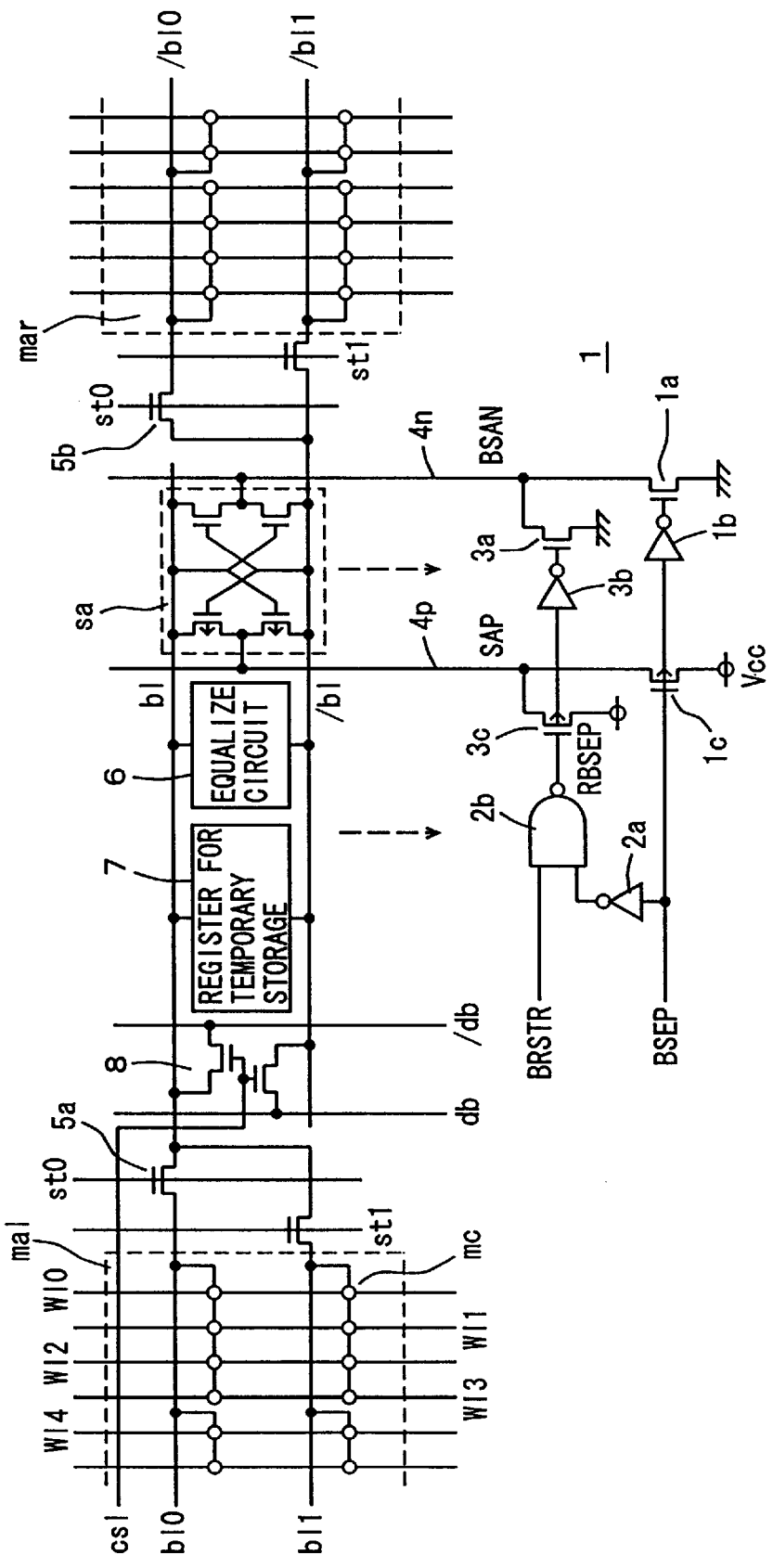
FIG. 1 schematically shows a structure of a conventional semiconductor memory device.
Figure 2:
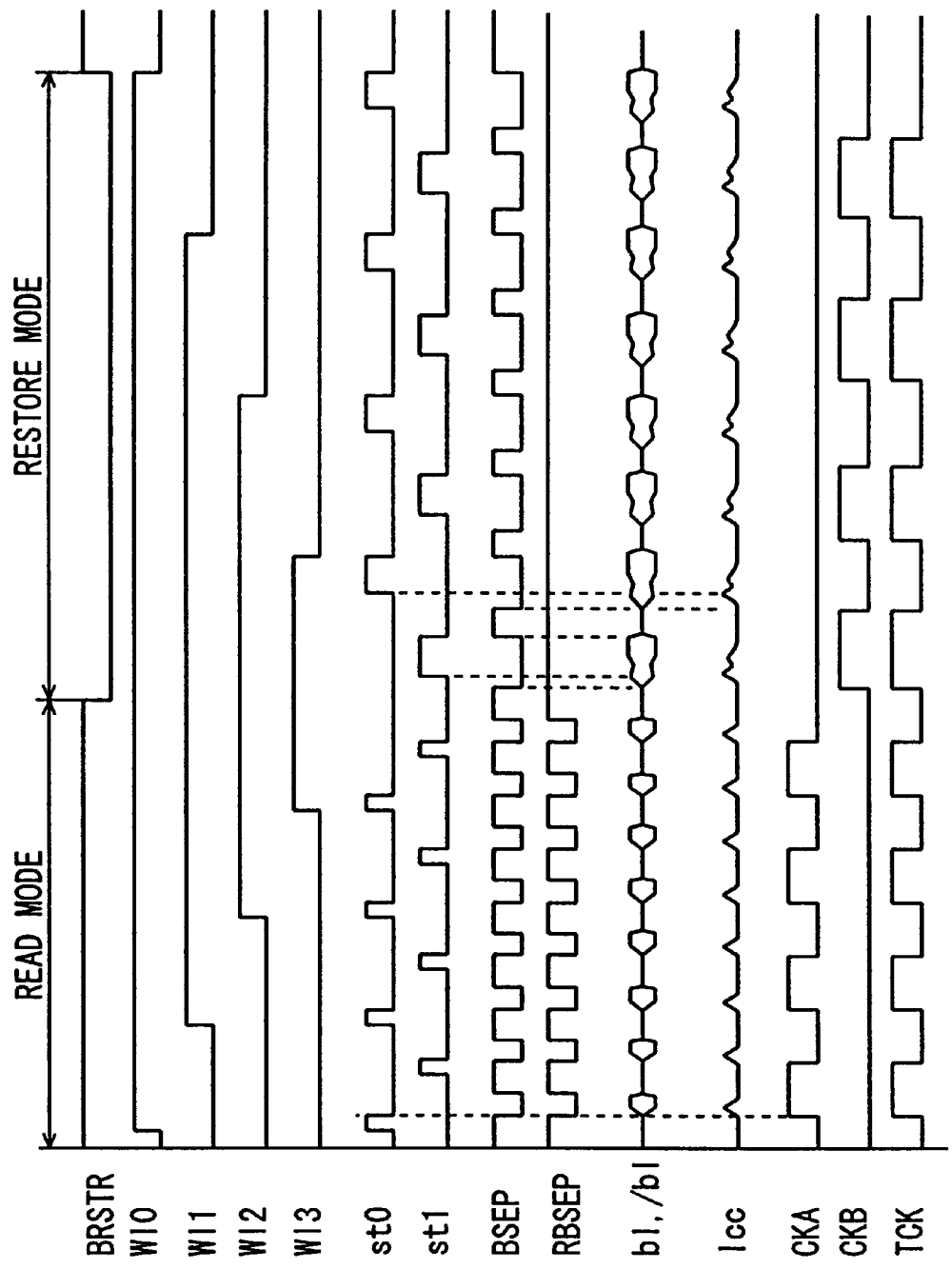
FIG. 2 is a signal waveform diagram representing an operation of the semiconductor memory device of FIG. 1.

In memory cell array 611R, bit line pairs BL0R, /BL0R, BL1R, /BL1R, BL2R, /BL2R are provided corresponding to respective columns of memory cells MC. The memory cell arrangement of memory cell arrays 61L and 611R has the so-called "folded bit line" structure, differing from the conventional structure shown in FIG. 1. Sense amplifier 614SA in sense amplifier band 614 includes n channel MOS transistors SA1N and SA2N having the gates and drains cross-coupled, and p channel MOS transistors SA1P and SA2P having the gates and drains cross-coupled. MOS transistor SA1N has its drain connected to common bit line BL(BL0), its gate connected to common bit line /BL /(BL0), and its source connected to an N source node NSD. MOS transistor SA2N has its drain and gate connected to common bit lines /BL and BL, respectively, and its source connected to N source node NSD. MOS transistor SA1P has its gate and drain connected to common bit lines /BL and BL, respectively, and its source connected to a P source node PSD. MOS transistor SA2P has its gate and drain connected to common bit lines BL and /BL, respectively, and its source connected to P source node PSD.

Sense drive band 613a includes a power supply line Vs arranged common to the sense amplifiers of sense amplifier band 614 to transmit ground voltage Vss, and a sense amplifier drive transistor 613N provided corresponding to sense amplifier 614SA and rendered conductive in response to sense amplifier drive signal SE to connect N source node NSD of a corresponding sense amplifier to power supply line Vs.

Sense drive band 613b further includes a power supply line Vc arranged common to the sense amplifiers 614SA in sense amplifier band 614 to transmit power supply voltage Vcc, and a sense amplifier drive transistor 613P provided corresponding to each sense amplifier 614SA and rendered conductive in response to sense amplifier drive signal /SE to couple P source node PSD of a corresponding sense amplifier to power supply line Vc. Sense amplifier drive signal /SE is rendered active at a timing identical to or slightly behind sense amplifier drive signal SE.

Equalize circuit band 616 includes an equalize circuit (EQ circuit) 616EQ provided corresponding to each sense amplifier 614SA. Equalize circuit 616EQ includes an equalize transistor EQ1 rendered conductive in response to activation of equalize designating signal EQ to electrically short corresponding common bit lines, and precharge transistors EQ2 and EQ3 rendered conductive when equalize designating signal EQ is active to transmit the precharge voltage of the intermediate voltage level not shown to common bit lines BL and /BL (BL0, /BL0).

Select gate band 612L includes a select gate 612L provided corresponding to each bit line pair BL0L, /BL0L, ... of memory cell array 616L, selectively rendered conductive in response to a bit line isolation control signal BLIL. Select gate 612L includes one pair of transfer gates 612L1 and 612L2 to connect a corresponding bit line pair to a common bit line pair.

Select gate group 612R includes a select gate 612R provided corresponding to each bit line pair BL0R, /BL0R, ... of memory cell array 611R, and selectively rendered conductive according to a bit line isolation control signal BLIR to connect a corresponding bit line pair to a common bit line pair. Select gate 612R includes transfer gates 612R1 and 612R2 to connect respective bit lines to a common bit line pair.

Interconnection band 617 includes a column select switch (SW) 617SW provided corresponding to each respective common bit line pair, and rendered conductive according to column select signal CSL to connect a corresponding common bit line to a bus line pair of local data bus L-I/O. In FIG. 5, column select switches 617SW connect a corresponding common bit line pairs to different bus line pairs of local data bus L-I/O. This is because the bit line pairs are arranged in groups, and one column in each group is selected to be connected to a local data bus. For example, when common bit lines BL0 and /BL0 are selected to be connected to a local data bus line pair, common bit lines are coupled to the remaining local data bus line pairs according to column select switches (SW) receiving the same column select signal in the column select gate group not shown.

In a standby cycle, bit line isolation control signals BLIL and BLIR are at a high voltage Vpp level higher than the level of power supply voltage Vcc, so that all select gates 612L and 612R conduct. Therefore, the bit line pairs of memory cell arrays 611L and 611R are connected to corresponding common bit line pairs, respectively. Equalize designating signal EQ is active, and each bit line pair is precharged to the intermediate voltage level by equalize circuit 616EQ.

When one of memory cell arrays 611L and 611R includes a selected memory cell in a memory cell select operation, the other memory cell array is disconnected from sense amplifier band 614, and a sensing operation is carried out. In a sensing operation of sense amplifier 614SA of sense amplifier band 614, the voltage control manner of sense amplifier drive signals SE and /SE is changed between a data read out mode and a data write mode, or between the start and end of the sensing operation, and the drivability of sense amplifier 614SA is adjusted simply by controlling the voltage level of sense drive signals SE and /SE. The writing speed can be increased for the data write operation by the high speed inversion of the latch data of sense amplifier 614SA according to write data, and the data read out operation is speeded up by increasing the capability of the sense amplifier to carry out high speed sensing operation.

Only one pair of sense drive transistors 613P and 613N is provided for sense amplifier 614SA. Therefore, increase in the occupying area can be suppressed. Sense amplifier 614SA is coupled to power supply lines Vc and Vs via corresponding sense amplifier drive transistors 613P and 613N, respectively. Therefore, the voltage level of N and P source nodes NSD and PSD of sense amplifier 614SA surely attain the level of ground voltage Vss and power supply voltage Vcc, respectively. Therefore, the sense power supply voltage can be supplied stably to carry out a sensing operation. Since no distribution of this sense power supply voltage is generated over the plurality of sense amplifiers, a stable and high speed sensing operation can be realized. A sensing operation is carried out at the same sensing speed in each sense amplifier since the sense power supply voltage is identical for each sense amplifier. The method of driving sense amplifier drive signals SE and /SE will be described hereinafter.

Figure 6:
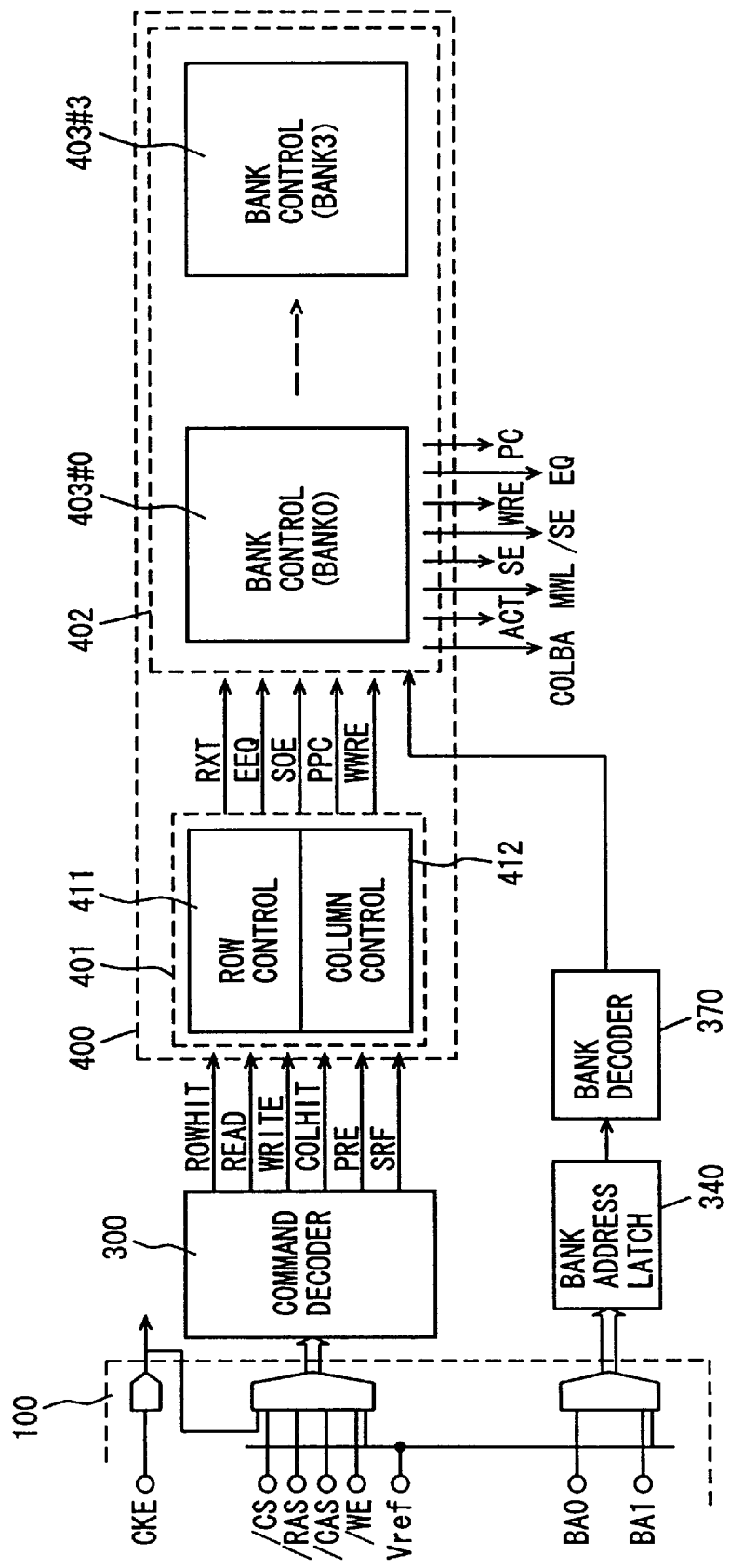
FIG. 6 schematically shows a structure of a control signal generation circuit of the SDRAM of FIG. 1.

FIG. 6 schematically shows a structure of control signal generation circuit 400 and related portion thereof shown in FIG. 3. Command decoder 300 determines an operation mode specified according to externally applied control signals /CS, /RAS, /CAS and /WE from buffer circuit 100 to generate a trigger signal designating the specified operation mode. FIG. 6 representatively shows a row access designating signal ROWHIT activated when an active command instructing a row access (row selection) is applied, a read operation designating signal READ activated when a data read command is applied, a write operation designating signal WRITE activated when a data write command is applied, a column access designating signal COLHIT activated when a read or write command is applied, a precharge designating signal PRE activated when a precharge command that drives a bank to an inactive state (standby state) is applied and a self refresh mode designating signal SRF activated when a self refresh operation is instructed.

Control signal generation circuit 400 includes a common control signal generation circuit 401 generating a common operation trigger signal for banks 0–3 according to an operation mode designating signal from command decoder 300, and a bank control signal generation circuit 402 receiving a bank specify signal from bank decoder 370 and a trigger signal from common control signal generation circuit 401 to generate an operation control signal for an addressed bank.

Common control signal generation circuit 401 includes a row control circuit 411 controlling the operation related to row selection, and a column control circuit 412 controlling the operation related to row selection (data write/read). Row control circuit 411 responds to instruction of an operation mode related to row selection (when signal ROWHIT, PRE or SRF activated) to generate a word line select trigger signal RXT to control the word line drive timing, a bit line equalize trigger signal EEQ to control a bit line equalize operation, a sense amplifier activation trigger signal SOE to control the timing of activating a sense amplifier, or a precharge trigger signal PPC to control the precharge timing. Column control circuit 412 generates a write trigger signal WRE controlling the timing of activating a write driver in a write operation, and a preamplifier activation trigger signal (not shown) to activate a preamplifier in a read operation.

Bank control signal generation circuit 402 includes bank control circuits 403#0–403#3 provided corresponding to respective banks. Each of bank control circuits 403#0–403#3 has the same structure, and is rendered active according to a bank specify signal from bank decoder 370 to generate various operation control signals for a corresponding bank according to a trigger signal from common control signal generation circuit 401. In FIG. 6, 8 control signals are shown representatively. Array activation signal ACT is activated when row access is instructed to drive a memory array to a selected state (active state). Main word line drive signal MWL drives a word line to a selected state. Sense amplifier activation signals SE and /SE are sense amplifier drive signals shown in FIG. 5. Precharge control signal PC is activated according to precharge trigger signal PPC, to control the precharge operation of a bank. Column related enable signal COLBA is activated when column access is designated, to designate starting of a column related operation. Equalize designating signal EQ is the bit line equalize designating signal shown in FIG. 5. Write designating signal WRE is a signal to control the data write operation for a memory cell. The data write circuit is activated according to activation of signal WRE to write data into a selected memory cell. The operation of the control signal generation circuit of FIG. 6 will now be described with reference to the timing chart of FIG. 7.

When row access is instructed for bank 0, signal BANK0 specifying bank0 from bank decoder 370 is driven to an active state. Application of row related access causes row access designating signal ROWHIT to be driven to an H level. In response to row access designating signal ROWHIT from the command decoder, bit line equalize trigger signal EEQ from common control signal generation circuit 401 is driven to an inactive state whereas sense amplifier activation trigger signal SOE and word line select trigger signal RXT are driven to an active state.

In bank control signal generation circuit 402, bank control circuit 403#0 corresponding to bank 0 is activated according to bank specify signal BANK0 to drive array activation signal ACT, main word line drive signal MWL and sense amplifier drive signal SE to a selected state in a predetermined sequence. Array activation signal ACT is activated according to bit line equalize trigger signal EEQ. Main word line drive signal MWL is driven to a selected state according to word line select trigger signal RXT and array activation signal ACT. Sense amplifier drive signal SE is driven to an active state according to array activation signal ACT and sense amplifier activation trigger signal SOE. In bank 0, the addressed row is driven to a select state, and corresponding sense amplifiers are activated to sense and amplify the memory cell data connected to the selected row.

Under this state, application of a write command instructing data writing to bank 0 causes column access designating signal COLHIT to be driven to an active state of an H level. Also, write operation designating signal WRITE instructing a write operation is driven to an active state of an H level. In response to write trigger signal WWRE (not shown in FIG. 7), write operation activation signal WRE is activated. Also, in response to column access designating signal COLHIT, column select operation start designating signal COLBA is driven to an active state of an H level. As a result, selection of a memory cell column and data writing are carried out at bank 0. Write designating signal WRE has an active period of T1. The sense amplifiers still maintain an active state even when this data writing is completed. Also, bank 0 has a memory cell row selected.

Under this state, a row access command is applied to bank 3. External row access designating signal ROWHIT is driven to an active state, and bank specify signal BANK3 designating bank 3 is driven to an active state. As a result, each trigger signal is generated again by common control signal generation circuit 401 at a sequence similar to that upon applying a row access command to bank 0. Bank control circuit 403#3 corresponding to bank 3 is activated, whereby a row select operation of bank 3 is carried out. Here, bank control circuit 403#0 maintains the previous array active state since no further instruction is applied.

Then, application of a precharge command to bank 0 causes precharge designating signal PRE to be activated and output from command decoder 300, whereby precharge trigger signal PPC is pulled down to an L level. In response, precharge control signal /PC is rendered active to change from an H level to an L level in bank control circuit 403#0. Array activation signal ACT, main word line drive signal MWL and sense amplifier drive signal SE are sequentially driven to an inactive state of an L level in a predetermined sequence. As a result, bank 0 is reset to a precharge state (standby state).

Figure 7:
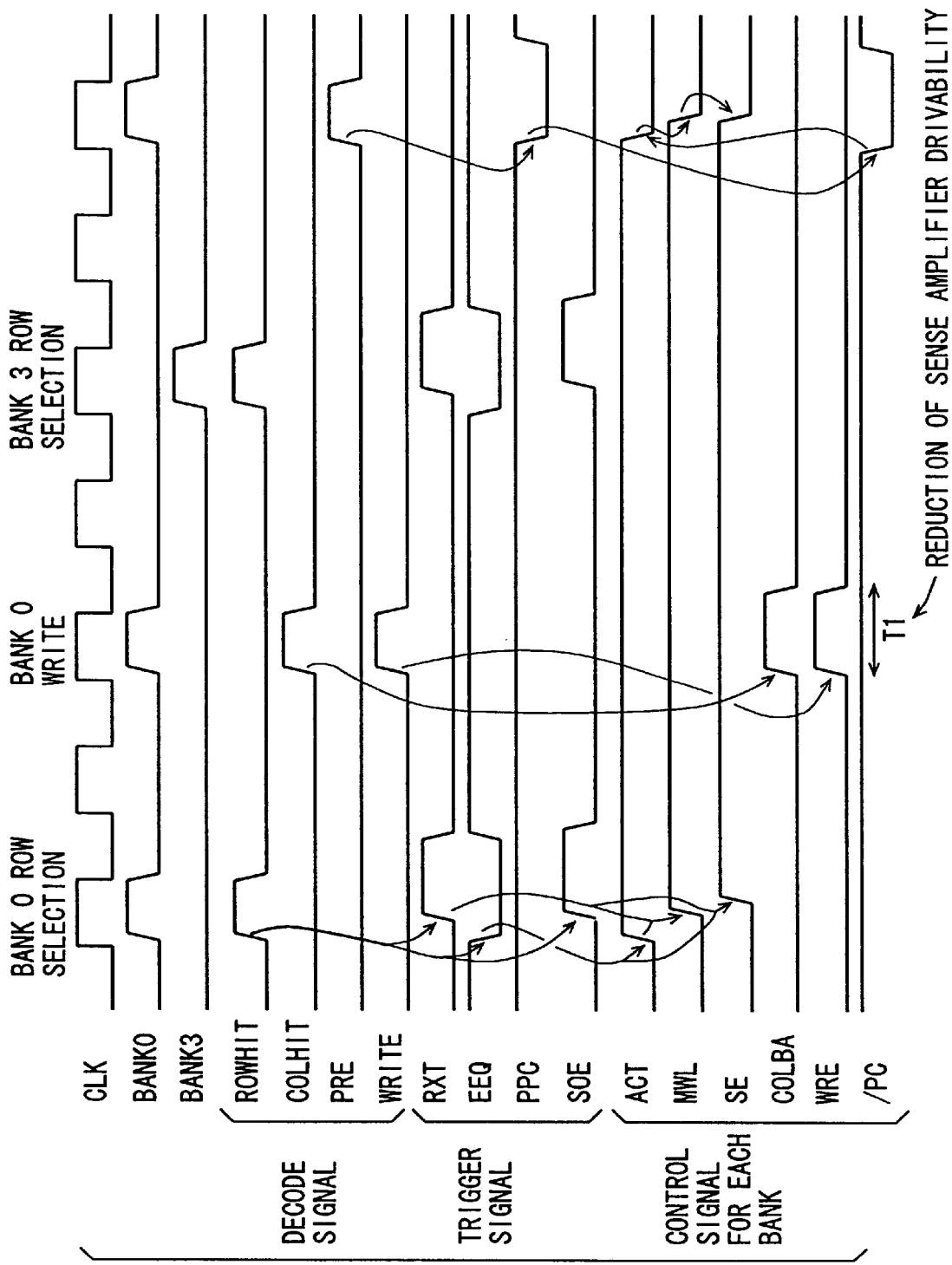
FIG. 7 is a waveform diagram representing an operation of the control signal generation circuit of FIG. 6.

When write operation control signal WRE is active, the voltage level of sense amplifier drive signal SE is adjusted in FIG. 7. This adjustment is carried out in each of bank control circuits 403#0–403#3. The structure will be described now.

Figure 8:
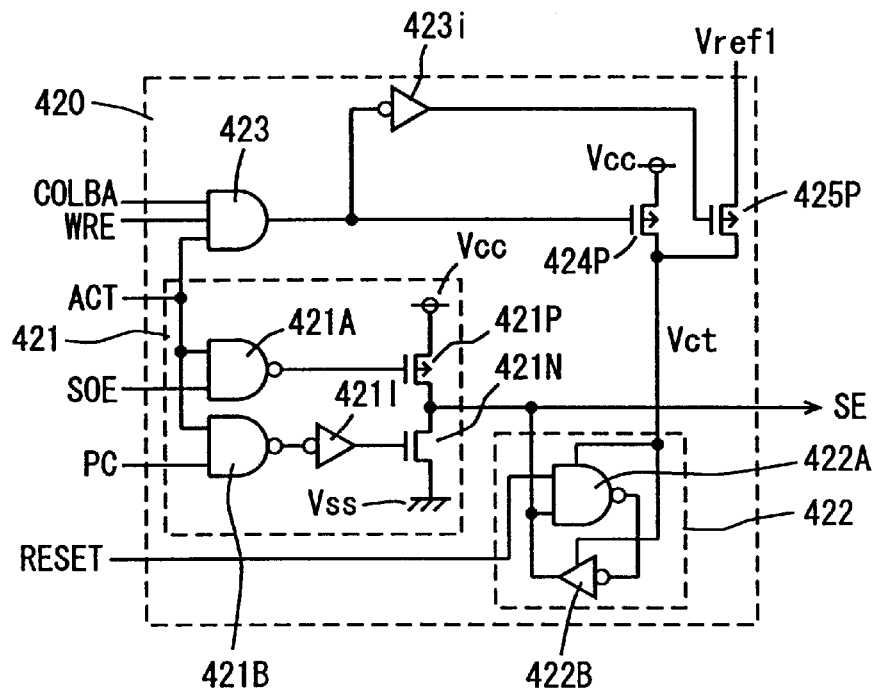
FIG. 8 shows a structure of a circuit generating a sense amplifier drive signal of the SDRAM of FIG. 1.

FIG. 8 shows a structure of a circuit 420 generating sense amplifier drive signal SE. The sense amplifier drive signal generation circuit of FIG. 8 is provided for each of bank control circuits 403#0–403#3 of FIG. 6. Referring to FIG. 8, sense amplifier drive signal generation circuit 420 includes a tristate buffer 421 providing sense amplifier drive signal SE according to array activation signal ACT, precharge activation signal PC and sense amplifier activation trigger signal SOE, a latch circuit 422 latching sense amplifier drive signal SE output from tristate buffer 421, an AND circuit 423 receiving array activation signal ACT, column select operation start designating signal COLBA and write operation designating signal WRE, an inverter 423i inverting an output signal of AND circuit 423, a p channel MOS transistor 424P rendered conductive, when the output signal of AND circuit 423 is at an L level, to transmit power supply voltage Vcc on power supply node Vcc to a power supply node Vct of latch circuit 422, and a p channel MOS transistor 425P rendered conductive, when the output signal of inverter 423i is at an L level, to transmit a reference voltage Vref1 lower than power supply voltage Vcc to power supply node Vct of latch circuit 422. Here, the power supply node and the voltage thereat are indicated by the same reference character. Reference voltage Vref1 satisfies the relationship of Vss<Vref1<Vcc.

Tristate buffer 421 includes a NAND circuit 421A receiving array activation signal ACT and sense amplifier activation trigger signal SOE, a NAND circuit 421B receiving array activation signal ACT and precharge activation signal PC, an inverter 421i inverting the output signal of NAND circuit 421B, a p channel MOS transistor 421P rendered conductive, when NAND circuit 421A outputs the signal of an L level, to drive sense amplifier drive signal SE to the level of power supply voltage Vcc, and an n channel MOS transistor 421N rendered conductive, when inverter 421I provides a signal of an H level, to discharge sense amplifier drive signal SE to the level of the ground voltage.

Latch circuit 422 includes a NAND circuit 422A receiving a reset signal RESET and sense amplifier drive signal SE, and an inverter 422B receiving the output of NAND circuit 422A for transmission to the output node from which sense amplifier drive signal SE is output. NAND circuit 422A and inverter 422B receive power supply voltage Vct on power supply node Vct as one operating power supply voltage.

Figure 9:
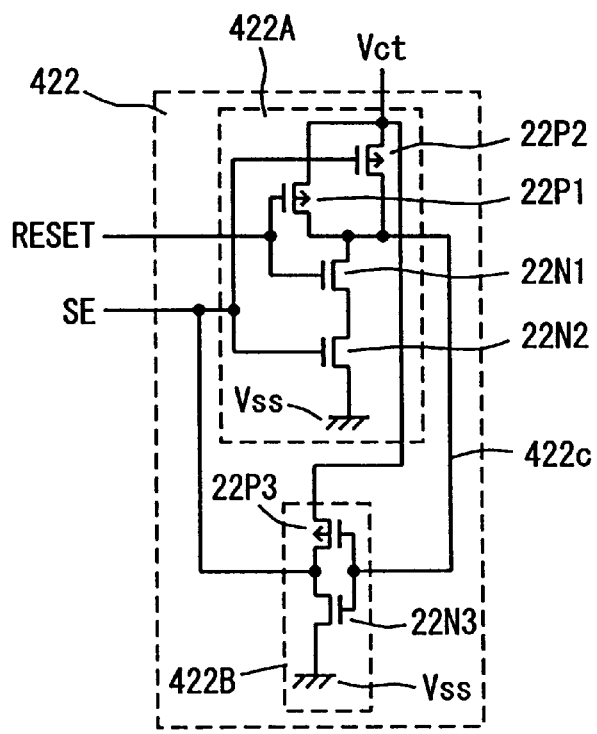
FIG. 9 specifically shows a structure of the latch circuit of FIG. 5.

FIG. 9 shows in detail the structure of latch circuit 422 of FIG. 8. Referring to FIG. 9, NAND circuit 422A includes a p channel MOS transistor 22P2 rendered conductive, when sense amplifier drive signal SE is at an L level, to transmit voltage Vct to an output node 422C, a p channel MOS transistor 22P1 rendered conductive, when reset signal RESET is at an L level, to transmit voltage Vct to an output node 422C, and n channel MOS transistors 22N1 and 22N2 connected in parallel between output node 422C and ground node Vss to receive reset signal RESET and sense amplifier drive signal SE at respective gates. Inverter 422B includes a p channel MOS transistor 22P3 rendered conductive, when NAND circuit 422A outputs a signal of an L level, to transmit voltage Vct to sense amplifier drive signal transmission line SE2, and an n channel MOS transistor 22N3 rendered conductive, when the voltage on node 422C is at an H level, to discharge the voltage on the signal line through which sense amplifier drive signal SE is transmitted to the ground voltage level.

Figure 10:
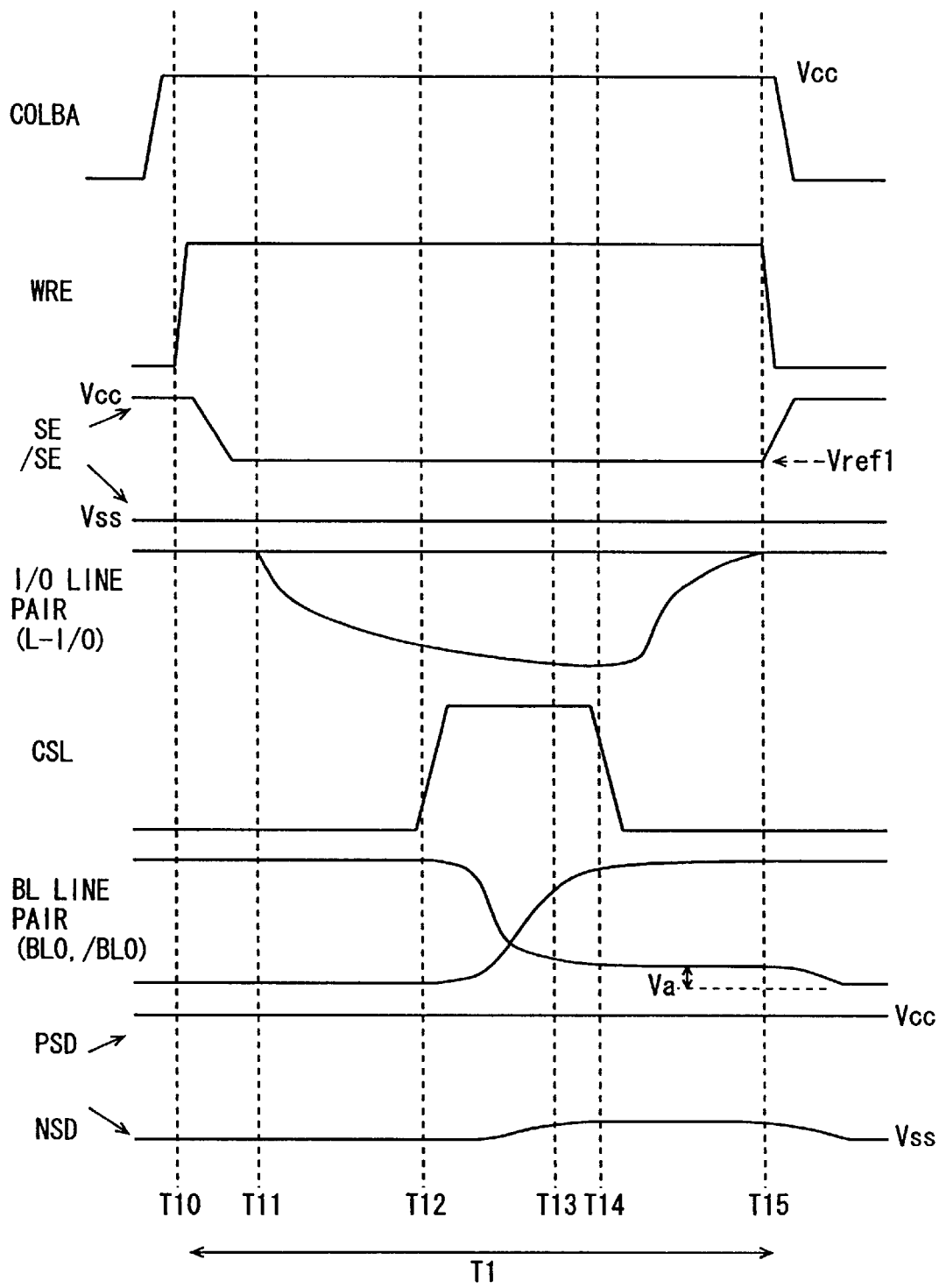
FIG. 10 is a timing chart representing an operation at the periphery of the sense amplifier of FIG. 1.

Latch circuit 422 drives sense amplifier drive signal SE to the ground voltage level by inverter 422B when NAND circuit 422A outputs an H level signal of voltage Vct. When NAND circuit 422A output a signal of an L level (ground voltage Vss level), the output signal from inverter 422B attains an H level of voltage Vct. The operation of the sense amplifier drive signal generation circuit shown in FIGS. 8 and 9 will be described with reference to the signal waveform diagram of FIG. 10. FIG. 10 shows the signal waveform during a time T1 when write operation activation signal WRE is rendered active in the data write operation of FIG. 7.

Prior to time T10, sense amplifier drive signal SE is driven to the level of power supply voltage Vcc. According to the circuit of FIG. 8, transition of array activation signal ACT and sense amplifier activation trigger signal SOE to an H level causes NAND circuit 421A to output a signal of an L level. In response, p channel MOS transistor 421P attains an L level, whereby sense amplifier drive signal SE is raised to the level of power supply voltage Vcc. This is carried out in a bank addressed by the bank address signal. Array activation signal ACT is rendered active by the row access designating signal. Precharge activation signal PC is at an inactive state of an L level. The output signal of inverter 421I is at an L level. Therefore, sense amplifier drive signal SE can be driven to the level of power supply voltage Vcc reliably.

Since column select operation start designating signal COLBA and write operation designating signal WRE are still at the L level, the output signal of AND circuit 423 is at an L level and p channel MOS transistor 424P conducts. The operating power supply voltage Vct of latch circuit 422 is at the level of power supply voltage Vcc. Therefore, sense amplifier drive signal SE is held at the level of power supply voltage Vcc by latch circuit 422 even when tristate buffer 421 attains an output high impedance state in response to the fall of sense amplifier activation trigger signal SOE to an L level. Complementary sense amplifier drive signal /SE is driven to the level of ground voltage Vss simultaneously to or slightly behind sense amplifier drive signal SE. When sense amplifier drive signal SE is driven to the level of power supply voltage Vcc and complementary sense amplifier drive signal /SE is driven to the level of the ground voltage, sense amplifier SA shown in FIG. 5 is rendered active. The signals on corresponding common bit lines (BL0, /BL0) are differentially amplified and latched. As a result, the voltages on the common bit lines attain the level of power supply voltage Vcc and the ground voltage. Here, P sense node PSD is at the level of power supply voltage Vcc, whereas N sense node NSD is at the level of the ground voltage.

When a write command is applied and a data write operation is instructed, column select operation start designating signal COLBA is driven to an H level to initiate a column select operation. At time T10, write operation designating signal WRE is driven to a selected state of an H level. Since column select operation start designating signal COLBA and also array activation signal ACT are at an H level, AND circuit 423 shown in FIG. 8 outputs a signal of an H level (power supply voltage Vcc level) and inverter 423a outputs a signal of an L level. In response, operating power supply voltage Vct of latch circuit 422 is lowered to the level of intermediate voltage Vref1. Sense amplifier drive signal SE is applied to the gate of sense amplifier drive transistor 613N, as shown in FIG. 5. Therefore, the ON resistance of sense amplifier drive transistor 613N increases, whereby the discharging current from N sense node NSD of sense amplifier SA to power supply line Vs is restricted.

Upon activation of write operation activation signal WRE, the write circuit not shown is rendered active. The write data is transmitted to local data bus L-I/O (I/O line pair) at time T11, whereby the signal potential of this local data bus L-I/O (I/O line pair) is altered. Column select switch 617SW is still at an inactive state, and the common bit line is isolated from the local data bus.

Upon the rise of column select signal CSL to an H level through the decoding of the column address signal at time T12, column select switch (SW) 617SW provided corresponding to an addressed column conducts. As a result, the local data bus is electrically connected to common bit line pair BL, /BL. Sense amplifier drive signal SE is at the voltage level of intermediate reference voltage Vref1 and ON resistance of sense amplifier drive transistor 613N is increased. Therefore, the drivability (latching power) of sense amplifier 614SD is reduced, and the latched data at sense amplifier 614SA is speedily inverted according to the write data transmitted on local data bus L-I/O. Inversion of the latched data occurs when the logic levels of the latched data of the sense amplifier and of the write data are opposite. Discharge current flows in the sense amplifier when the latched data is inverted, and the voltage level of N sense node NSD slightly rises by sense amplifier drive transistor 613N of a large ON resistance. This rise in voltage of N sense node NSD is transmitted to common bit lines BL, /BL (BL0, /BL0) via corresponding sense amplifier 614 SA and bit line the voltage is maintained at a level higher than ground voltage Vss by voltage Va.

When column select signal CSL is driven to an inactive state of an L level at time T14, the selected bit line pair is disconnected from the local data bus. Under this state, although the write data is latched by sense amplifier 614SA, the sense node (common bit line pair) is not completely discharged at time T14. This discharge is completed after time T14.

The ON resistance of sense amplifier drive transistor 613N is high even during discharge of sense amplifier 614SA, and the voltage level of N sense node NSD is higher than the ground voltage. Accordingly, the voltage level of the common bit line is held at the level of voltage Va.

When the write operation is completed at time T15, write operation activation signal WRE is driven to an L level. In response, the output signal of AND circuit 423 shown in FIG. 8 attains an L level, and P channel MOS transistors 424P and 425P are rendered conductive and nonconductive, respectively. As a result, operating power supply voltage Vct of latch circuit 422 rises from the level of intermediate voltage Vref1 to power supply voltage Vcc. The drivability of sense amplifier 614SA is increased (since the ON resistance of sense amplifier drive transistor 613N is reduced to allow a greater amount of current to be conducted). Voltage Va on the common bit line is lowered to the level of ground voltage Vss. Thus, data of an L level at the ground voltage is reliably written into the selected memory cell.

Following inactivation of write operation activation signal WRE, column select operation start designating signal COLBA attains an L level. Thus, one data write cycle is completed.

In the SDRAM, a column select signal CSL is sequentially generated in synchronization with clock signal CLK during the burst length period by the burst address counter (refer to FIG. 3) to write data into a selected memory cell.

Sense amplifier 614SA is connected to a bit line in the memory cell array where a selected memory cell is connected via a common bit line. Therefore, the time required for writing data into a selected memory cell can be reduced by the high speed inversion of the latched data in sense amplifier 614SA (inversion operation is speeded up). Therefore, period T1 of FIG. 10 can be reduced, so that the next writing operation start timing can be advanced and high speed writing is allowed. The period of time between time T12 and time T13 can be reduced to shorten write time T1. Thus, the data writing cycle can be shortened to allow high speed writing.

Only a switching sense amplifier drive transistor (N and P sense amplifier drive transistors) is provided for each sense amplifier 614SA. Therefore, increase of the occupying area of sense amplifier drive bands 613A and 613B can be suppressed. Since a sense amplifier drive transistor is provided corresponding to each sense amplifier 614SA, the distance between each sense amplifier and the power supply line is short, and influence by the interconnection line resistance can be reduced. So, sense amplifiers 614SA can be operated at the same timing, and a high speed sensing operation is realized. Since the power supply voltage is supplied stably to the sense amplifier, a stable sensing operation can be realized.

Although the structure of the circuitry generating sense amplifier drive signal /SE is not described in the first embodiment, a conventional structure can be used therefor since the voltage level of sense amplifier drive signal /SE is simply driven from the level of power supply voltage Vcc to the level of the ground voltage, and does not change during the sense amplifier operation.

Second Embodiment

Figure 11:
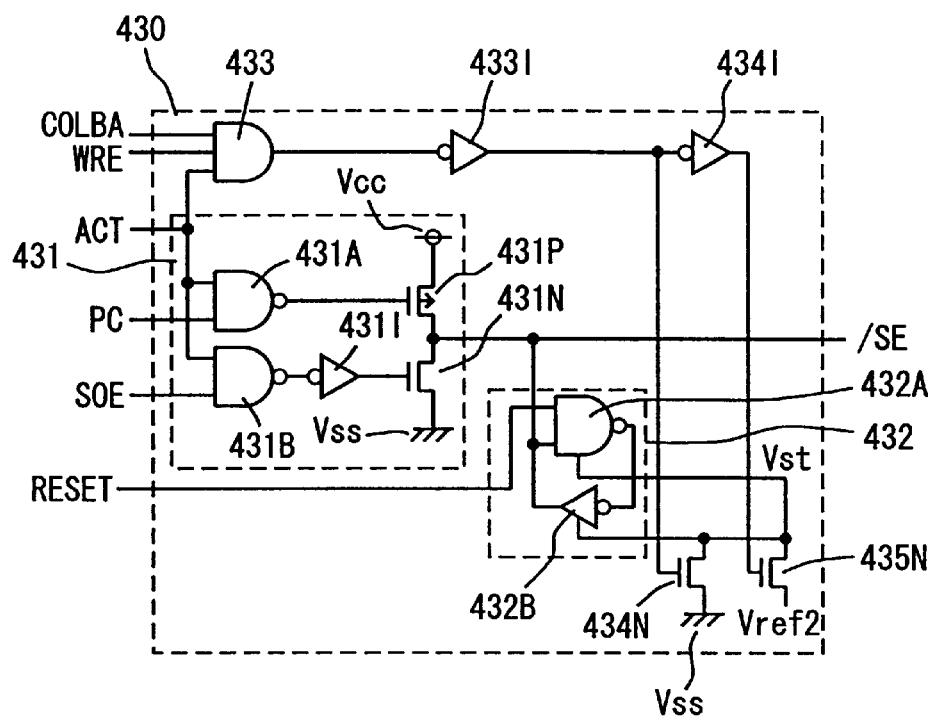
FIG. 11 shows a structure of a sense amplifier drive signal generation circuit according to a second embodiment of the present invention.

FIG. 11 shows the main part of a semiconductor memory device according to a second embodiment of the present invention. In FIG. 11, the structure of sense amplifier drive signal generation circuit 430 is shown. Sense amplifier drive signal generation circuit 430 applies an output signal thereof to the gate of sense amplifier drive transistor 613P. According to the second embodiment, the voltage level of sense amplifier drive signal /SE applied to the gate of sense amplifier drive transistor 613P formed of a p channel MOS transistor is changed when data is written. Sense amplifier drive signal SE is driven from the level of the ground voltage to the level of power supply voltage Vcc to be maintained thereat when the sense amplifier is activated.

Referring to FIG. 11, sense amplifier drive signal generation circuit 430 includes a tristate buffer 431 receiving sense amplifier activation trigger signal SOE, precharge activation signal PC, and array activation signal ACT, a latch circuit 432 latching the voltage level of sense amplifier drive signal /SE output from tristate buffer 431, an AND circuit 433 receiving array activation signal ACT, write activation signal WRE, and column select operation start designating signal COLBA, an inverter 433I receiving the output signal of AND circuit 433, an inverter 434I receiving the output signal of inverter 433I, an n channel MOS transistor 434N rendered conductive in response to the output signal of inverter 433I to set the L level power supply voltage level of latch circuit 432 to the level of ground voltage Vss, and an n channel MOS transistor 435N rendered conductive in response to the output signal of inverter 434I so that the L level power supply voltage Vst of latch circuit 432 is set to the level of reference voltage Vref2.

Tristate buffer 431 includes a NAND circuit 431A receiving array activation signal ACT and precharge activation signal PC, a NAND circuit 431B receiving array activation signal ACT and sense amplifier activation trigger signal SOE, an inverter 431I inverting the output signal of NAND circuit 431B, a p channel MOS transistor 431P rendered conductive, when the output signal of NAND circuit 431A is at L level, to drive sense amplifier drive signal ISE to the level of power supply voltage Vcc, and an n channel MOS transistor 431N rendered conductive, when the output signal of inverter 431I is at an H level, to drive sense amplifier drive signal /SE to the level of ground voltage Vss.

Latch circuit 432 includes a NAND circuit 432A receiving a reset signal RESET and sense amplifier drive signal /SE, and an inverter 432B inverting the output signal of NAND circuit 432A and transmitting the inverted signal on the signal line through which sense amplifier drive signal /SE is transmitted. NAND circuit 432A and inverter 432B receive power supply voltage Vst as the L level power supply voltage to operate.

Figure 12:
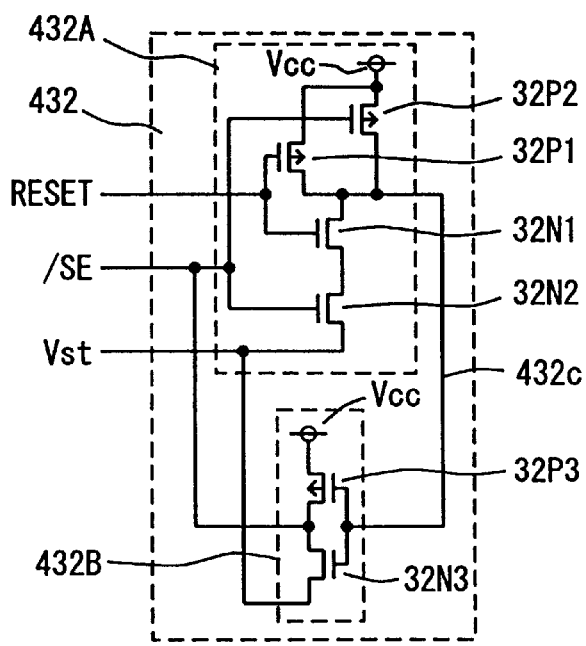
FIG. 12 shows in detail a structure of the latch circuit of FIG. 11.

FIG. 12 shows the structure of latch circuit 432 of FIG. 11. Referring to FIG. 12, NAND circuit 432A includes a p channel MOS transistor 32P1 receiving reset signal RESET to transmit power supply voltage Vcc to an output node 432C, a p channel MOS transistor 32P2 rendered conductive, when sense amplifier drive signal /SE is at an L level, to transmit power supply voltage Vcc to output node 432C, and n channel MOS transistors 32N1 and 32N2 connected in series between output node 432C and the power supply node, to receive reset signal RESET and sense amplifier drive signal /SE at respective gates. L level power supply voltage Vst is applied to the power supply node of the circuit 432.

Figure 13:
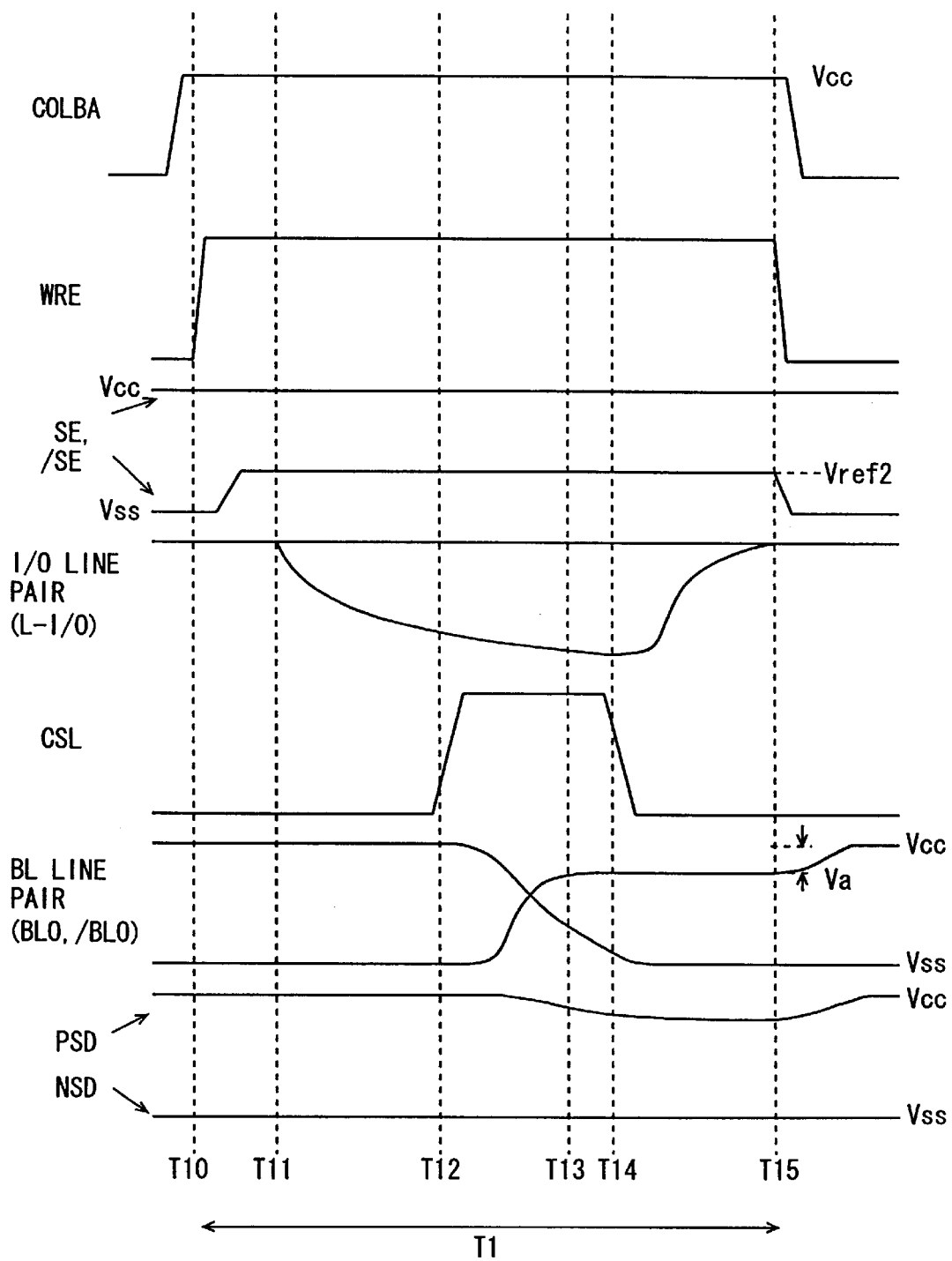
FIG. 13 is a timing chart representing an operation of the sense amplifier peripheral circuitry of the second embodiment.

Inverter 432B includes a p channel MOS transistor 32P3 rendered conductive, when the signal voltage on node 432C is at an L level, to drive sense amplifier drive signal /SE to the level of power supply voltage Vcc, and an n channel MOS transistor 32N3 rendered conductive, when the signal voltage on node 432C is at an H level, to drive sense amplifier drive signal /SE to the level of L level power supply voltage Vst. The operation of sense amplifier drive signal generation circuit 430 of FIGS. 11 and 12 will now be described with reference to the signal waveform diagram of FIG. 13.

Sense amplifier drive signal SE attains the level of ground voltage Vss and power supply voltage Vcc in an inactive state and an active state, respectively. Upon application of a row access command, sense amplifier activation trigger signal SOE from common control signal generation circuit 401 is driven to an active state of an H level. Also, array activation signal ACT is driven to an H level. Therefore, the signal output from inverter 431I in tristate buffer 431 is driven to an H level, whereby n channel MOS transistor 431N conducts. Sense amplifier drive signal /SE is driven to the level of ground voltage Vss. This voltage level of sense amplifier drive signal /SE is latched by latch circuit 432. Since a column access command is applied under this state, the L level power supply voltage Vst of latch circuit 432 is ground voltage Vss level by n channel MOS transistor 434N according to the H level output signal of inverter 433I. Therefore, sense amplifier drive signal /SE is maintained at the level of ground voltage Vss.

When write activation signal WRE is activated according to the write command at time T10, column select operation start designating signal COLBA enters an active state of an H level at an earlier timing. The output signal of AND circuit 433 shown in FIG. 11 rises to an H level. In response, inverters 433I and 434I output a signal of an L level and an H level, respectively, and the L level power supply voltage Vst of latch circuit 432 rises to the level of a reference voltage Vref2. The voltage level of sense amplifier drive signal /SE attains the level of intermediate voltage Vref2 (Vss<Vref2<Vcc). When sense amplifier activation trigger signal SOE attains an L level, MOS transistor 431N is rendered nonconductive, so that tristate buffer 431 attains an output high impedance state. Under this state, column select signal CSL is pulled up to an H level at time T12, like the previous first embodiment, whereby a selected column is connected with local data bus L-I/O. The latching power of H level data is reduced for sense amplifier 614SA since the ON resistance of the drive transistor that drives to an H level is increased. Therefore, the data held in sense amplifier 614SA corresponding to the selected column is inverted speedily according to the write data. Since the ON resistance of the sense amplifier drive transistor is increased, the voltage level of P source node PSD becomes lower than the level of power supply voltage Vcc due to the voltage drop.

When column select signal CSL is pulled down to an inactive state of an L level at time T14, the sense amplifier and local data bus L-I/O are disconnected. Under this state, the sense amplifier retains the applied data. Since the voltage level of P source node PSD is lower than power supply voltage Vcc, the H level potential of common bit line BL (BL0, /BL0) becomes lower than the voltage level of power supply voltage Vcc by voltage Va.

When write operation activation signal WRE becomes inactive at time T15, inverters 433I and 434I shown in FIG. 11 provide an output signal of an H level and an L level, respectively. The L level power supply voltage Vst of latch circuit 432 attains the level of ground voltage. The ON resistance of sense amplifier drive transistor 613P becomes smaller, so that sufficient current can be supplied. The current driving power of the sense amplifier is increased. The voltage levels of the common bit line pair and corresponding bit line pair are stably maintained at the level of power supply voltage Vcc and ground voltage Vss, respectively.

In the second embodiment, the voltage level of sense amplifier drive signal /SE applied to the H level driving sense amplifier drive transistor for the sense amplifier is reduced in data writing. Therefore, the latching capability (current driving capability) of the sense amplifier is reduced. The latched data of the sense amplifier can be altered according to the write data at high speed. Thus, high speed data writing can be realized, like the first embodiment.

[Modification]

Figure 14:
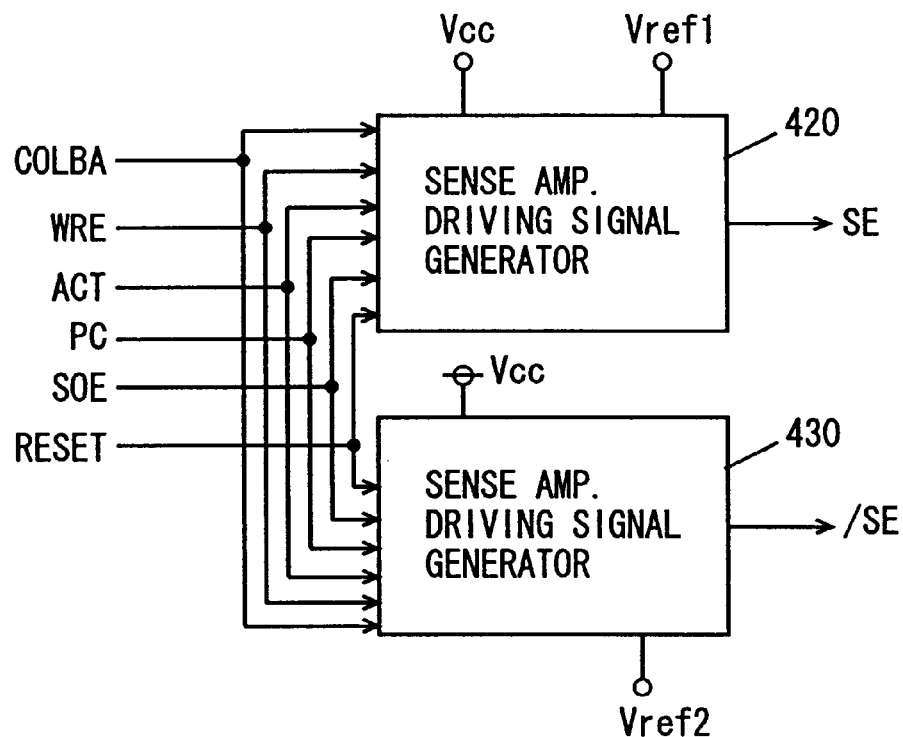
FIG. 14 schematically shows a modification of the second embodiment.

FIG. 14 shows the structure of a modification of the second embodiment. Sense amplifier drive signal generation circuits (generators) 420 and 430 are provided in FIG. 14. Sense amplifier drive signal generation circuit 420 having a structure similar to that of FIG. 8 lowers the voltage level of sense amplifier drive signal SE during data writing. Sense amplifier drive signal generation circuit 430 having a structure similar to that of FIG. 11 raises the voltage level of sense amplifier drive signal /SE in a data writing operation.

According to the structure of FIG. 14, the ON resistance of P sense amplifier drive transistor 613P and N sense amplifier drive transistor 613N can both be increased in a data writing operation. The drivability of sense amplifier 614SA can be set small enough to realize high speed data writing.

Third Embodiment

Figure 15:
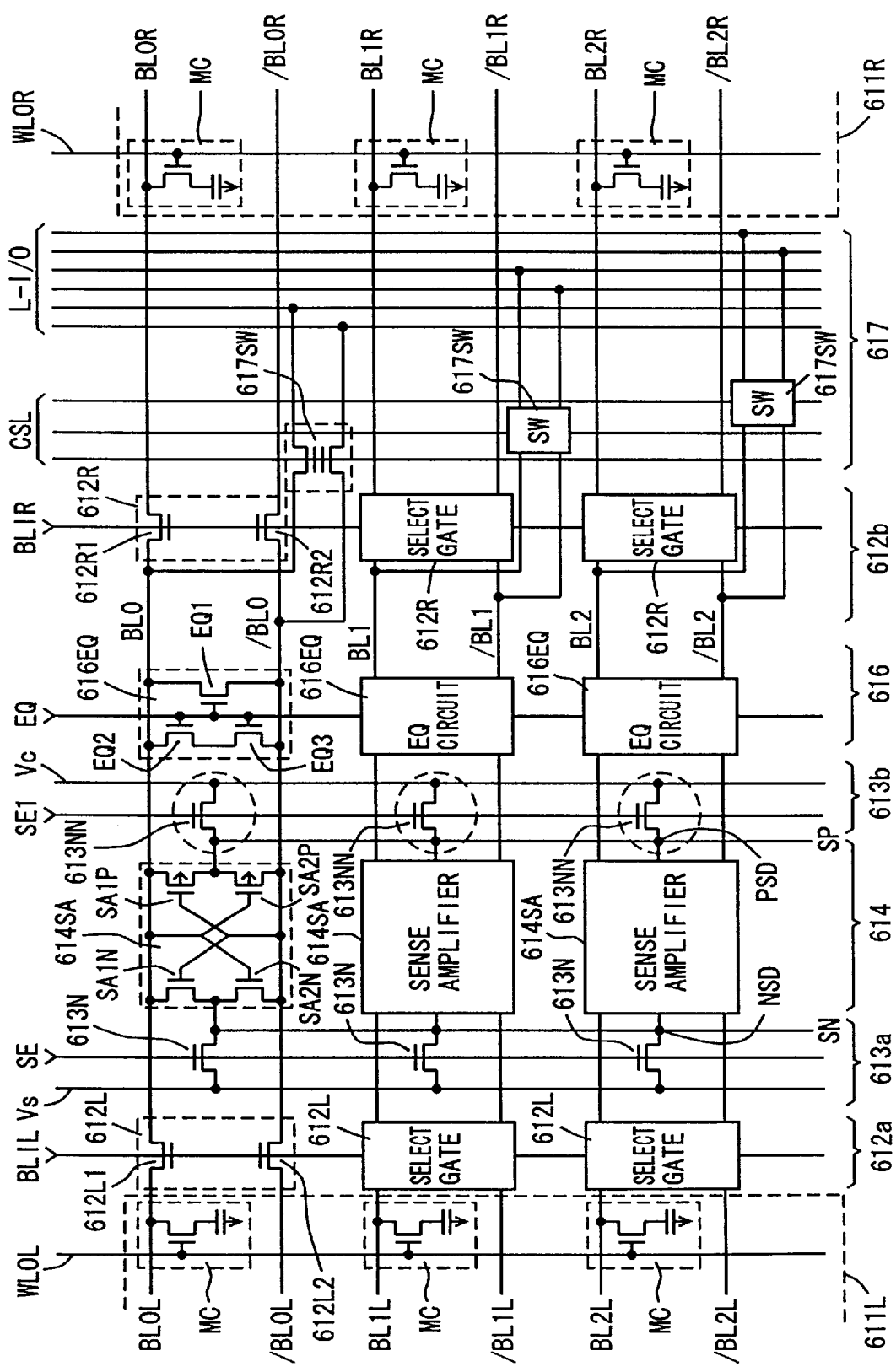
FIG. 15 shows a structure of the sense amplifier and its periphery of an SDRAM according to a third embodiment of the present invention.

FIG. 15 shows the structure of the main part of a semiconductor memory device according to a third embodiment of the present invention. The difference of the structure of FIG. 15 from the structure of FIG. 5 is set forth in the following. In sense drive band 613b, the sense amplifier drive transistor between power supply line Vc and each sense amplifier 614SA is formed of an n channel MOS transistor 613NN. Also, sense amplifier SA has P source node PSD connected to a common source line SP and N source node NSD connected to a common source line SN. The remaining structure is identical to the structure shown in FIG. 5, and a corresponding component have the same reference characters allotted, and detailed description thereof will not be repeated. Sense amplifier drive signal SE1 drives sense amplifier drive transistor 613NN formed of an n channel MOS transistor to couple power supply line Vc with sense amplifier SA. Therefore, the polarity of sense amplifier drive signal SE1 differs from the polarity of the previous first and second embodiments.

Figure 16:
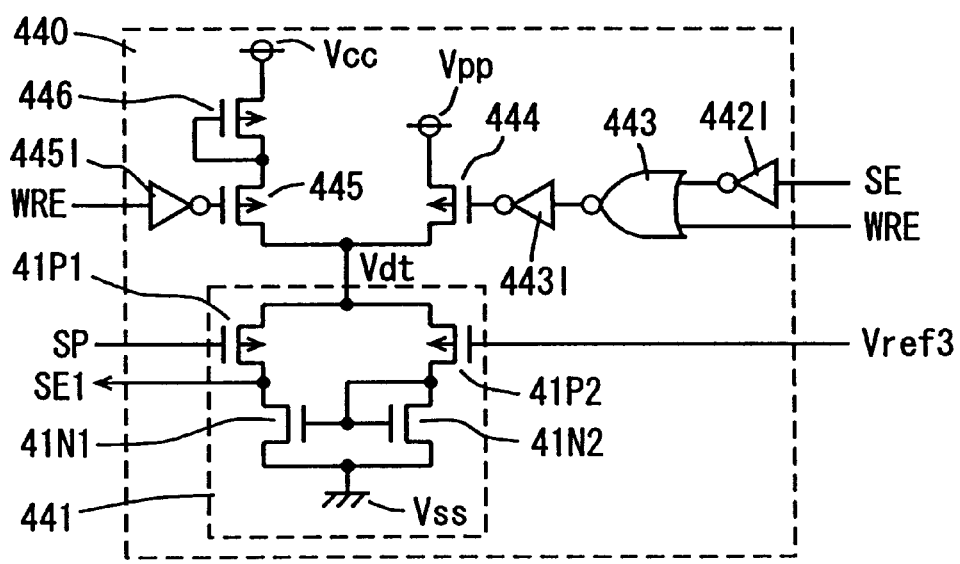
FIG. 16 shows a structure of a circuit generating a sense amplifier drive signal of the third embodiment.

FIG. 16 shows a structure of the section generating sense amplifier drive signal SE1. Referring to FIG. 16, a sense amplifier drive signal generation circuit 440 includes a comparator circuit 441 comparing an intermediate voltage Vref3 (Vss<Vref3<Vcc) with the voltage of common source node SP to output a sense amplifier drive signal SE1 according to the comparison result, an inverter 442I receiving sense amplifier drive signal SE, a NOR circuit 443 receiving the output signal of inverter 442I and write operation activation signal WRE, an inverter 443I receiving the output signal of NOR circuit 443, a p channel MOS transistor 444 rendered conductive, when the output signal of inverter 443I is at an L level, to transmit a high voltage Vpp higher than power supply voltage Vcc to a power supply node Vdt of comparator circuit 441, a diode-connected p channel MOS transistor 446 for down-shifting power supply voltage Vcc, an inverter 445I receiving write operation activation signal WRE, and a p channel MOS transistor 445 rendered conductive, when the output signal of inverter 445I is at L level, to transmit a voltage of Vcc−Vthp that is down-shifted by MOS transistor 446 to power supply node Vdt of comparator circuit 441. Vthp indicates the absolute value of the threshold voltage of MOS transistor 446.

Comparator circuit 441 includes a p channel MOS transistor 41P1 having a gate connected to a common source node SP, a p channel MOS transistor 41P2 receiving intermediate voltage Vref3 at its gate, an n channel MOS transistor 41N1 connected between MOS transistor 41P1 and the ground node, and an n channel MOS transistor 41N2 connected between MOS transistor 41P2 and the ground node and having a gate connected to a drain of MOS transistor 41P2. MOS transistors 41N1 and 41N2 form a current mirror circuit. Inverters 443I and 445I have the level conversion function of converting the level of power supply voltage Vcc to the level of a boosted voltage Vpp. Accordingly, MOS transistors 444 and 445 can be reliably set to a nonconductive state. Comparator circuit 441 outputs the sense amplifier drive signal SE1 from the connection node of MOS transistors 41P1 and 41N1. The operation of the structure shown in FIGS. 15 and 16 will be described now with reference to the timing chart of FIG. 17.

At time T20, bit line isolation control signal BLIR is pulled down from the level of boosted voltage Vpp to the level of the ground voltage. In response, select gate band 612b is rendered nonconductive, whereby sense amplifier band 614 and memory cell array 611R are disconnected. Memory cell array 611L is connected to sense amplifier band 614 (isolation control signal BLIL maintains the level of boosted voltage Vpp). More specifically, each of bit line pairs BL0L, /BL0L, BL1L, /BL1L, and BL2L, /BL2L of memory cell array 611L is electrically connected to common bit lines BL0, /BL0, BL1, /BL1, and BL2, /BL2. In equalize circuit band 616, equalize designating signal EQ attains an inactive state. The equalize operation of the bit line is stopped.

Under this state, a memory cell select operation is carried out at memory cell array 611L. More specifically, at time T21, word line WL0L is driven to a selected state (the level of boosted voltage Vpp). The data of memory cell MC connected to this word line WL0L is read out onto each of corresponding bit lines BL0L, BL1L, and BL2L to be transmitted to common bit lines BL0, BL1, and BL2.

When the voltage levels on the common bit lines are increased sufficiently, sense amplifier drive signals SE and SE1 are activated at time T22. The drive of sense amplifier drive signal SE to an H level causes inverter 442I and NOR circuit 443 to output signals of an L level and an H level, respectively (write operation activation signal WRE is at an L level). In response, the output signal of inverter 443I attains an L level to turn on. MOS transistor 444. Boosted voltage Vpp is transmitted to power supply node Vdt of comparator circuit 441.

During the inactivation period of sense amplifier drive signal SE, the output signals of inverters 443I and 445I are both at an H level (level of boosted voltage Vpp), and MOS transistors 444 and 445 are inactive. Therefore, the comparison operation of comparator circuit 441 is inhibited. In response to activation of sense amplifier drive signal SE, comparator circuit 441 is rendered active, whereby the comparison operation of the voltage on common source line SP and intermediate voltage Vref3 is carried out. Since boosted voltage Vpp is applied to power supply node Vdt, the voltage level of sense amplifier drive signal SE1 is boosted speedily (since the amplitude corresponds to the level of boosted voltage Vpp). The gate-source voltage of the current mirror stage transistor is large so that the drive current thereof increases. Therefore, sense amplifier drive transistors 613N and G13NN are turned on at high speed when the sense amplifier drive signal is made active, to supply ground voltage Vss and power supply voltage Vcc to sense amplifier 614SA, and sense amplifier 614SA carries out a sensing operation speedily.

When the voltage level of common source line SP is lower than intermediate voltage Vref3, comparator circuit 441 raises the voltage level of sense amplifier drive signal SE1. When the voltage level of common source line SP becomes lower than intermediate voltage Vref3, the voltage level of sense amplifier drive signal SE1 is reduced. Therefore, the voltage level of sense amplifier drive signal SE1 is adjusted such that the voltage level on common source SP is equal to the voltage level of intermediate voltage Vref3 by comparator circuit 441. By setting the voltage level of intermediate voltage Vref3 to the level of power supply voltage Vcc, a reliable sensing and restoring operation can be implemented. Here, the voltage level of common source line SP becomes equal to the level of intermediate voltage Vref3. The voltage level of common source node SN becomes equal to the level of the ground voltage.

When the voltage level of common source line SP is stabilized at the level of intermediate voltage Vref, sense amplifier drive signal SE1 is also stabilized at that voltage level.

When write operation activation signal WRE is rendered active according to the data write designation at time T23, the output signal of NOR circuit 443 attains an L level. In response, the output signal of inverter 443I attains an H level, and MOS transistor 444 is rendered nonconductive to inhibit supply of boosted voltage Vpp to comparator circuit 441. The output signal of inverter 445I attains an L level, whereby MOS transistor 445 conducts to transmit voltage of Vcc−Vthp to power supply node Vdt of comparator circuit 441. The voltage level of power supply node Vdt of comparator circuit 441 is lower than power supply voltage Vcc. Therefore, the voltage level of sense amplifier drive signal SE1 is lower than the level of voltage Vcc−Vthp at power supply node Vdt. In a data writing operation, the ON resistance of sense amplifier drive transistor 613NN becomes higher to reduce the drivability of sense amplifier 614SA. When a column select line CSL not shown is selected in the data writing operation, the write data on local data bus L-I/O is transmitted to common bit line pairs BL, /BL (BL0, /BL0) via column select switch (SW) 617SW. The current driving capability of sense amplifier 614SA is reduced, and the latched data can be altered speedily according to the write data.

At time T24, the data writing operation is completed, and write operation activation signal WRE is driven to an inactive state of an L level. As a result, the output signal of inverter 443I attains an L level and the output signal of inverter 445I attains an H level. Therefore, boosted voltage Vpp is transmitted to power supply node Vdt of comparator circuit 441. Common source line SP is maintained stably at the voltage level of intermediate voltage Vref3. The current driving capability of sense amplifier drive transistor 613NN is set large enough (ON resistance is reduced), and sense amplifier 614SA maintains the write data stably.

According to the third embodiment of the present invention, the voltage of P source node PSD is compared with intermediate voltage Vref3 to control the gate voltage of sense amplifier drive transistor 613NN such that the comparison voltages are equal. Therefore, the amplitude of the sense drive signal is large when a sensing operation is initiated. The drivability of the sense amplifier can be increased to carry out a sensing operation speedily. When the sensing operation is completed, the voltage level of the sense amplifier drive signal is lowered, so that the drivability of the sense amplifier is reduced. Therefore, data can be written at high speed. Since the voltage of power supply voltage Vdt of the comparator circuit is reduced in this writing operation, the amplitude of the sense amplifier drive signal becomes smaller, whereby the sense amplifier drivability is lowered. The amplitude of the gate voltage of the sense amplifier drive transistor is restricted (upper limit is restricted). The drivability of the sense amplifier is reduced, and the latching data of the sense amplifier can be stabilized speedily according to the write data. Thus, high speed writing can be realized.

[Modification]

By connecting in common P source nodes PSD and N source nodes NSD of the sense amplifiers over a plurality of sense amplifiers respectively, the voltages of P source nodes PSD and N source nodes NSD of sense amplifiers 614SA can be set equal, respectively. Therefore, the operation speed of each sense amplifier can be set equal, and high speed sensing operation is realized.

[Modification]

FIG. 18 shows the structure of a modification of the third embodiment. In FIG. 18, common source lines SP and SN each are provided corresponding to a predetermined number of sense amplifiers 614SA. FIG. 18 shows the interconnection of P and N source nodes of three sense amplifiers 614SA with common source lines SP and SN, respectively. One pair of sense amplifier drive transistors 613NN and 613N are provided for a predetermined number of sense amplifiers 614SA. The remaining structure is similar to that of FIG. 15.

By connecting P (N) source nodes in common and providing one sense drive transistor for a predetermined number of sense amplifiers 614SA, the source nodes of the predetermined number of sense amplifiers can be maintained at the same voltage to allow stable operation of the sense amplifiers. Since the number of the sense amplifier drive transistors is reduced, lay out of these sense amplifier drive transistors is facilitated.

Fourth Embodiment

Figure 19:
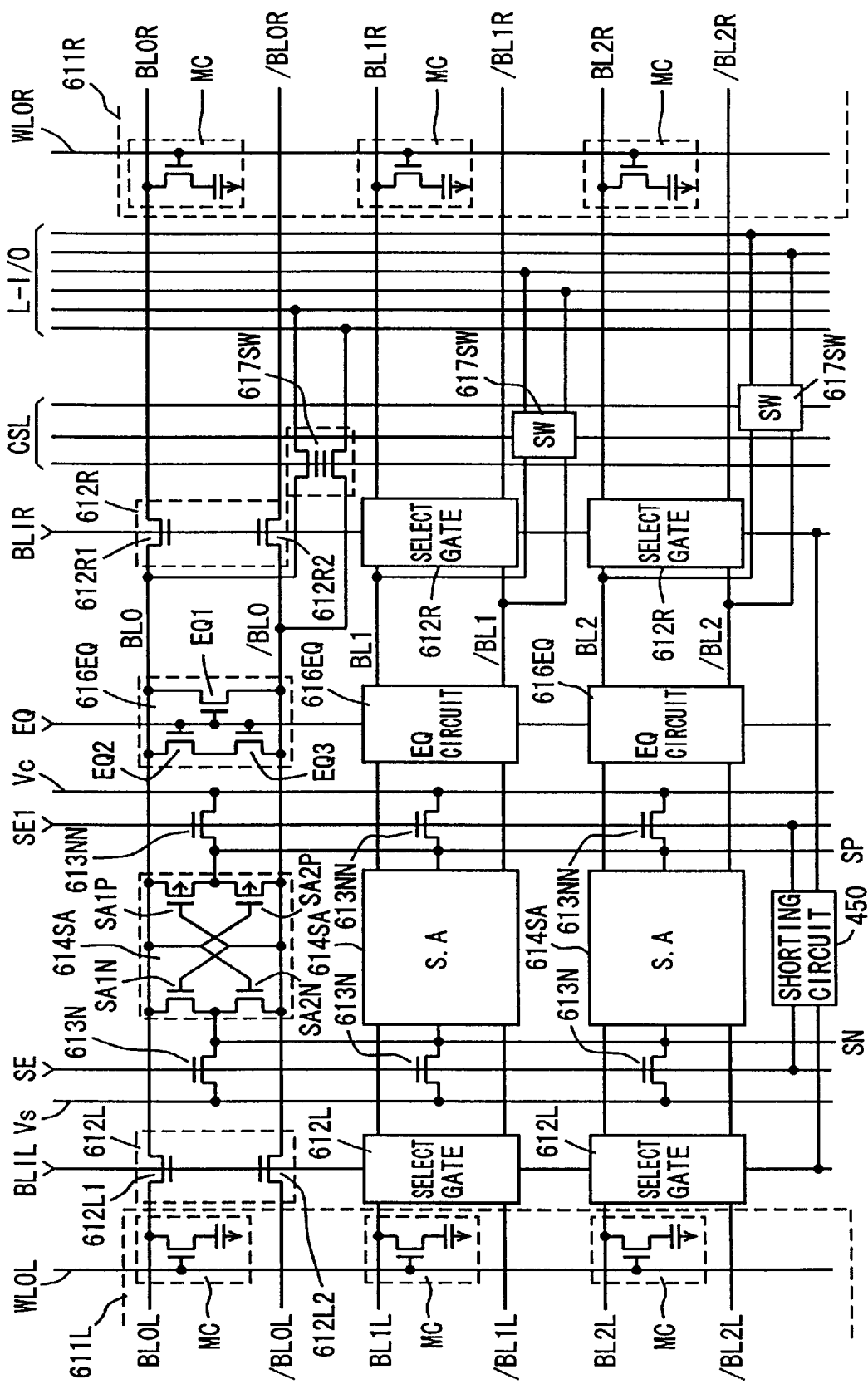
FIG. 19 shows a structure of the sense amplifier peripheral circuitry of an SDRAM according to a fourth embodiment of the present invention.

FIG. 19 schematically shows a structure of a semiconductor memory device according to a fourth embodiment of the present invention. Referring to FIG. 19, a shorting circuit 450 is provided at the sense amplifier band to selectively short-circuit sense amplifier drive signal lines SE and SE1 and bit line isolation control signal lines BLIL and BLIR. The remaining structure is similar to that shown in FIG. 15, and corresponding component have the same reference characters allotted, and detailed description thereof will not be repeated.

Bit line isolation control signals BLIL and BLIR are at the level of boosted voltage Vpp in the standby state and selected state. In an non-selected state, bit line isolation control signals BLIL and BLIR are discharged to the level of the ground voltage. By short the bit line isolation control signal line and the sense amplifier drive signal line, shorting circuit 450 reduces the voltage level of a selected bit line isolation control signal. As a result, the ON resistance of select gates 612L or 612R is increased to reduce the load of sense amplifier 614SA. The structure and operation of shorting circuit 450 are now described.

Figure 20:
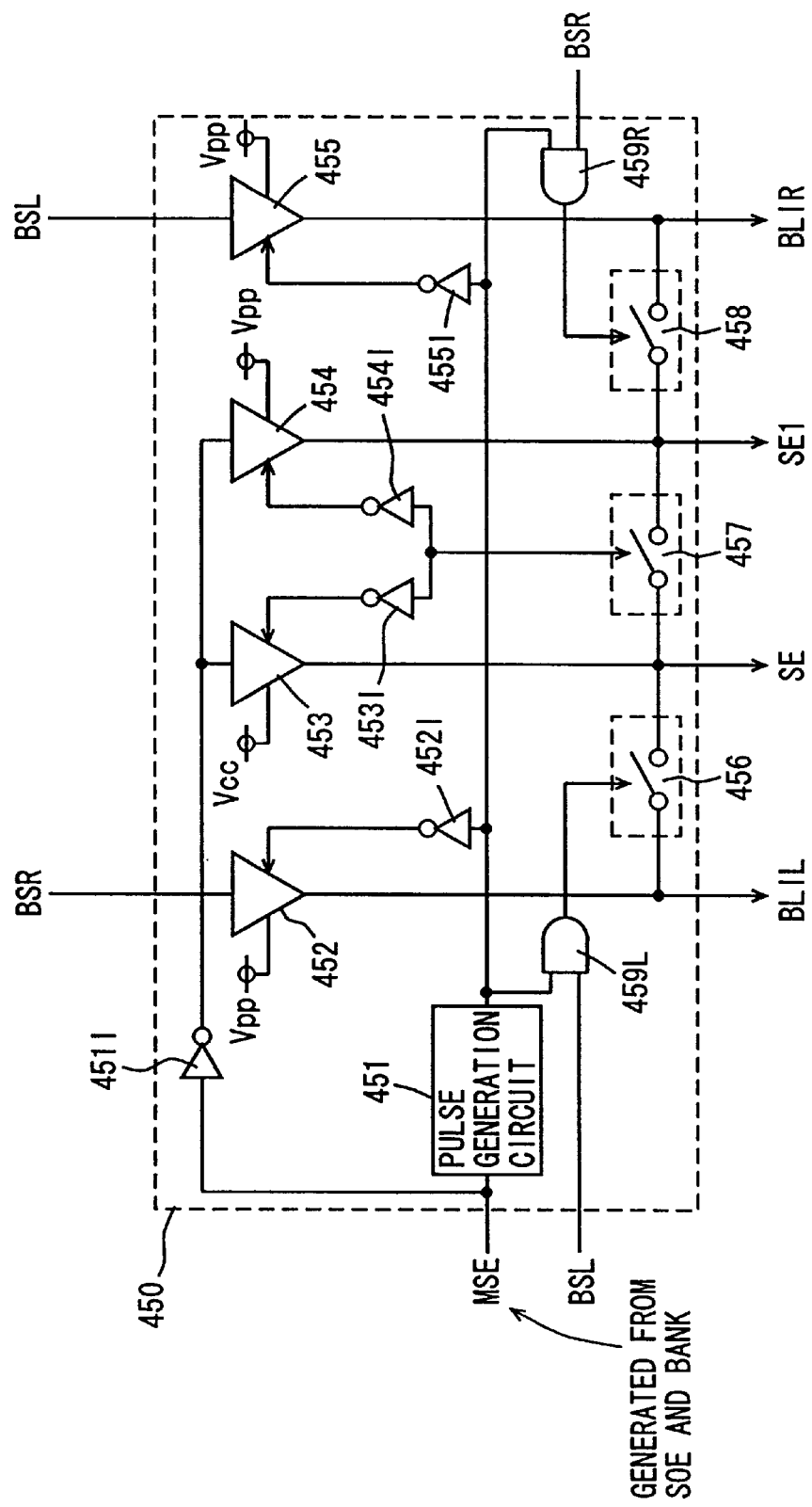
FIG. 20 shows a structure of a shorting circuit of FIG. 19.

FIG. 20 schematically shows a structure of shorting circuit 450 of FIG. 19. Referring to FIG. 20, shorting circuit 450 includes an inverter 451I inverting a main sense amplifier trigger signal MSE, a pulse generation circuit 451 generating a pulse signal that attains an H level for a predetermined time in response to activation of main sense amplifier activation signal MSE, a tristate buffer 452 receiving a memory cell array specify signal BSR, tristate buffers 453 and 454 receiving the output signal of inverter 451I, and tristate buffer 455 receiving memory cell array specify signal BSL.

Memory cell array specify signals BSR and BSL specify memory cell arrays 611R and 611L, respectively. Main sense amplifier drive signal MSE is activated according to sense amplifier activation trigger signal SOE and a bank specify signal. Main sense amplifier drive signal MSE is rendered active in response to sense amplifier activation trigger signal SOE at only the selected bank. Main sense amplifier drive signal MSE may drive the sense amplifiers corresponding to the selected memory cell array according to the memory cell array specify signal. Bit line isolation control signal BLIL is output from tristate buffer 452. Bit line isolation control signal BLIR is generated from tristate buffer 455. Sense amplifier drive signal SE is output from tristate buffer 453. Sense amplifier drive signal SE1 is output from tristate buffer 454. Tristate buffers 452, 454 and 455 operate using boosted voltage Vpp as one operating power supply voltage. Tristate buffer 453 operates using power supply voltage Vcc as one operating power supply voltage.

Shorting circuit 450 further includes a pulse generation circuit 451 generating a one shot pulse signal in response to activation of main sense amplifier drive signal MSE, inverters 452I, 453I, 454I and 455I setting tristate buffers 452, 453, 454 and 455, respectively, to an output high impedance state according to the pulse signal from one shot pulse generation circuit 451, an AND circuit 459L receiving the pulse signal output from pulse generation circuit 451 and memory cell array specify signal BSL, an AND circuit 459R receiving the pulse signal output from pulse generation circuit 451 and memory cell array specify signal BSR a switch circuit 456 rendered conductive, when the output signal of AND circuit 459 L is at an H level, to short the outputs of tristate buffers 452 and 453, a switch circuit 457 shorting the outputs of tristate buffers 453 and 454 according to the pulse signal output from pulse generation circuit 451, and a switch circuit 458 rendered conductive when the output signal of AND circuit 459R is at an H level, to short the outputs of tristate buffers 454 and 455. Switch circuits 456, 457 and 458 set the corresponding signals to the same voltage level when conducting.

Figure 21:
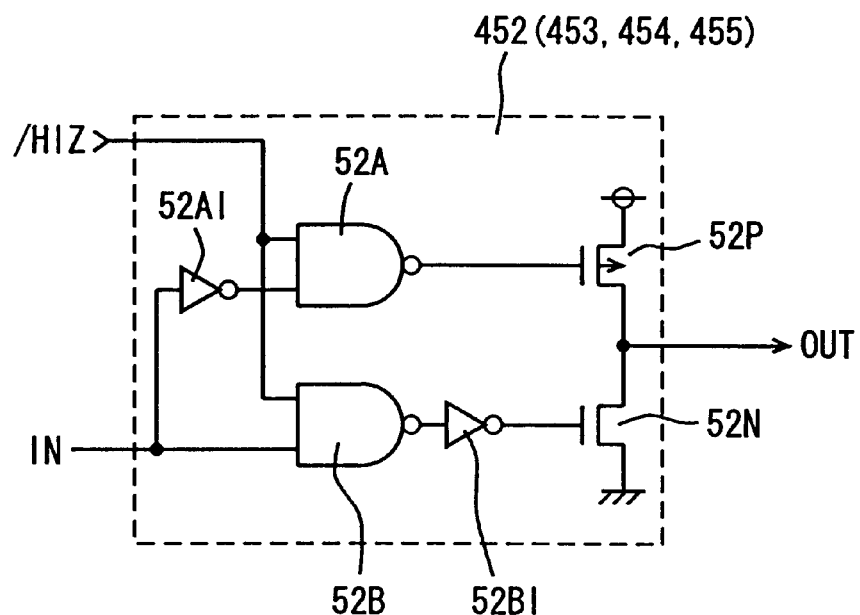
FIG. 21 shows a structure of a tristate buffer of FIG. 20.

FIG. 21 shows a structure of tristate buffers 452–455 shown in FIG. 20. Since each of tristate buffers 452–455 has the same structure, tristate buffer 452 is shown representatively in FIG. 21. Referring to FIG. 21, tristate buffer 452 (453, 454, 455) includes an inverter 52AI receiving an input signal IN, a NAND circuit 52A receiving the output signal of inverter 52AI and an output control signal /HIZ, a NAND circuit 52B receiving output control signal /HIZ and input signal IN, an inverter 52BI receiving the output signal of NAND circuit 52B, a p channel MOS transistor 52P rendered conductive, when the output signal of NAND circuit 52A is at an L level, to drive an output signal OUT to the voltage level (boosted voltage Vpp) of the power supply node, and an n channel MOS transistor 52N rendered conductive, when the output of inverter 52BI is at an H level, to discharge output signal OUT to the level of the ground voltage.

Output control signal /HIZ is output from the inverter receiving the pulse signal output from pulse generation circuit 451. For tristate buffer 452, output control signal /HIZ is output from inverter 452I. Input signal IN is applied to each tristate buffer, and is memory cell array specify signals BSR and BSL for tristate buffers 452 and 455, and the output signal of inverter 451I for tristate buffers 453 and 454. The power supply voltage applied to the source of p channel MOS transistor 52P is boosted voltage Vpp or power supply voltage Vcc. The operation of the fourth embodiment shown in FIGS. 19–21 will be described with reference to the signal waveform diagram of FIG. 22.

A row access command is applied, and memory cell array 611L is specified. In this case, memory cell array specify signal BSR maintains the L level whereas memory cell array specify signal BSL is pulled up to an H level. In shorting circuit 450 of FIG. 20, bit line isolation control signal BLIL output from tristate buffer 452 maintains the level of boosted voltage Vpp whereas bit line isolation control signal BLIR is pulled down to an L level at time T30.

Then, a word line select operation is carried out in memory cell array 611L. The voltage level of selected word line WL0L is boosted to the level of boosted voltage Vpp (time T31).

The data of a memory cell MC connected to this selected word line WL0L is transmitted to common bit lines BL, /BL (BL0, /BL0) via corresponding bit lines. When the voltage levels of common bit lines BL0 and /BL0 are changed sufficiently, main sense drive signal MSE is activated at time T32. In response to activation of main sense amplifier drive signal MSE, pulse generation circuit 451 generates a one shot (pulse width T3) pulse signal. In response to activation of main sense drive signal MSE, the output signal of inverter 451I is pulled down to an L level. The output signals of inverters 452I–455I are driven to an L level according to the pulse signal generated by pulse generation circuit 451, whereby tristate buffers 452–455 attain the output high impedance state. This is realized by output control signal HIZ at an L level, the output signal of NAND circuit 52A at an H level, the output signal of inverter 52BI at an L level, and MOS transistors 52P and 52N both rendered nonconductive.

According to the pulse signal from pulse generation circuit 451, the output signal of AND circuit 459L is driven to an H level whereby switch circuit 456 conducts. Also, switch circuit 457 conducts according to the pulse signal output from pulse generation circuit 451. Since memory cell array specify signal BSR is at an L level, the output signal of AND circuit 459R is at an L level and switch circuit 458 maintains the nonconductive state. Since tristate buffers 452–454 are at the output high impedance state, signals BLIL, SE and SE1 are equalized to the same voltage level. More specifically, bit line isolation control signal BSIL at the level of boosted voltage Vpp is lowered, whereas the voltage level of sense amplifier drive signals SE and SE1 are increased from the level of the ground voltage. The level of equalize voltage Vref4 of signals BLIL, SE and SE1 is determined according to the ratio of the load capacitance of these signal lines and the voltage level of these signals prior to generation of a pulse from pulse generation circuit 451. This intermediate voltage Vref4 satisfies the relationship of Vss<Vref4<Vpp.

When the voltage level of bit line isolation control signal BLIR is pulled down, the ON resistance of tristate buffers 612L1 and 612L2 included in select gate 612L of FIG. 19 increases. The bit line of memory cell array 611L is therefore electrically disconnected from the common bit line, so that the load of sense amplifier 614SA is reduced. Since the voltage level of sense amplifier drive signals SE and SE1 rises simultaneous to the voltage drop of bit line isolation control signal BLIL, sense amplifier 614SA initiates a sensing operation. Although the voltage levels of sense amplifier drive signals SE and SE1 are low, a sensing operation is executed at a relatively high speed since the load of sense amplifier 614SA is small.

When the pulse signal output from pulse generation circuit 451 attains an L level at time T33, the output signal of AND circuit 459L is pulled down to an L level. Switch circuit 456 is rendered nonconductive. Also, switch circuit 457 is rendered conductive (the pulse signal output from pulse generation circuit 451 is at an L level). Simultaneously, the output signals of inverters 452I and 455I attain an H level to return tristate buffers 452–455 to the operative state from the output high impedance state. Since the output signal of inverter 451I is at an L level, sense amplifier drive signals SE and SE1 output from tristate buffers 453 and 454 rises to the level of power supply voltage Vcc and boosted voltage Vpp, respectively. Also, bit line isolation control signal BLIL returns to the level of boosted voltage Vpp.

At time T34, sense amplifier 614SA carries out a sensing operation speedily. Each bit line of memory cell array 611L is driven at high speed via select gate 612L attaining a low ON resistance state. Thus, the sensing operation of the sense amplifier is completed.

According to the fourth embodiment of the present invention, a sensing operation is initiated with the select gate for bit line isolation initially set at a high ON resistance state. When the voltage level of common bit lines is increased sufficiently, the select gate for bit line isolation is set to a low ON resistance state to carry out a sensing operation speedily. Therefore, the drive load of the sense amplifier can be reduced when a sensing operation is initiated. A sensing operation can be carried out speedily.

Furthermore, since the select gate for bit line isolation is set to a high ON resistance state simply by equalizing the bit line isolation control signal and the sense amplifier drive signal, complicated timing control is not required.

Fifth Embodiment

Figure 23:
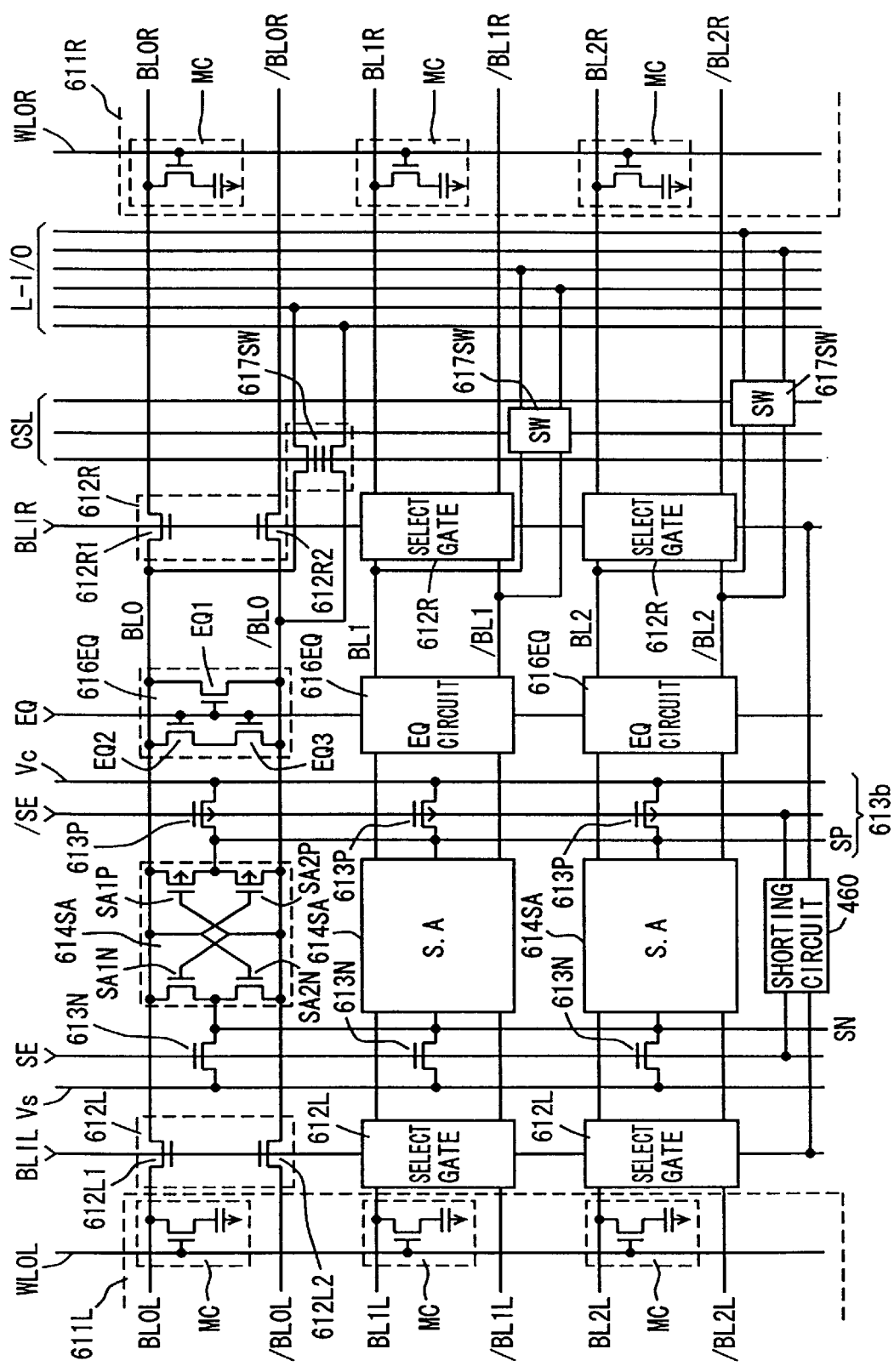
FIG. 23 shows a structure of the sense amplifier peripheral circuitry of an SDRAM according to a fifth embodiment of the present invention.

FIG. 23 shows a structure of a main part of a semiconductor memory device according to a fifth embodiment of the present invention. Referring to FIG. 23, a p channel MOS transistor 613P is arranged as a sense amplifier drive transistor corresponding to each sense amplifier 614SA in sense amplifier drive band 613b. Also, a shorting circuit 460 selectively shorts sense amplifier drive signals SE and /SE and bit line isolation control signals BLIL and BLIR. Since sense amplifier drive signal /SE differs in logic from sense amplifier drive signal SE1, the structure of shorting circuit 460 differs. The structure of the remaining components is similar to that shown in FIG. 19, and corresponding components have the same reference characters allotted, and detailed description thereof will not be repeated.

Figure 24:
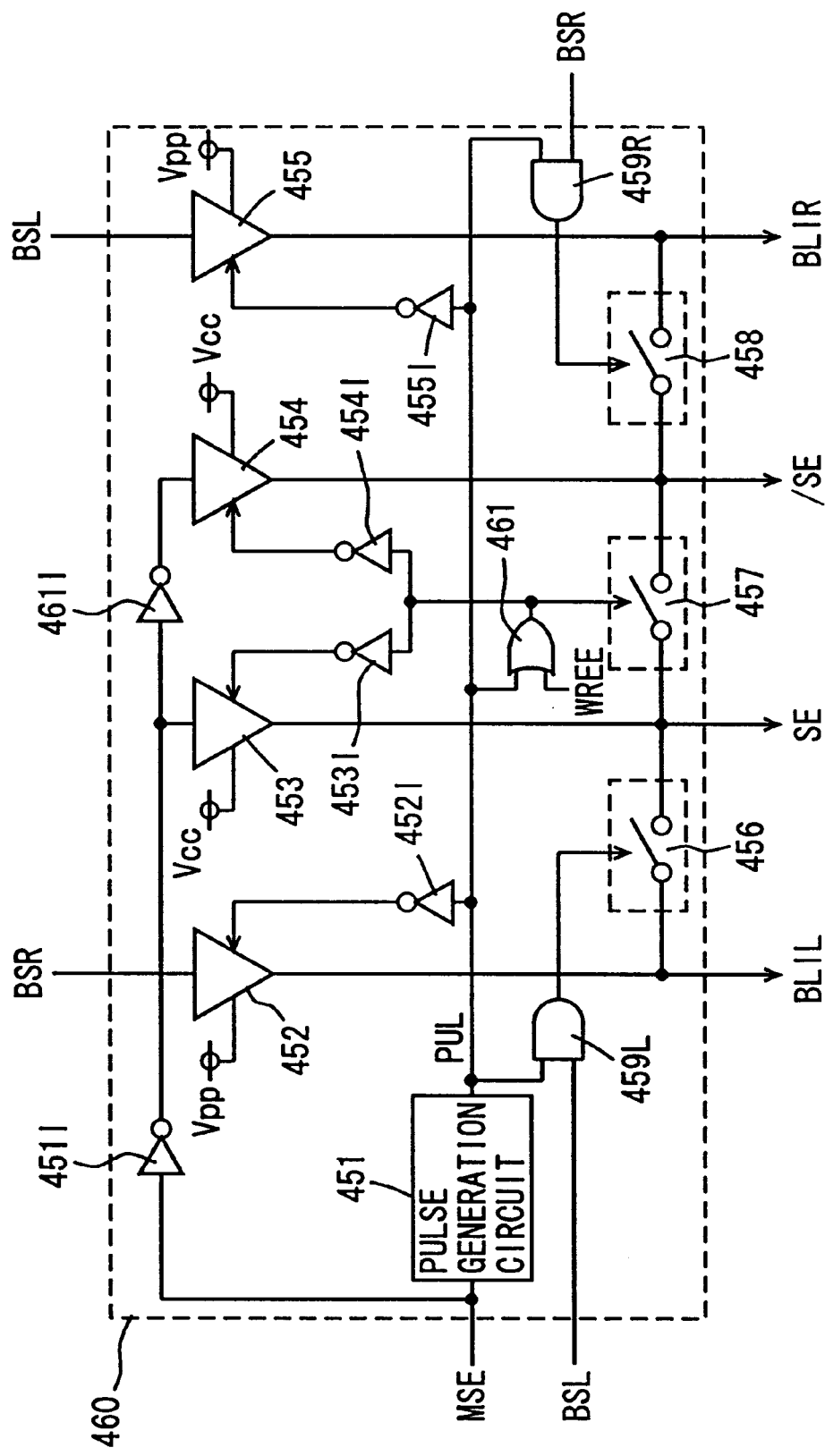
FIG. 24 shows a structure of a shorting circuit of FIG. 23.

FIG. 24 shows a structure of shorting circuit 460 of FIG. 23. According to the structure of FIG. 24, main sense amplifier drive signal MSE is applied to tristate buffer 454 to inverters 451I and 461I. Also, the output signal of an OR circuit 461 receiving a pulse signal PUL output from pulse generation circuit 451 and a write sense control signal WREE activated for a predetermined time in a write operation is applied to inverters 453I and 454I controlling the output states of tristate buffers 453 and 454. The output signal of OR circuit 461 is also applied to switch circuit 457. When switch circuit 457 conducts, sense amplifier drive signals SE and /SE are equalized. The remaining structure of shorting circuit 460 is similar to that shown in FIG. 20, and corresponding components have the same reference characters allotted, and detailed description thereof will not be repeated.

Figure 25A:
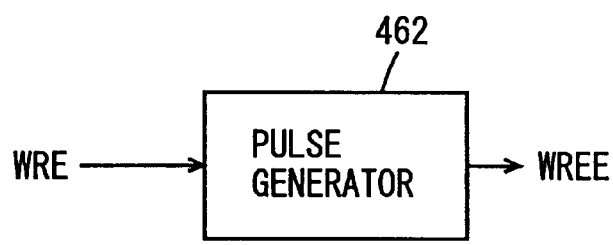
FIG. 25A schematically shows a structure of the section generating the write operation trigger signal of FIG. 24.
Figure 25B:
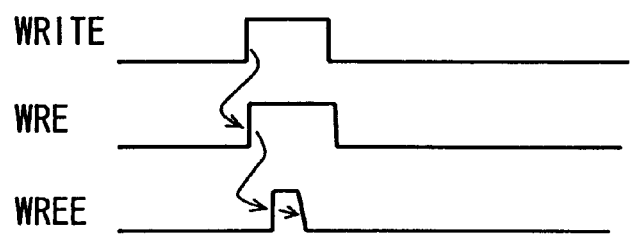
FIG. 25B is a waveform diagram representing an operation of the pulse generation circuit of FIG. 25A.
Figure 26:
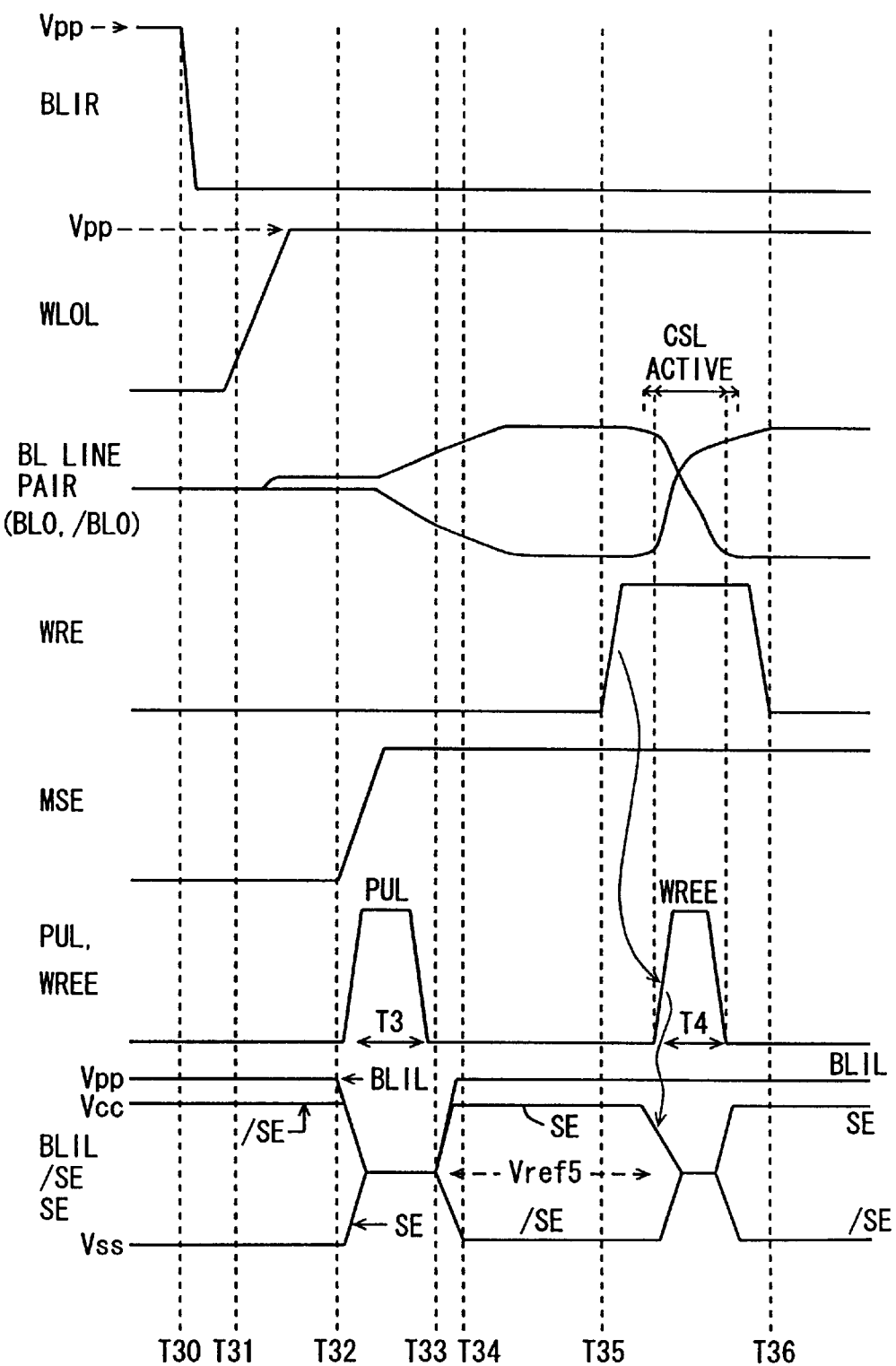
FIG. 26 is a timing chart representing an operation of the sense amplifier peripheral circuitry of the SDRAM of FIG. 23.

FIG. 25A shows a structure of the portion generating write sense control signal WREE. Write sense control signal WREE responds to write operation activation signal WRE to be driven to an active state of an H level for a predetermined time by pulse generation circuit 462. As shown in FIG. 25B, write operation trigger signal WRITE is rendered active when a write command instructing data writing is applied. In response, write operation activation signal WRE is driven to an active state in the selected bank. In response to activation of write operation activation signal WRE, write sense control signal WREE is driven to an active state. The operation of the structure shown in FIGS. 23 and 24 will be described with reference to the signal waveform diagram of FIG. 26.

When a row access command is applied and memory cell array 611L is specified, memory cell array specify signal BSL is pulled up to an H level. Bit line isolation control signal BLIR is pulled down from the level of boosted voltage Vpp to the level of the ground voltage. As a result, sense amplifier band 614 is isolated from memory cell array 611R.

In memory cell array 611L, a word line select operation is carried out at time T31 and the voltage level of selected word line WL0L rises. The data of the memory cell connected to the selected word line is transmitted to the common bit line pair from each bit line pair of memory cell array 611L through select gate 612L.

At time T32, main sense amplifier drive signal MSE is driven to an active state of an H level. In response, a one shot pulse signal PUL is generated from pulse generation circuit 451. In response to activation (H level) of main sense amplifier drive signal MSE, the output signal of inverter 451I is pulled down whereas the output signal of inverter 461I is driven to an H level. According to pulse signal PUL from pulse generation circuit 451, the output signal of AND circuit 459L is pulled up to an H level from an L level. Responsively, the output signal of OR circuit 461 is pulled up to an H level while the output signal of inverter 452I is pulled down to an L level. Therefore, all of tristate buffers 452–455 attain an output high impedance state. Switch circuits 456 and 457 conduct, whereby signals BLIL, SE and /SE are equalized. Therefore, bit line isolation control signal BLIL at the level of boosted voltage Vpp and sense amplifier drive signal /SE at the level of power supply voltage Vcc become lower, while the voltage level of sense amplifier drive signal SE becomes higher. Equalize voltage Vref5 of signals SE, /SE and BLIL is determined depending upon the load capacitance of the signal line through which these signals are transmitted and the voltage levels of these signals prior to generation of a pulse signal. Relationship of Vss<Vref5<Vpp is satisfied.

At time T32, the voltage level of sense amplifier drive signal SE rises whereas the voltage level of sense amplifier drive signal /SE becomes lower. Sense amplifier 614SA initiates a sensing operation. Since the voltage level of bit line isolation control signal BLIL is lowered, the ON resistance of select gate 612L is increased. The load of driving sense amplifier 614 is alleviated, so that a sensing operation can be carried out at a relatively high speed.

At time T33, the fall of pulse signal PUL to an L level causes the output signals of AND circuit 459L and OR circuit 461 to be driven to an L level. Switch circuits 456 and 457 are rendered nonconductive. Also, the output signals of inverters 452I–455I attain an H level, and tristate buffers 452–455 attain an operable state. Sense amplifier drive signal /SE is driven to the level of the ground voltage whereas sense amplifier drive signal SE is driven to the level of power supply voltage Vcc. Also, bit line isolation control signal BLIL returns to the original level of boosted voltage Vpp, and select gate 612L enters a low ON resistance state. Sense amplifier 614SA drives each respective bit line of memory cell 611L from the common bit line through select gate 612L according to the sense amplifier drive signal. Therefore, a restore operation to a memory cell is carried out.

At time T35, write operation activation signal WRE is rendered active according to a write command, and write data is transmitted onto local data bus L-I/O. In response to activation of write operation activation signal WRE, write sense control signal WREE is driven to and kept at an L level for a predetermined time of T4. In response to activation of write sense activation signal WREE, the output signal of OR circuit 461 rises to an H level and tristate buffers 453 and 454 attain the output high impedance state. Sense amplifier drive signals SE and /SE are equalized by switch circuit 457. Therefore, sense amplifier 614SA has its latching capability (current supply capability) reduced as the ON resistance of corresponding sense amplifier drive transistors 613P and 613N is increased, and the latch voltage changes speedily according to the write data. Here, activation timing of write sense control signal WREE is to be substantially equal to the activation timing of column select signal CSL. Accordingly, the latched data at sense amplifier can be altered speedily according to the write data.

When write sense control signal WREE is rendered inactive, tristate buffers 453 and 454 attain an operable state again while switch circuit 457 is rendered nonconductive. Sense drive signals SE and /SE are driven to an H level and an L level, respectively. As a result, sense amplifier 614SA reliably latches the write data of the level of power supply voltage Vcc and ground voltage to write the data into a corresponding memory cell.

In the write operation, the voltage levels of sense amplifier drive signals SE and /SE are changed to reduce the drivability (latching capability) of the sense amplifier. Therefore, the latched data can be altered according to the write data speedily, and, the write operation can be speeded.

Bit line isolation control signal BL1R attains a high impedance state when pulse signal PUL is rendered active. However, the activation period of pulse signal PUL is short enough so that the high impedance state of bit line isolation control signal BSIR will not affect the ON resistance of select gate 612R. (Even if the voltage level of bit line isolation control signal BSIR is slightly increased, the ON resistance of select gate 612R is large enough and sense amplifier 614SA is electrically disconnected from each bit line of memory cell array 611R).

Sixth Embodiment

FIG. 27 schematically shows an entire structure of a semiconductor memory device according to a sixth embodiment of the present invention. The semiconductor memory device of FIG. 27 includes a logic carrying out a logical operation, and a logic merged memory with the memory array storing data required for logic integrated on the same chip.

Referring to FIG. 27, logic merged memory 2000 includes a DRAM section 2001 including a plurality of dynamic memory cells and functioning as a main memory for the logic, a video buffer 202 to output in series data stored in DRAM section 2001 outside the chip, an SRAM buffer 2001 to send/receive data to/from DRAM section 2001 and providing the data outside the chip, an arithmetic logic circuit (ALU) 2004 receiving data applied from SRAM buffer 2003 and externally applied data to carry out an operational process and writing the resultant data to SRAM buffer 2003, and an internal operation control circuit 2005 to control the internal operation of logic merged memory 2000.

SRAM buffer 2003 outputs 32-bit data SQ0–SQ31 of addressed memory cells according to address signal bits A0–An applied to address input terminals 2104. Video buffer 2002 receives the image process data stored in DRAM section 2001 to sequentially provide 16-bit image data VQ0–VQ15, for example, in raster scan sequence, according to the operating rate of an external image processor.

Internal operation control circuit 2005 includes a DRAM controller 2007 receiving externally applied various control signals /R, /C, /W, . . . to generate a control signal to control the operation of DRAM section 2001, a SRAM/ALU controller 2008 mainly generating a signal to control the operation of SRAM buffer 2003 and ALU 2004, and a video controller 2006 to control the operation of video buffer 2002.

Logic merged memory 2000 operates in synchronization with external clock signal extCLK applied to clock input terminal 2101. Various control signals /R, /C, /W, . . . are applied to internal operation control circuit 2005 via control signal input terminals 2102. The addressing of DRAM section 2001 and SRAM buffer 2003 is effected by address signal bits A0–An applied through address input terminals 2104. SRAM buffer 2003 provides 32-bit data SQ0–SQ31 through data output terminals 2105s. Video buffer 2002 provides 16-bit data VQ0–VQ15 via data output terminals 2105v. For the determination of the H/L level of external address signal bits A0–An, control signal /R and external clock signal extCLK, reference voltage Vref applied via reference voltage input terminal 2103 is used. Respective buffer circuits provided for these terminals are not depicted in FIG. 27.

Figure 28:
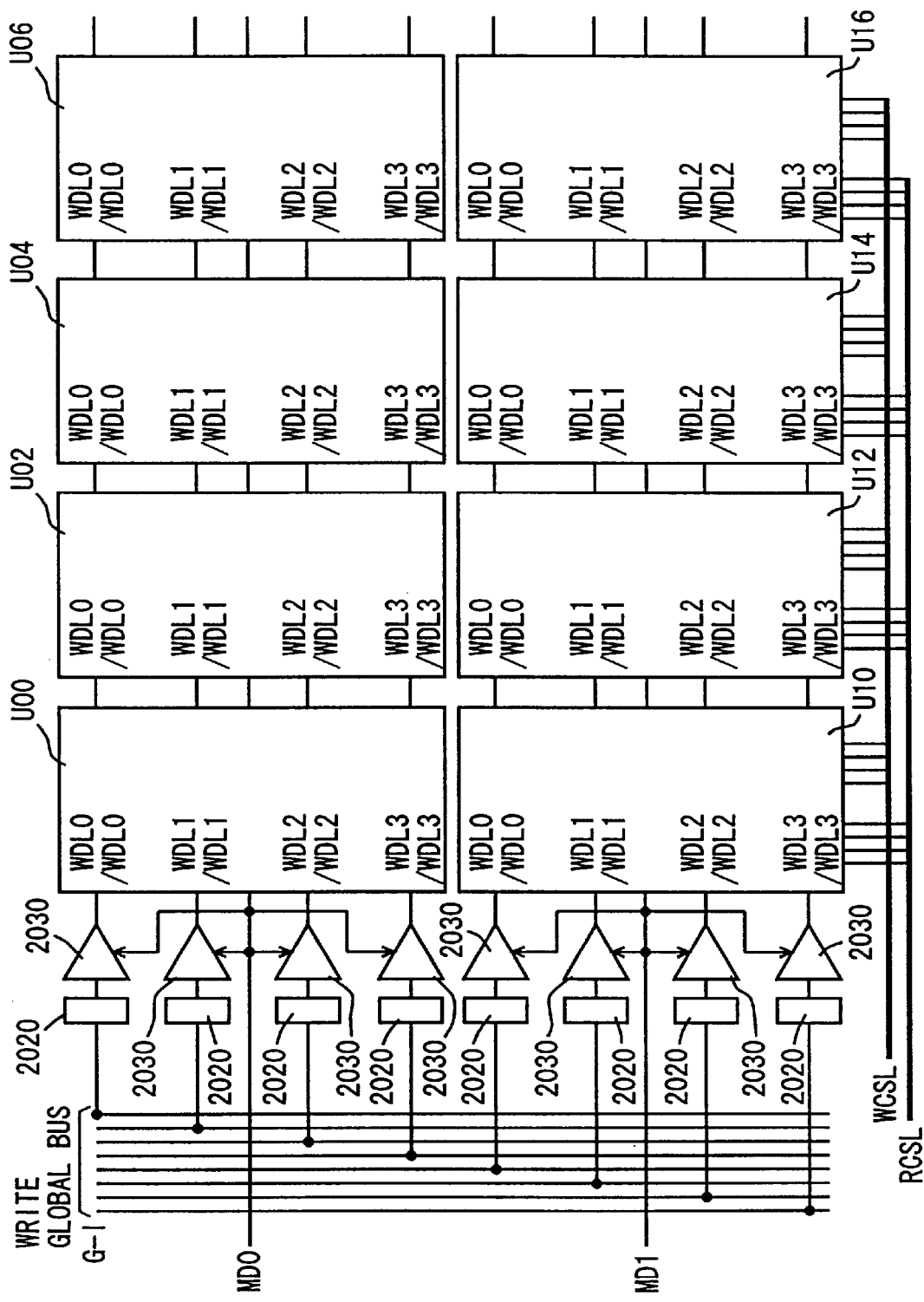
FIG. 28 schematically shows a structure of the DRAM section of FIG. 27.

FIG. 28 schematically shows a structure of a memory unit of DRAM section 2001 of FIG. 27. The data line structure of the memory unit shown in FIG. 28 has the separated I/O structure in which the read data bus transmitting read out data and the write data bus transmitting write data are provided individually. In FIG. 28, a write global bus G-I transmitting write data is shown. According to the separated I/O structure, there are provided separately a column select line RCSL transmitting a read out column select signal to select a read out column select gate for reading out data and a write select line WCSL transmitting a write column select signal specifying a write column select gate to write data.

The memory unit includes memory units U00, U02, U04, U06, U10, U12, U14 and U16 each having a plurality of memory cells arranged in a matrix, a data retain circuit 2020 coupled to different bus lines of write global bus G-I to latch data on corresponding bus lines, and a write driver 2030 provided corresponding to data retain circuit 2020 to transmit write data to memory units. Write driver 2030 is set to an output high impedance state according to write mask data MD0 and MD1. Mask data MD0 masks data writing for memory units U00, U02, U04 and U06. Mask data MD1 masks data writing for memory units U10, U12, U14 and U16. Each of memory units U00–U16 is coupled to 4-bit write data buses WDL0, /WDL0–WDL3, /WDL3. Write data from a common write driver is transmitted through the write data bus to memory units U00, U02, U04, and U06. Write data from another common write driver is transmitted to memory units U10, U12, U14 and U16.

FIG. 29 shows a structure of the section related to the sense amplifier of memory unit U02 of FIG. 28. As shown in FIG. 29, sense amplifiers 14SA of sense amplifier band 614 are arranged corresponding to alternate bit line pairs of memory units U02 and U04. More specifically, sense amplifier 14SA is arranged in an alternately arranged type shared sense amplifier structure. Referring to FIG. 29, right bit lines BLiR, /BLiR of memory unit U02 are coupled to a sense amplifier not shown. Similarly, bit lines BLiL, /BLiL are coupled to a sense amplifier not shown in memory unit U04. Select gate band 612a includes a select gate 12L arranged corresponding to alternate bit line pairs BL0L, /BL0L, BL1L, /BL1L.

In sense amplifier drive band 613a, there is arranged a sense amplifier drive transistor 14N corresponding to each sense amplifier 14SA, rendered conductive in response to activation of sense amplifier drive signal SE to couple a power supply line Vs to a corresponding sense amplifier 14SA. In sense amplifier drive band 613b, there is arranged a sense amplifier drive transistor 13P corresponding to each sense amplifier 14SA, rendered conductive in response to activation of sense amplifier drive signal ISE to couple a corresponding sense amplifier to power supply line Vc.

Parallel to the bit line, read data lines RDL0, /RDL0 to transfer read data and write data lines WDL0, /WDL0 and WDL1 to transmit write data are arranged. Data lines WDLi, /WDLi and RDLi, /RDLi are arranged at an upper layer than sense amplifier 14SA, and extends over a plurality of memory units in the column direction crossing sense amplifier 14SA.

A pair of read data lines and a pair of write data lines are arranged alternately. In FIG. 29, read data lines RDL0 and /RDL0 are arranged adjacent to each other. Then, write data lines /WDL0 and WDL1 are arranged adjacently. Write data line WDL0 is arranged to be opposite to write data line /WDL0 with respect to read data lines RDL0 and /RDL0.

In interconnection band 617, a read column select switch 17SWR is arranged corresponding to each of common bit lines BLi and /BLi, rendered conductive in response to the signal read out on read column select line RCSL to connect a corresponding common bit line pair with read data line pair RDL0, /RDL0. Read column select line RCSL transmits a signal of 4 bits, whereby one of the four adjacent read column select gates 17SWR is rendered conductive. More specifically, one bit line pair of four bit line pairs is selected and coupled to a corresponding read data line pair. Read data lines of four bits are arranged for one memory unit. Therefore, memory cells of 16 bits are arranged in one memory unit. FIG. 28 shows the memory unit provided corresponding to an even number bit line pair. A sense amplifier and a read column select gate are arranged in a similar manner for the memory unit of an odd number bit line pair.

In interconnection line band 617 there is further arranged a write column select gate 17SWW corresponding to common bit lines BLi and /BLi, and rendered conductive in response to the write column select signal on write column select line WCSL to connect corresponding common bit lines BLi and /BLi with write data line pair WDL0, /WDL0. Four common bit lines are arranged for one write data bus in the write gate. One common bit line pair out of the four common bit line pairs (sense amplifier) is selected and connected to a write data line pair.

In select gate band 613b, a select gate 12R provided corresponding to common bit lines BLi and /BLi, and selectively rendered conductive according to bit line isolation control signal BLR is arranged.

Since the alternately arranged shared sense amplifier structure is employed, sense amplifiers are arranged alternately at both sides in the column direction for the selected memory unit, corresponding sense amplifiers are activated. In FIG. 28, only the structure related to the sense amplifier band arranged at one side is shown. Therefore, the write data bus and the read data bus are each 8 bits in each memory unit.

As to the memory unit with the separated I/O structure of the sixth embodiment shown in FIG. 29, the gate voltage of sense amplifier drive transistor 13N provided corresponding to the N source node of sense amplifier 14SA is set lower in the write operation than in the read operation. Accordingly, the ON resistance of sense amplifier drive transistor 13N is increased and the drivability of sense amplifier 14SA is set lower in the write operation than in the read operation. The latched data at the selected sense amplifier can be changed at high speed according to the write data. Thus, the write operation can be speeded.

I/O bus has to be precharged upon transition from a writing operation to a reading operation and the cycle time cannot be shortened. The separated I/O structure is employed for solving such a problem. By virtue of the separated I/O structure, the cycle time can be reduced because there is not need of taking into account the so-called write recovery (the time required for the internal data bus voltage to be recovered to the precharge voltage level from write data) for the cycle time. However, by speeding data writing for a sense amplifier in the data writing operation, the write cycle time can be reduced and the transition from a write cycle to a read cycle can be further speeded.

In the arrangement of the memory unit shown in FIG. 29, the structure of reducing the voltage level of sense amplifier drive signal SE in the data write operation can be implemented by the structure of the previous first, fourth and fifth embodiments.

Seventh Embodiment

FIG. 30 shows the structure of a main part of a semiconductor memory device according to a seventh embodiment of the present invention. In the structure of FIG. 30, one set of the bit line pairs of alternate pairs is not shown. Only the bit line pair connected to sense amplifier 14SA is shown. The arrangement of FIG. 30 differs from the arrangement shown in FIG. 29 in the following points. Two sense amplifiers 14SA adjacent to each other are taken as one set. A P source node PSD and an N source node NSD are each connected in common to each set of sense amplifiers. At each set of sense amplifiers 14SA, one sense amplifier drive transistor 13P and one sense amplifier drive transistor 13N are arranged. Sense amplifier drive signals /SE and SE are applied to the respective gates of sense amplifier drive transistors 13P and 13N. The remaining structure is identical to that shown in FIG. 29. The number of sense amplifier drive transistors 13P and 13N arranged at sense amplifier drive bands 613a and 613b is reduced to half.

Layout of high density is made according to extremely severe design rules in the proximity of the sense amplifiers. Although the severe rule is alleviated since one sense amplifier is provided for two bit line pairs, column select gates 17SWR and 17SWW must be arranged at the periphery. Also, the occupying area between the memory units must be made as small as possible. Therefore, by reducing the number of sense amplifier drive transistors, can be arranged the sense amplifier drive transistors in drive bands 613a and 613b with margin. The fabrication yield can be improved due to little influence of mask misalignment in a fabrication step.

Eighth Embodiment

FIG. 31 shows the structure of a main part of the semiconductor memory device according to an eighth embodiment of the present invention. The difference in the structure of FIG. 31 from the structure of FIG. 30 is as follows. P source nodes PSD as well as N source nodes NSD are connected in common in a unit of four adjacent sense amplifiers 14SA. One sense amplifier drive transistor 13P is provided for the P source nodes PSD connected in common. Also one sense amplifier drive transistor 13N is provided for the common N source node. The remaining structure is similar to that shown in FIG. 30.

Read column select signal line RCSL and write column select line WCSL each transmit the select signals of 4 bits. One of the 4 bits of column select lines is selected and driven to an active state. Four read column select switches 17SWR form one set. In this set, one read column select switch is driven to a selected state. Similarly, four adjacent select switches form one set in write select switch 17SWW. In this set, one column select switch is driven to a select state. More specifically, one of four adjacent sense amplifiers 14SA is selected to be connected to a write data line or a read data line. By arranging one sense amplifier drive transistor 13P and one sense amplifier drive transistor 13N for the set of four adjacent sense amplifiers, data is written or read in each set. The drivability of the sense amplifier to which data is written can be reduced in the data writing operation to speed up the writing operation. High speed writing can be implemented reliably by the minimum necessary number of sense amplifier drive transistors. The sense amplifier drive transistor in sense amplifier drive bands 613A and 613B can be arranged with margin to increase the fabrication yield.

Ninth Embodiment

Figure 32:
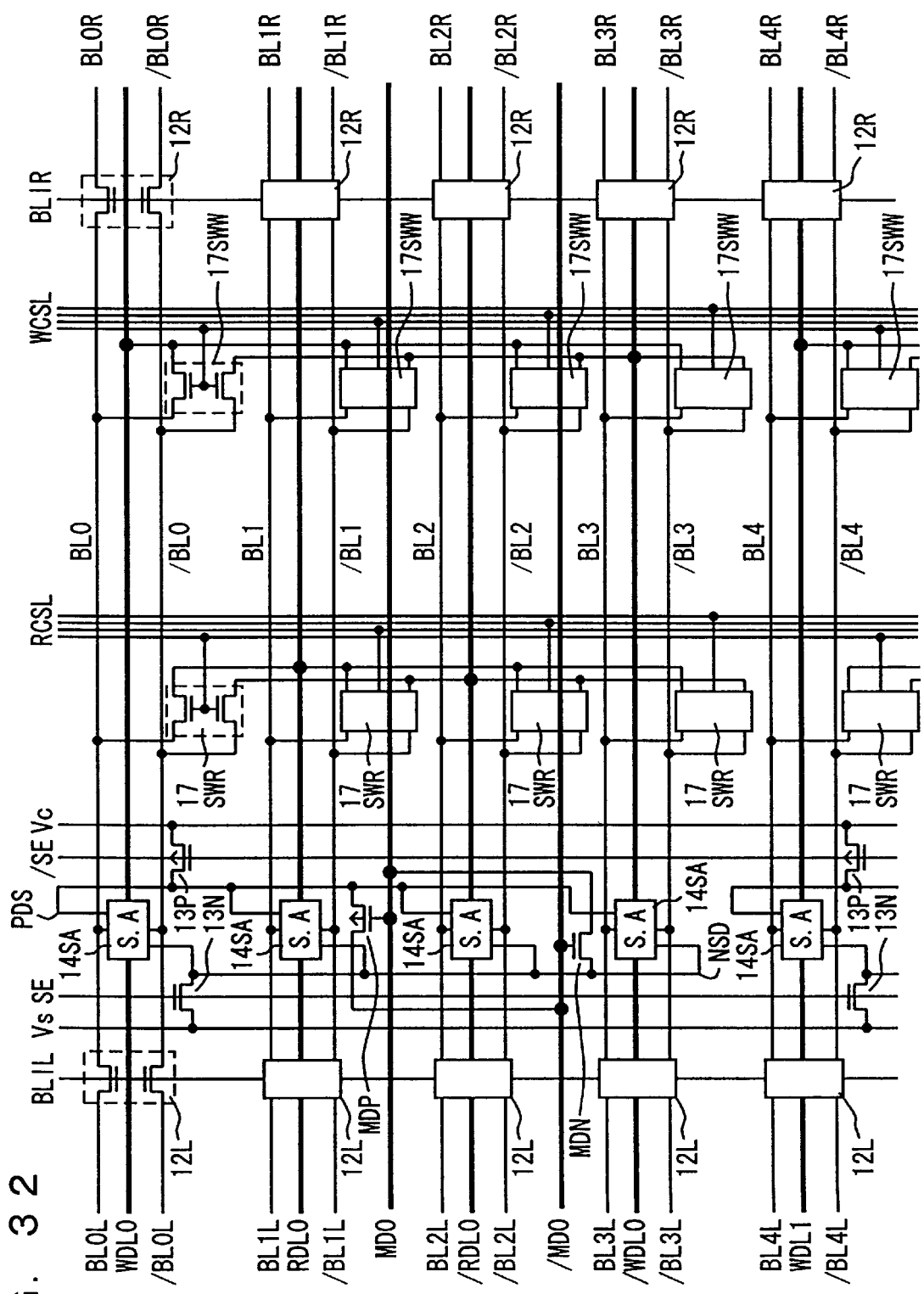

FIG. 32 shows a structure of a main part of a semiconductor memory device according to a ninth embodiment of the present invention. In the structure of FIG. 32, a signal line transmitting mask designating signals MD0 and /MD0 to mask data writing is arranged between and in parallel with write data lines WDL0 and /WDL0. Write mask designating signals MD0 and /MD0 apply a mask on writing in a unit of 4 bits.

P source nodes PSD of one set of four adjacent sense amplifiers 14SA are connected in common. Also, N source nodes NSD of the same set of sense amplifiers 14SA are connected in common. One sense amplifier drive transistor 14P and one sense amplifier drive transistor 13N are arranged for each set of the sense amplifiers.

Furthermore, a p channel MOS transistor MDP rendered conductive, when write mask designating signal MD0 is at an L level, to connect P source node PSD to the signal line transmitting complementary write mask designating signal /MD0 and an n channel MOS transistor MND rendered conductive, when mask designating signal /MD0 is at an H level, to connect N source node NSD to the signal line transmitting write mask designating signal MD0 are connected for each set of sense amplifiers 14SA. The remaining structure is similar to that of FIG. 31.

Mask designating signal MD0 is set at an L level when data writing is to be masked, and set at an H level when writing is permitted. The write operation activation signal is rendered active even when a mask is applied in data writing. Therefore, sense amplifier drive signals SE and/or /SE have their voltage level changed. The drivability of the sense amplifier that has data writing masked is increased to retain the latched data in the sense amplifier stably. More specifically, when data writing is masked, write mask designating signal MD0 attains an L level. MOS transistor MDP is rendered conductive, whereby P source node PSD is coupled to the signal line transmitting complementary write designating signal /MD0 of an H level (level of power supply voltage Vcc). Also, MOS transistor MDN conducts. Write mask designating signal MD0 of the ground voltage level is transmitted to N source node NSD. Therefore, even when the ON resistance of sense amplifier drive transistor 13P and/or 13N increases, sense amplifier 14SA is connected to power supply lines Vs and Vc with a small ON resistance by MOS transistors MDP and MDN. Memory cell data is retained stably by a great latchability.

Although not explicitly shown in FIG. 32, mask data MD0 and MD1 are applied to the upper memory units and the lower memory units, respectively, shown in FIG. 28. Therefore, the signal lines transmitting write mask designating signals MD0 and /MD0 are arranged corresponding to each set of write data lines WDL1 and /WDL1, . . . , WDL3 and /WDL3 in the structure of FIG. 32. In other words, signal lines transmitting mask designating signals MD0 and /MD0 are arranged for each set of sense amplifiers 14SA. The signal lines transmitting write mask designating signals MD0 and /MD0 can be arranged with margin at the same layer as write data line WDL0 and read data line RDL0, upper than the sense amplifier 14SA.

Figure 33:
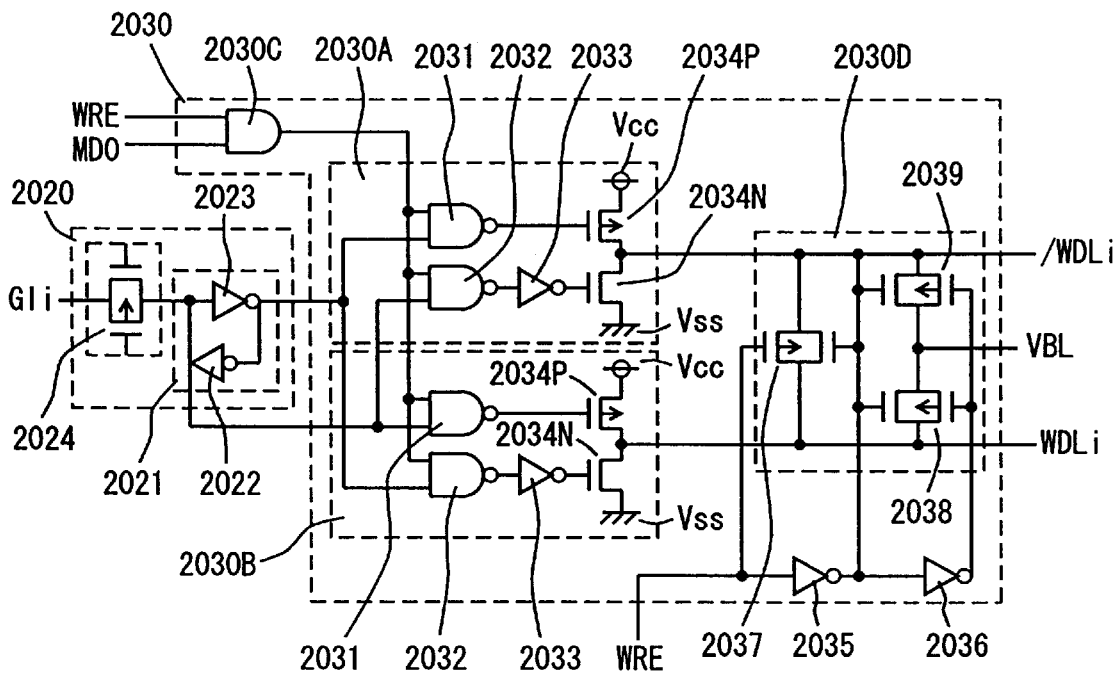
FIG. 33 shows a structure of a retain circuit and a write driver of FIG. 28.

FIG. 33 shows the structure of retain circuit 2020 and write driver 2030 shown in FIG. 28. Referring to FIG. 33, retain circuit 2020 includes a transmission gate 2024 rendered conductive according to a write designating signal not shown to transmit the signal on a global data bus line GIi, and a latch circuit 2021 retaining the write data applied via transmission gate 2024. Latch circuit 2021 includes inverters 2022 and 2023 to form the so-called inverter latch.

Write driver 2030 includes a drive circuit 2030A to drive a complementary write local bus line /WDLi according to the write data held by retain circuit 2020, a drive circuit 2030B driving write local bus line WDLi according to the write data held in retain circuit 2020, an AND circuit 2030C receiving write operation activation signal WRE and write mask designating signal MD0 to activate write drive circuits 2030A and 2030B, and a precharge/equalize circuit 2030D precharging and equalizing write local bus lines WDLi and /WDLi to the level of a bit line precharge voltage VBL in response to write operation activation signal WRE.

Drive circuit 2030A includes a NAND circuit 2031 receiving the output signal of AND circuit 2030C and the output signal of inverter 2023 in latch circuit 2021, a NAND circuit 2032 receiving the output signal of AND circuit 2030C and the output signal inverter 2022, an inverter 2033 inverting the output signal of NAND circuit 2032, a p channel MOS transistor 2034P rendered conductive, when the output signal of NAND circuit 2031 is at an L level, to transmit power supply voltage Vcc to write local bus line /WDLi, and an n channel MOS transistor 2034N rendered conductive, when the output signal of inverter 2033 is at an L level, to drive write local bus line /WDLi to the level of ground voltage Vss.

Drive circuit 2030B has a structure identical to that of drive circuit 2030A. Data complementary to the data for drive circuit 2030A is applied from latch circuit 2021 to drive circuit 2030B. Therefore, complementary write data are generated from drive circuits 2030A and 2030B to be transmitted on write local bus lines /WDLi and WDLi, respectively.

Figure 34:
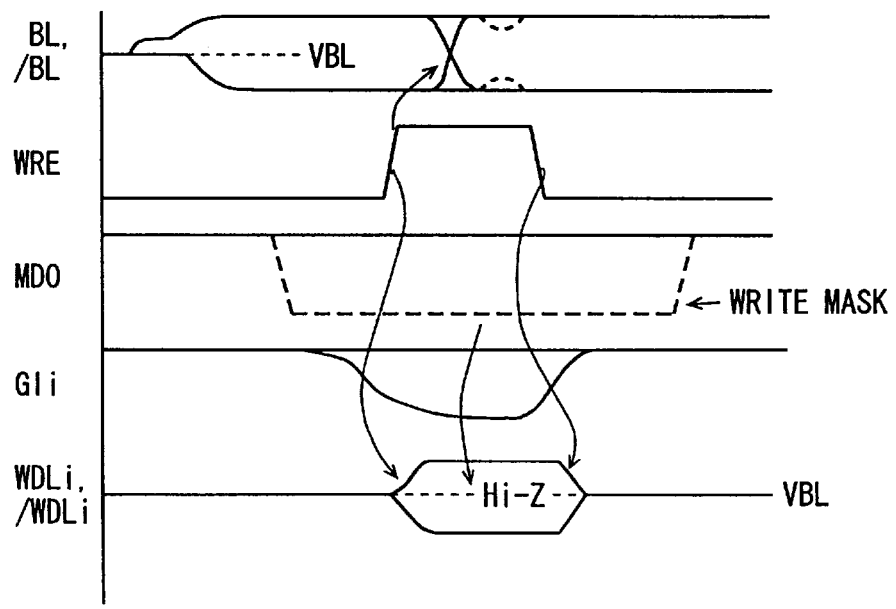
FIG. 34 is a signal waveform diagram representing an operation of the circuitry of FIG. 33.

Precharge/equalize circuit 2030D includes an inverter 2035 receiving write operation activation signal WRE, a CMOS transmission gate 2037 rendered conductive according to write operation activation signal WRE and the output signal of inverter 2035 to short-circuit write local bus lines /WDLi and WDLi, an inverter 2036 receiving the output signal of inverter 2035, and CMOS transmission gates 2038 and 2039 rendered conductive in response to the output signals of inverters 2035 and 2036 to transmit bit line precharge voltage VBL onto write local bus lines /WDLi and WDLi. The operation of write driver 2030 of FIG. 33 will be described with reference to the waveform diagram of FIG. 34.

When data is to be written, bit lines BL and /BL not shown are driven to and maintained at the levels of power supply voltage Vcc and ground voltage Vss according to the memory cell data.

In data writing, write data is transmitted from an input buffer to write global line GIi according to a write operation trigger signal WRITE generated according to a write command. Transmission gate 2024 in retain circuit 2020 is rendered conductive, whereby the write data on write global bus line GIi is latched by latch circuit 2021. When write operation activation signal WRE is at an L level of an inactive state, all of transmission gates 2037–2039 of precharge/equalize circuit 2030D conduct, and write local bus lines WDLi and /WDLi are precharged to the level of bit line precharge voltage VBL.

When write operation activation signal WRE is driven to an active state, precharge/equalize circuit 2030D is rendered inactive, and the precharge/equalize operation of write local bus lines WDLi and /WDLi is completed. When write operation activation signal WRE is at an inactive state of an L level, the output signal of AND circuit 2030C is at an L level, and drive circuits 2030A and 2030B are in an output high impedance state.

When write operation activation signal WRE is driven to an active state of an H level, AND circuit 2030C is enabled. When write data mask designating signal MD0 is at an H level and data writing is instructed, drive circuits 2030A and 2030B are enabled. NAND circuits 2031 and 2032 invert the respective data applied from latch circuits 2021 for output. Accordingly, signal corresponding to the write data latched by latch circuit 2021 are transmitted onto local bus lines WDLi and /WDLi. The write data on write local bus lines WDLi and /WDLi are transmitted to the selected sense amplifier via the write column select gate. Thus, writing is carried out at high speed by adjusting the voltage level of the sense amplifier drive signal.

When write mask designating signal MD0 is set at an L level, AND circuit 2030C provides an output signal of an L level (in general, data mask designation is applied in synchronization with an external clock signal at a timing substantially equal to that of data writing), even when write operation activation signal WRE is driven to an active state. Therefore, precharge/equalize circuit 2030D is at an inactive state. Also, drive circuits 2030A and 2030B are in an output high impedance state. Write local bus lines WDLi and /WDLi attain a floating state at bit line precharge voltage VBL level. Even when a column is selected and the write column select gate is turned on according to activation of write operation activation signal WRE, write local bus lines WDLi and /WDLi are driven to the intermediate voltage level of the data latched by the sense amplifier. Data signal variation, if any, is small even when the data latched by the sense amplifier changes. The sense amplifier retains the latched data properly.

Since, MOS transistors MDP and MDN conduct in response to the mask data signal as shown in FIG. 32, the sense amplifier has its source line impedance set. The latching capability of the sense amplifier is great, so that there is almost no influence of the voltage of the write local bus line on the latched data in the sense amplifier. When one of WDLi and /WDLi is at the level of power supply voltage Vcc or ground voltage Vss and attains a floating state, one of the latched data in the sense amplifier has a great voltage difference to the write local bus line voltage. The latched data of sense amplifier is changed to a great extent because the load of the write data bus line is relatively great. Therefore, the latched data of the sense amplifier may be inverted. However, by the precharge to the level of bit line precharge voltage VBL, the effect of the voltage level of floating write local bus lines WDLi and /WDLi on the latched data of the sense amplifier can be reduced.

Data is written into a selected memory cell (sense amplifier) when mask designating signal MD0 is at an H level. Since the drivability of the sense amplifier is low, the voltage difference between power supply node Vcc and ground node Vss of drive circuits 2030A and 2030B can be reduced to lower the drivability of drive circuits 2030A and 2030B. Since the drivability of the sense amplifier carrying out data writing is low, the data retained in sense amplifier 14SA can be changed sufficiently according to the write data even when the drivability of write drive circuits 2030A and 2030B is lowered. The amplitude of write local bus lines WDLi and /WDLi can be reduced, and current consumption in driving write local bus lines WDLi and /WDLi that have a relatively large load capacitance and arranged extending over a plurality of memory units can be reduced.

[Modification 1]

Figure 35:
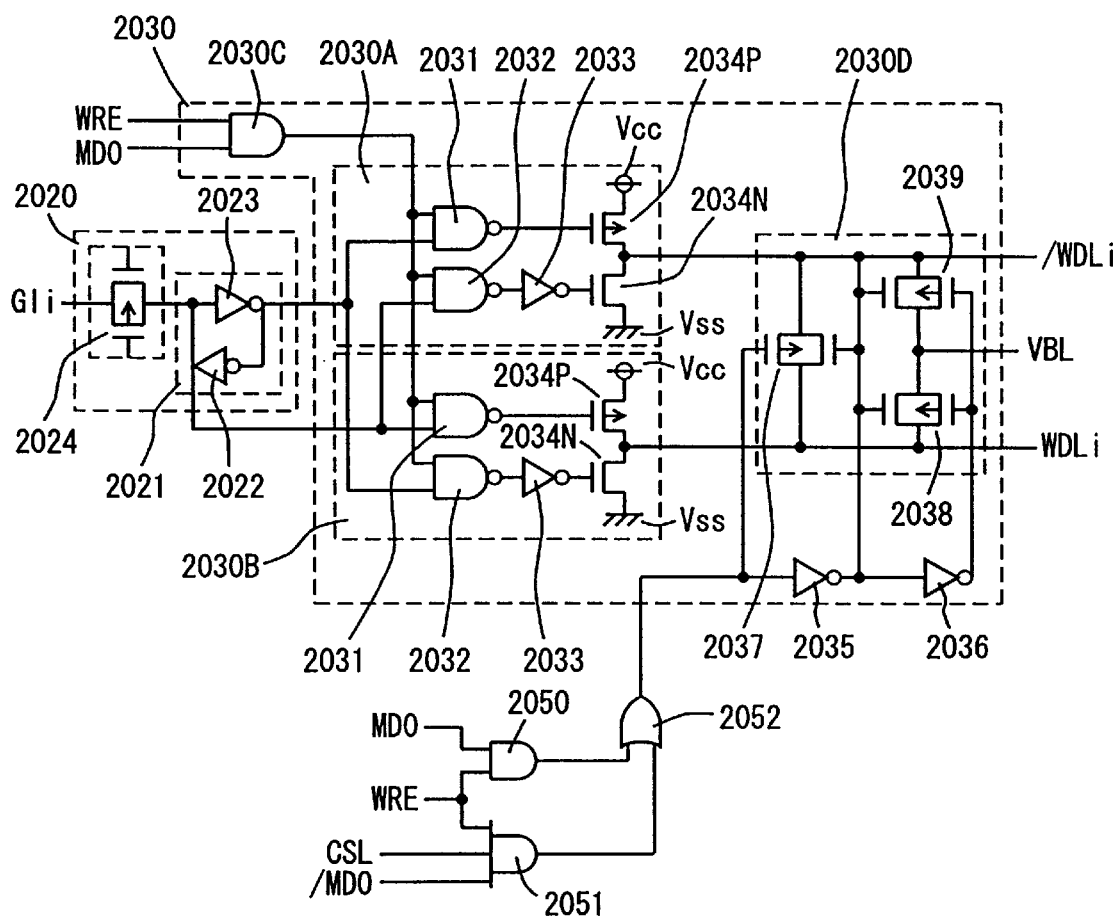
FIG. 35 shows a structure of a first modification of the ninth embodiment.

FIG. 35 shows a structure of a modification 1 according to the ninth embodiment of the present invention. For the purpose of controlling precharge/equalize circuit 2030D, an AND circuit 2050 receiving write mask designating signal MD0 and write operation activation signal WRE, column select signal CSL an AND circuit 2051 receiving write operation activation signal WRE and write data mask designating signal /MD0, and an OR circuit 2052 receiving the output signals of AND circuits 2050 and 2051 are provided. The activation/inactivation of precharge/equalize circuit 2030D is controlled according to the output signal of OR circuit 2052.

When the column decoder is used in common for both the write and read operations, column select signal CSL becomes the master signal for write column select signal WCSL and read column select signal RCSL. Either write column select signal WCSL or read column select signal RCSL is formed from column select signal CSL according to the write operation mode and the read operation mode. Column select signal CSL is a 4-bit signal as shown in FIG. 32. Therefore, a controlling column select signal CSL can be generated by ORing the column select signals of 4 bits.

Figure 36:
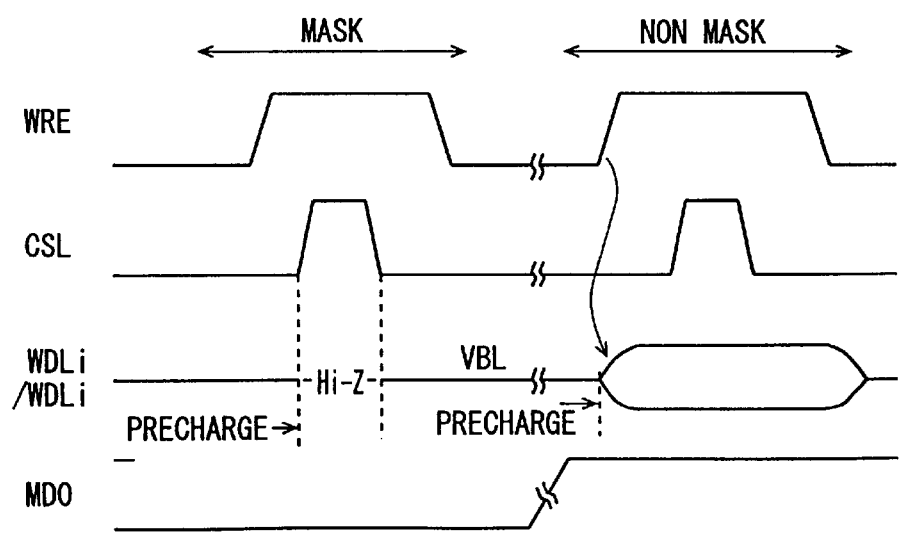
FIG. 36 is a signal waveform diagram representing an operation of the circuitry of FIG. 35.

A column decoder enable signal to activate the column decoder for generating column select signal CSL can be used instead of column select signal CSL. More specifically, a control signal that is active during the period of selection of write column select switch can be used instead of column select signal CSL. The structure of retain circuit 2020 and write driver 2030 is identical to that shown in FIG. 33. The operation of the circuits shown in FIG. 35 will be described here with reference to the signal waveform diagram of FIG. 36.

Consider the case where write data mask designating signal MD0 is at an L level, and mask of write data is designated. The output signal of AND circuit 2050 is at an L level. When write operation activation signal WRE is activated and the write data is applied to global data bus line GIi to be latched in latch circuit 2021, column select signal CSL attains an active state. AND circuit 2051 provides an output signal of an L level until column select signal CSL becomes active. Therefore, OR circuit 2052 provides an output signal of an L level, and precharge/equalize circuit 2030D is kept active to precharge write local bus lines WDLi and /WDLi to the level of bit line precharge voltage VBL.

When column select signal CSL rises to an H level, the output signal of AND circuit 2051 is driven to an H level. In response, the output signal of OR circuit 2052 is pulled down to an L level, to deactivate precharge/equalize circuit 2030D. Upon fall of column select signal CSL to an L level, the output signal of AND circuit 2051 is driven again to an L level, and precharge/equalize circuit. 2030D is rendered active again by OR circuit 2052. Therefore, write local bus lines WDLi and /WDLi attain a high impedance state (HiZ) only during the activation period of column select signal CSL even when drive circuits 2030A and 2030B are at an output high impedance state, and the high impedance state period of the write local bus lines WDLi and /WDLi can be reduced. The selected sense amplifier is connected to write local bus lines WDLi and /WDLi during the period of selection of column select line CSL (write column select signal WCSL). By setting write data bus lines WDLi and /WDLi at a high impedance state only during this column selection period, data writing can be reliably masked. Furthermore, by reducing the high impedance period, an unstable state of the voltage level of write local bus lines WDLi and /WDLi can be shortened in period.

In the nonmask period of data writing, write data mask designating signal MD0 is at an H level, signal /MD0 is at an L level and the output signal of AND circuit 2051 is at an L level. When write operation activation signal WRE attains an H level, the output signal of AND circuit 2050 is driven to an H level. In response, the output signal of OR circuit 2052 is pulled up to an H level, whereby precharge/equalize circuit 2030D is rendered inactive, drive circuits 2030A and 2030B are activated, and write local bus lines WDLi and /WDLi are driven according to the data latched in latch circuit 2021.

[Modification 2]

Figure 37:
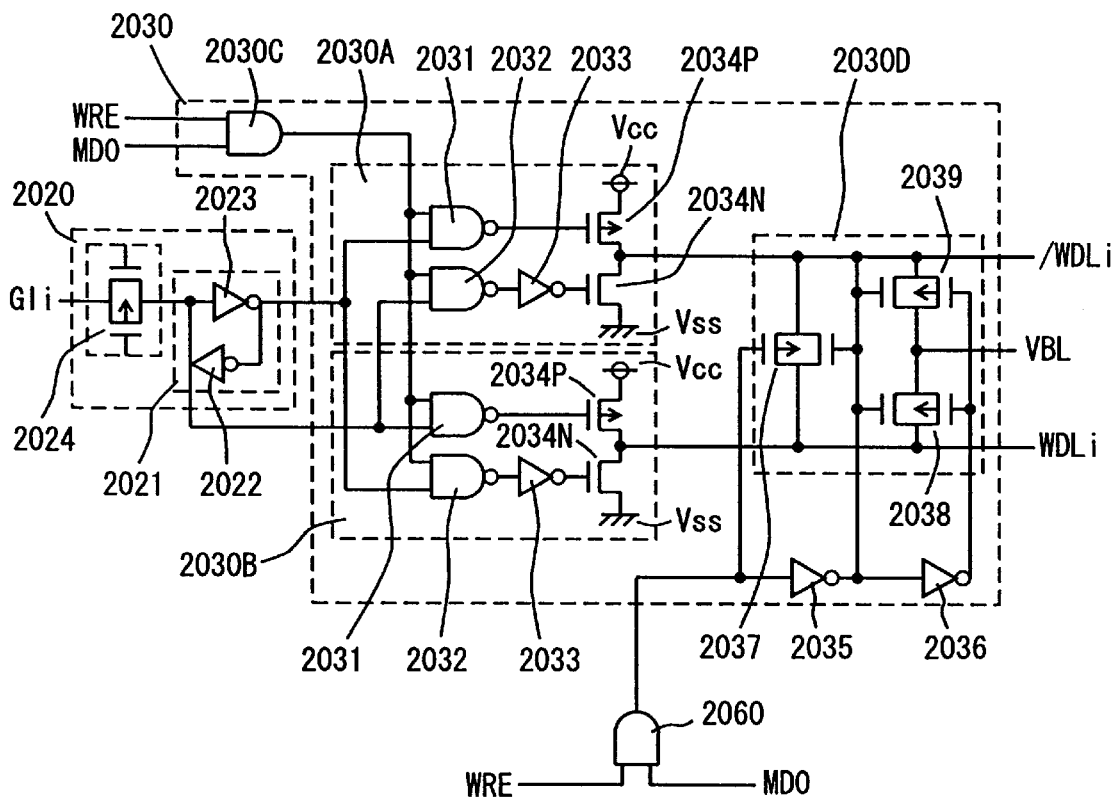
FIG. 37 shows a structure of a second modification of the ninth embodiment.
Figure 38:
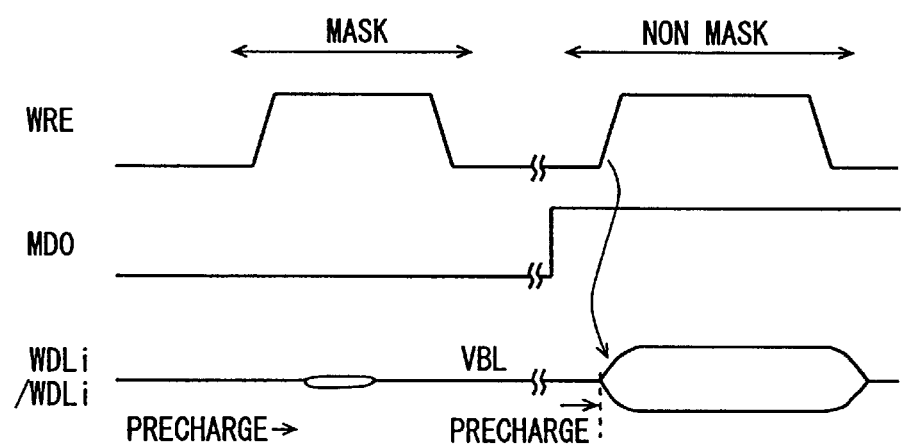
FIG. 38 is a signal waveform diagram representing an operation of the circuitry of FIG. 37.

FIG. 37 shows another modification of the ninth embodiment of the present invention. An AND circuit 2060 is provided receiving write operation activation signal WRE and write data mask designating signal MD0 to control the active/inactive state of precharge/equalize circuit 2030D of write driver 2030. In response to the output signal of AND circuit 2060, precharge/equalize circuit 2030D is rendered active/inactive. The remaining structure is similar to that shown in FIG. 33, and corresponding components have the same reference characters allotted, and detailed description thereof will not be repeated. The operation of write driver 2030 shown in FIG. 37 will be described with reference to FIG. 38.

When write data mask designating signal MD0 is at an L level, AND circuit 2060 provides an output signal of an L level, and drive circuits 2030A and 2030B are at an output high impedance state whereas precharge/equalize circuit 2030D maintains the active state even when write operation activation signal WRE is rendered active. Therefore, write local bus lines WDLi and /WDLi are continuously precharged to the level of bit line precharge voltage VBL. In column selection, a selected sense amplifier is connected to write local bus lines WDLi and /WDLi. However, when data writing is to be masked, the drivability of the sense amplifier is set at a high level (refer to FIG. 32). The latching capability of the sense amplifier is set greater than the drivability of precharge/equalize circuit 2030D. Therefore, no adverse effect is exerted on the latched data of the selected sense amplifier even when write local bus lines WDLi and /WDLi are precharged to bit line precharge voltage VBL.

When write data mask designating signal MD0 is at an H level, the output signal of AND circuit 2060 is pulled up to an H level according to write operation activation signal WRE. As a result, precharge/equalize circuit 2030D is rendered inactive, and drive circuits 2030A and 2030B respectively drive write local bus lines /WDLi and WDLi according to the write data.

Tenth Embodiment

Figure 39:
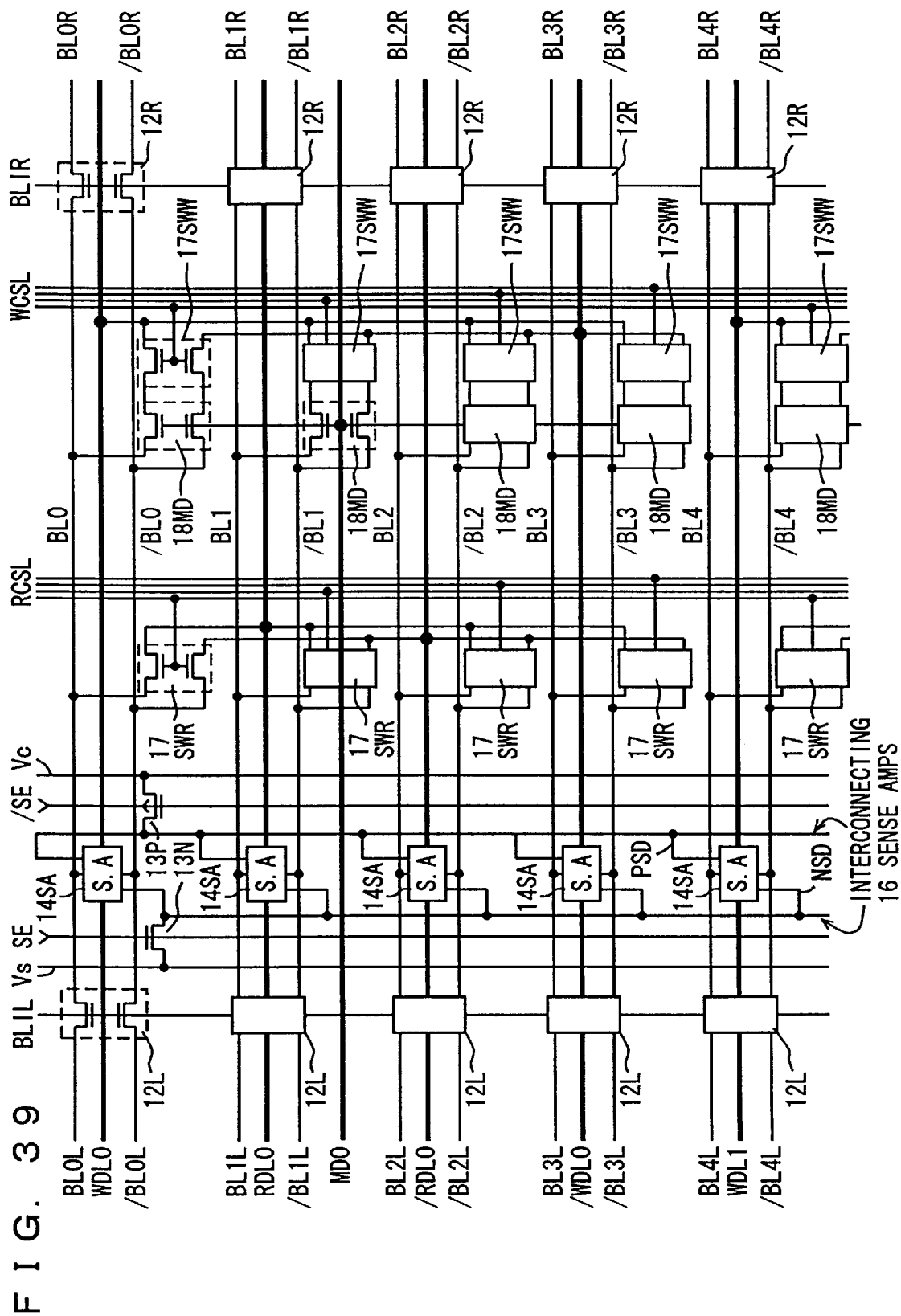
FIG. 39 shows a structure of the sense amplifier peripheral circuitry of a logic merged memory according to a tenth embodiment of the present invention.

FIG. 39 schematically shows a structure of a sense amplifier unit according to a tenth embodiment of the present invention. A mask gate 18MD that is selectively rendered conductive in response to write data mask designating signal MD0 is provided in series with write column select switch 17SWW.

One pair of sense amplifier drive transistors 13P and 13N are arranged in common for a plurality of sense amplifiers 14SA in each memory unit placed under control of write data mask designating signal MD0. As shown in FIG. 28, one write data mask signal corresponds to 4 pairs of write local buses WDL, /WDL (WDL0–3 and /WDL0–3) in one memory unit. Four sense amplifiers 14SA are arranged corresponding to one pair of write local buses WDL and /WDL. Therefore, the writing for 4.4=16 sense amplifiers is controlled by write data mask designating signal MD0. P source nodes PSD and N source nodes NSD of these 16 sense amplifiers are connected in common, respectively. Sense amplifier drive transistors 13P and 13N are provided for commonly-connected source nodes PSD and NSD, respectively.

The arrangement of FIG. 39 shows that write data mask designating signal MD controls four write mask gates 18. Signal lines transmitting write data mask designating signal MD0 are arranged in the memory unit in a distributed manner. The signal line transmitting write data mask designating signal MD0 is arranged every 4 sense amplifiers.

By providing write mask gate 18MD, write local buses WDL0–WDL3 and /WDL0–/WDL3 can be reliably isolated from sense amplifier 14SA when data writing is to be masked. Therefore, the adverse effect on the latched data at sense amplifier 14SA can be eliminated.

By providing one pair of sense amplifier drive transistors 13P and 13N for a set of 16 sense amplifiers, the number of sense amplifier drive transistors can be reduced to reduce the layout area in the proximity of the sense amplifier band. Also, the layout of the sense amplifier drive transistor is facilitated.

In the arrangement shown in FIG. 39, one pair of sense amplifier drive transistors 13P and 13N can be provided for 4 sense amplifiers.

Other Applications

An SDRAM and a logic merged memory are presented as examples of a semiconductor memory device. It is to be noted that the memory array structure and the data line structure of the SDRAM can be applied to the DRAM section of the logic merged memory. Conversely, the memory array structure and the data line structure of the DRAM section of the logic merged memory can be applied to the SDRAM.

The semiconductor memory device is not limited to the SDRAM and the logic merged memory. For example, the present invention is applicable to other memories such as a CDRAM (Cache DRAM). Furthermore, the present invention is applicable even when the memory cell structure is the NAND type memory cell structure shown in FIG. 1.

The structure of the sixth to tenth embodiments can be applied to the gate voltage control of the sense amplifier drive transistors of the second to fifth embodiments.

According to the present invention, the drivability of the sense amplifier is reduced when data write operation is active. Therefore, the latched data in the sense amplifier can be easily inverted according to the write data, and the time required for a write operation, i.e., for data inversion of a bit line pair connected to the selected sense amplifier can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged alignedly in at least one column;
   a bit line pair arranged corresponding to the memory cells arranged in said at least one column, and having said plurality of memory cells connected thereto;
   a sense amplifier coupled to said bit line pair for sensing, amplifying and latching a voltage difference of said bit line pair; and sense amplifier activation control circuitry coupled to said sense amplifier for activating said sense amplifier according to a sense amplifier activation signal, said sense amplifier activation control circuitry being responsive to a write operation activation signal designating data writing of external data to a selected memory cell for reducing current drivability of said sense amplifier in an active state, wherein said sense amplifier activation control circuitry comprises:
- a power supply line for supplying a power supply voltage driving said sense amplifier,
- a sense amplifier drive transistor connected between said sense amplifier and said power supply line, for coupling said power supply line and said sense amplifier to drive said sense amplifier when conductive, and
- a sense amplifier drive signal generation circuit responsive to said sense amplifier activation signal for applying a sense amplifier drive signal to said sense amplifier drive transistor to render said sense amplifier drive transistor conductive, and responsive to said write operation activation signal for changing a voltage level of said sense amplifier drive signal to reduce an on-resistance of said sense amplifier drive transistor.

2. The semiconductor memory device according to claim 1, wherein said sense amplifier drive signal generation circuit comprises
- a drive circuit responsive to said sense amplifier activation signal for driving said sense amplifier drive signal to an active state,
- a latch circuit coupled to an output of said drive circuit, for latching said sense amplifier drive signal, and
- a power supply switch for supplying a first power supply voltage to a power supply node of said latch circuit when said write operation activation signal is inactive, and supplying an intermediate voltage between said first power supply voltage and a second power supply voltage to the power supply node of said latch circuit when said write operation activation signal is active,
- said sense amplifier activation signal being at an inactive state when said write operation activation signal is active to set said drive circuit at an output high impedance state.

3. The semiconductor memory device according to claim 1, wherein said sense amplifier activation control circuitry comprises
- a sense power supply line supplying a power supply voltage to said sense amplifier,
- an n channel insulated gate field effect transistor connected between a source node of said sense amplifier and said sense power supply line to connect the source node of said sense amplifier with said sense power supply line when conductive,
- a comparator circuit for comparing a voltage of the source node of said sense amplifier with an intermediate voltage to apply a sense amplifier drive signal to a gate of said n channel insulated gate field effect transistor according to a result of comparison, and
- a power supply voltage switch circuit for applying a boosted voltage higher than the voltage on said sense power supply line to a power supply node of said comparator circuit when said write operation activation signal is inactive, and applying a voltage lower than the boosted voltage to the power supply node of said comparator circuit when said write operation activation signal is active.

4. The semiconductor memory device according to claim 3, wherein said sense amplifier activation control circuitry further comprises
- a second sense power supply line for transmitting a second power supply voltage, and
- a second n channel insulated-gate field effect transistor connected between said second sense power supply line and a second source node of said sense amplifier, rendered conductive in response to a second sense amplifier drive signal that is activated in response to activation of said sense amplifier activation signal to connect said second sense power supply line with the second source node of said sense amplifier,
- said power supply voltage switch circuit being activated in response to activation of said second sense amplifier drive signal, and set to an output high impedance state when both said second sense amplifier drive signal and said write operation activation signal are inactive.

5. The semiconductor memory device according to claim 1, wherein said at least one column includes a plurality of columns, and said sense amplifier drive transistor is provided one for a predetermined number of sense amplifiers among a plurality of sense amplifiers provided corresponding to said plurality of columns.

6. The semiconductor memory device according to claim 1, wherein said at least one column includes a plurality of columns, said bit line pair and said sense amplifier being arranged corresponding to each column,
- wherein said sense amplifier activation control circuitry comprises sense amplifier drive transistors provided one for a predetermined number of sense amplifiers in a plurality of sense amplifiers, the sense amplifier drive transistor transmitting an operating power supply voltage to corresponding sense amplifiers of the predetermined number when conductive, and
- wherein said sense amplifier activation control circuit further comprises a circuit responsive to said write operation activation signal for increasing on-resistance of said sense amplifier drive transistors.

7. The semiconductor memory device according to claim 6, further comprising:
- a write data transmission line provided per said predetermined number of sense amplifiers; and
- a write column select gate responsive to a write column select signal for selecting a sense amplifier from each set of said predetermined number of sense amplifiers to couple selected sense amplifiers to corresponding write data transmission lines.

8. The semiconductor memory device according to claim 1, further comprising:
- a read out data transmission line for transmitting data read out from a selected memory cell of said plurality of memory cells;
- a write data provided separate from said read out data line, for transmitting write data to said select memory cell; and
- a write driver for transmitting a write data signal corresponding to externally applied write data to said write data line according to write data when activated,
- said write driver including a precharge circuit for precharging said write data line to a voltage level identical to a precharge voltage of each bit line of said bit line pair when said write operation activation signal is inactive.

9. The semiconductor memory device according to claim 8, wherein said write driver includes a drive circuit entering an output high impedance state when a write data mask designating signal instructing inhibition of data writing into said selected memory cell is active and transmitting said write data signal to said write data line according to said write data when said write operation activation signal is active and said write data mask designating signal is inactive.

10. A semiconductor memory device comprising:
 a plurality of memory cells arranged alignedly in at least one column;
 a bit line pair arranged corresponding to the memory cells arranged in said at least one column, and having said plurality of memory cells connected thereto;
 a sense amplifier coupled to said bit line pair for sensing, amplifying and latching a voltage difference of said bit line pair; and
 sense amplifier activation control circuitry coupled to said sense amplifier for activating said sense amplifier according to a sense amplifier activation signal, said sense amplifier activation control circuitry being responsive to a write operation activation signal designating data writing of external data to a selected memory cell for reducing current drivability of said sense amplifier in an active state,
 wherein said sense amplifier activation control circuitry comprises:
  a first sense power supply line for transmitting a first sense power supply voltage,
  a second sense power supply line for transmitting a second sense power supply voltage,
  a first sense driver transistor connected between said first sense power supply line and a first source node of said sense amplifier, and having a gate coupled to a first sense drive line transmitting a first sense amplifier drive signal,
  a second sense drive transistor connected between said second sense power supply line and a second source node of said sense amplifier, and having a gate coupled to a second sense drive line transmitting a second sense amplifier drive signal, and
  a switch circuit responsive to activation of said write operation activation signal for short-circuiting the first and second sense amplifier drive lines.

11. The semiconductor memory device according to claim 10, wherein said sense amplifier activation control circuitry further comprises
 a control circuit responsive to said sense amplifier activation signal for outputting a main sense amplifier drive signal to activate said sense amplifier,
 a pulse generation circuit responsive to activation of said main sense amplifier drive signal for generating a one shot pulse signal having a predetermined time width, and
 a tristate buffer circuit responsive to the pulse signal from said pulse generation circuit to enter an output high impedance state, and responsive to said main sense amplifier drive signal for outputting the first and second sense amplifier drive signals.

12. The semiconductor memory device according to claim 11, wherein said sense amplifier activation control circuitry further comprises a gate for rendering said switch circuit conductive for short-circuit in response to said one shot pulse signal.

13. A semiconductor memory device comprising:
 a plurality of memory cells arranged alignedly in at least one column;
 a bit line pair arranged corresponding to the memory cells arranged in said at least one column, and having said plurality of memory cells connected thereto;
 a sense amplifier coupled to said bit line pair for sensing, amplifying and latching a voltage difference of said bit line pair; and
 sense amplifier activation control circuitry coupled to said sense amplifier for activating said sense amplifier according to a sense amplifier activation signal, said sense amplifier activation control circuitry being responsive to a write operation activation signal designating data writing of external data to a selected memory cell for reducing current drivability of said sense amplifier in an active state,
 wherein said bit line pair comprises
  a first bit line pair to which a plurality of memory cells are connected,
  a second bit line pair to which a plurality of memory cells are connected, and
  a common bit line pair to which said sense amplifier is connected, wherein
  said semiconductor memory device further comprises:
   a first bit line isolation control gate connected between said first bit line pair and said common bit line pair for connecting said first bit line pair with said common bit line pair according to a first bit line isolation control signal, and
   a second bit line isolation control gate connected between said second bit line pair and said common bit line pair for connecting said second bit line pair with said common bit line pair according to a second bit line isolation control signal,
 wherein said sense amplifier activation control circuitry comprises
  a first sense power supply line for transmitting a first sense power supply voltage to said sense amplifier,
  a second sense power supply line for transmitting a second sense power supply voltage to said sense amplifier,
  a first sense amplifier drive transistor connected between said sense power supply line and a first source node of said sense amplifier, rendered to connect said first sense power supply line with the first source node of said sense amplifier,
  a second sense amplifier drive transistor connected between said second sense power supply line and a second source node of said sense amplifier, rendered conductive, in response to activation of a second sense amplifier drive signal, to connect said second sense power supply line with the second source node of said sense amplifier,
  a control circuit responsive to activation of said sense amplifier activation signal for activating a main sense amplifier drive signal,
  a first tristate buffer circuit responsive to a first block specify signal for generating said second bit line isolation control signal,
  a second tristate buffer circuit responsive to a second block specify signal for generating said first bit line isolation control signal,
  a third buffer circuit responsive to said main sense amplifier drive signal for generating the first and second sense amplifier drive signals, a pulse generation circuit generating a pulse signal entering an active state for a predetermined time in response to activation of said main sense amplifier drive signal for setting the first to third buffer circuits at an output high impedance state when the pulse signal is active, a first switch circuit responsive to activation of the pulse signal from said pulse generation circuit for equalizing the first and second sense amplifier drive signals, a second switch circuit for equalizing said first bit line isolation control signal and said first sense amplifier drive signal according to said first block specify signal and said pulse signal, and a third switch circuit for equalizing said second sense amplifier drive signal and said second bit line isolation control signal according to activation of said pulse signal and said second bit line isolation control signal, and wherein said second bit line isolation control signal enters an inactive state and said first bit line isolation control gate is rendered nonconductive when said first block specify signal is active, and said first bit line isolation control signal enters an inactive state and said first bit line isolation control gate is rendered nonconductive when said second block specify signal is active.

14. The semiconductor memory device according to claim 13, wherein the first and second sense amplifier drive transistors comprise insulated gate field effect transistors of a same conductivity type.

15. The semiconductor memory device according to claim 13, wherein the first and second sense amplifier drive transistors are insulated gate field effect transistors of different conductivity types.

16. A semiconductor memory device comprising:

a plurality of memory cells arranged alignedly in at least one column;

a bit line pair arranged corresponding to the memory cells arranged in said at least one column, and having said plurality of memory cells connected thereto;

a sense amplifier coupled to said bit line pair for sensing, amplifying and latching a voltage difference of said bit line pair;

sense amplifier activation control circuitry coupled to said sense amplifier for activating said sense amplifier according to a sense amplifier activation signal, said sense amplifier activation control circuitry being responsive to a write operation activation signal designating data writing of external data to a selected memory cell for reducing current drivability of said sense amplifier in an active state; and a cancel circuit for canceling reduction in drivability of the sense amplifier by said sense amplifier activation control circuitry when a write data mask designating signal that inhibits data writing to a selected memory cell of said plurality of memory cells is active.

17. The semiconductor memory device according to claim 16, wherein said sense amplifier activation control circuitry comprises a sense power supply line for transmitting a power supply voltage to said sense amplifier, a sense amplifier drive transistor connected between said sense power supply line and a source node of said sense amplifier, for electrically connecting said sense power supply line with a source node of said sense amplifier when conductive, and a sense amplifier drive signal generation circuit responsive to activation of a sense amplifier activation signal for applying a sense amplifier drive signal activating said sense drive transistor, said sense amplifier drive signal generation circuit including a circuit for changing a voltage level of said sense amplifier drive signal such that an on-resistance of said sense amplifier drive transistor is increased when said write operation activation signal is active, said cancel circuit including a mask control gate coupled to first and second mask designating signal transmission lines for transmitting complementary mask designating signals instructing said write masking and to the source node of said sense amplifier, and rendered conductive, when the signal on said first mask designating signal transmission line is active to instruct that masking of data writing, to connect the source node of said sense amplifier with said second mask designating signal transmission line, a power supply voltage on said sense power supply line and a voltage on said second mask designating signal transmission line being substantially at a same voltage level when said mask designating signal is active.

18. A semiconductor memory device comprising:

a plurality of memory cells arranged alignedly in at least one column;

a bit line pair arranged corresponding to the memory cells arranged in said at least one column, and having said plurality of memory cells connected thereto;

a sense amplifier coupled to said bit line pair for sensing, amplifying and latching a voltage difference of said bit line pair;

sense amplifier activation control circuitry coupled to said sense amplifier for activating said sense amplifier according to a sense amplifier activation signal, said sense amplifier activation control circuitry being responsive to a write operation activation signal designating data writing of external data to a selected memory cell for reducing current drivability of said sense amplifier in an active state;

a read out data transmission line for transmitting data read out from a selected memory cell of said plurality of memory cells;

a write data line provided separate from said read out data line, for transmitting write data to said selected memory cell; and a write driver for transmitting a write data signal corresponding to externally applied write data to said write data line according to write data when activated, said write driver including a precharge circuit for precharging said write data line to a voltage level identical to a precharge voltage of each bit line of said bit line pair when said write operation activation signal is inactivated, wherein said at least one column includes a plurality of columns, and wherein said write driver further comprises a drive circuit transmitting said write data signal according to the write data when active, said drive circuit rendered active in response to activation of said write operation activation signal and inactivation of a mask designating signal masking the write data, and entering an output high impedance state when inactive, and said precharge circuit rendered inactive upon activation of a column select signal driving a write column select gate for connecting a selected column to said write data line when said mask designating signal is inactive.

19. A semiconductor memory device comprising:

a plurality of memory cells arranged alignedly in at least one column;

a bit line pair arranged corresponding to the memory cells arranged in said at least one column, and having said plurality of memory cells connected thereto;

a sense amplifier coupled to said bit line pair for sensing, amplifying and latching a voltage difference of said bit line pair;

sense amplifier activation control circuitry coupled to said sense amplifier for activating said sense amplifier according to a sense amplifier activation signal, said sense amplifier activation control circuitry being responsive to a write operation activation signal designating data writing of external data to a selected memory cell for reducing current drivability of said sense amplifier in an active state;

a read out data transmission line for transmitting data read out from a selected memory cell of said plurality of memory cells;

a write data line provided separate from said read out data line, for transmitting write data to said select memory cell; and a write driver for transmitting a write data signal corresponding to externally applied write data to said write data line according to write data when activated, said write driver including a precharge circuit for precharging said write data line to a voltage level identical to a precharge voltage of each bit line of said bit line pair when said write operation activations signal is inactive, wherein said precharge circuit also precharges said write data line to the precharge voltage of the bit lines when said mask designating signal is active to inhibit data writing into said selected memory cell.

* * * * *